United States Patent
Cha

(10) Patent No.: US 12,095,018 B2
(45) Date of Patent: Sep. 17, 2024

(54) DISPLAY DEVICE

(71) Applicant: Samsung Display Co., Ltd., Yongin-si (KR)

(72) Inventor: Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 17/448,760

(22) Filed: Sep. 24, 2021

(65) Prior Publication Data

US 2022/0158054 A1    May 19, 2022

(30) Foreign Application Priority Data

Nov. 17, 2020   (KR) .......................... 10-2020-0154020

(51) Int. Cl.
*H01L 33/62*    (2010.01)
*H01L 27/15*    (2006.01)
*H01L 33/38*    (2010.01)

(52) U.S. Cl.
CPC ............ *H01L 33/62* (2013.01); *H01L 27/156* (2013.01); *H01L 33/38* (2013.01)

(58) Field of Classification Search
CPC ........ H01L 33/62; H01L 27/156; H01L 33/38
See application file for complete search history.

(56) References Cited

U.S. PATENT DOCUMENTS

| | | | |
|---|---|---|---|
| 4,746,180 A | 5/1988 | Deisler et al. | |
| 4,783,583 A | 11/1988 | Obara et al. | |
| 4,802,580 A | 2/1989 | Andersen | |
| 4,829,723 A | 5/1989 | Bull et al. | |
| 4,854,316 A | 8/1989 | Davis | |
| 4,905,421 A | 3/1990 | Maier et al. | |
| 4,964,688 A | 10/1990 | Caldwell et al. | |
| 5,002,592 A | 3/1991 | Stroby et al. | |
| 5,014,255 A | 5/1991 | Wanger et al. | |
| 5,016,397 A | 5/1991 | Higginbotham | |
| 5,017,079 A | 5/1991 | Reynolds | |
| 5,024,420 A | 6/1991 | Downing | |
| 5,025,587 A | 6/1991 | Creed | |
| 5,033,707 A | 7/1991 | Strater et al. | |

(Continued)

FOREIGN PATENT DOCUMENTS

| | | | |
|---|---|---|---|
| CN | 101523005 B | 8/2012 | |
| CN | 104463929 B | 7/2017 | |

(Continued)

*Primary Examiner* — Eugene Lee
(74) *Attorney, Agent, or Firm* — Lewis Roca Rothgerber Christie LLP

(57) ABSTRACT

A display device may include a substrate including a display region and a non-display region, the non-display region including a fan-out region and a pad region, a plurality of pixels in the display region, a pad portion located in the pad region, a line portion located in the fan-out region, a power pad portion located in one region of the non-display region, a first power line located in the display region and connected to the plurality of pixels, a second power line located in the display region, spaced from the first power line, and connected to the plurality of pixels, a first bus line located in the non-display region and connected to the first power line, and a second bus line located in the non-display region and connected to the second power line.

20 Claims, 27 Drawing Sheets

(56) References Cited

U.S. PATENT DOCUMENTS

| | | | |
|---|---|---|---|
| 5,101,806 A | 4/1992 | Hunt et al. | |
| 5,133,399 A | 7/1992 | Hiller et al. | |
| 5,158,445 A | 10/1992 | Khinkis | |
| 5,172,800 A | 12/1992 | Brown et al. | |
| 5,187,334 A | 2/1993 | Abbott et al. | |
| 5,240,418 A | 8/1993 | Silverman et al. | |
| 5,242,181 A | 9/1993 | Fales et al. | |
| 5,287,966 A | 2/1994 | Stahl | |
| 5,299,111 A | 3/1994 | Parduhn et al. | |
| 5,319,217 A | 6/1994 | Arsenault et al. | |
| 5,325,559 A | 7/1994 | Belanger et al. | |
| 5,631,653 A | 5/1997 | Reedy | |
| 6,594,617 B2 | 7/2003 | Scherzinger | |
| 7,091,715 B2 | 8/2006 | Nemirovsky et al. | |
| 7,581,423 B2 | 9/2009 | Brojanac et al. | |
| 8,242,698 B2 * | 8/2012 | Tokuda | H05B 33/04 315/169.3 |
| 8,836,675 B2 * | 9/2014 | Takenaka | G02F 1/13452 349/149 |
| 9,064,833 B2 | 6/2015 | Park et al. | |
| 9,514,673 B2 | 12/2016 | Kwon et al. | |
| 9,588,223 B2 | 3/2017 | Wilby et al. | |
| 9,625,717 B2 | 4/2017 | Sunnari et al. | |
| 10,159,145 B2 * | 12/2018 | Nakaminami | G09F 9/30 |
| 10,209,520 B2 | 2/2019 | Bell | |
| 10,310,273 B2 | 6/2019 | Calm | |
| 10,330,931 B2 | 6/2019 | Ambrus et al. | |
| 10,379,358 B2 | 8/2019 | Olkkonen et al. | |
| 10,395,601 B2 * | 8/2019 | Kwon | G09G 3/3291 |
| 10,425,636 B2 | 9/2019 | Bohn | |
| 10,564,431 B1 | 2/2020 | Chao et al. | |
| 10,606,086 B2 | 3/2020 | Calm | |
| 10,644,091 B2 * | 5/2020 | Liu | H10K 71/00 |
| 11,706,958 B2 * | 7/2023 | Qing | G02F 1/13452 345/204 |
| 2006/0022969 A1 * | 2/2006 | Lee | G02F 1/136286 345/211 |
| 2014/0139413 A1 * | 5/2014 | Kwon | H10K 59/88 345/82 |
| 2014/0175977 A1 * | 6/2014 | Yoon | H10K 59/131 315/51 |
| 2019/0043938 A1 * | 2/2019 | Lee | H10K 59/123 |
| 2020/0005703 A1 | 1/2020 | Kim et al. | |
| 2020/0243021 A1 * | 7/2020 | Li | G09G 3/3266 |
| 2022/0199677 A1 * | 6/2022 | Park | H01L 33/24 |
| 2022/0254816 A1 * | 8/2022 | Park | H01L 25/0753 |

FOREIGN PATENT DOCUMENTS

| | | |
|---|---|---|
| CN | 105393284 B | 7/2018 |
| CN | 104956148 B | 12/2018 |
| EP | 0 746 961 B1 | 10/1999 |
| EP | 0 940 653 B1 | 3/2004 |
| EP | 1 563 475 B1 | 9/2006 |
| EP | 3 014 581 B1 | 8/2018 |
| EP | 3 191 867 B1 | 7/2019 |
| EP | 2 898 262 B1 | 11/2019 |
| KR | 10-1398448 B1 | 5/2014 |
| KR | 10-1978936 B1 | 5/2019 |
| KR | 10-2020-0001657 A | 1/2020 |
| KR | 10-2020-0088951 A | 7/2020 |

* cited by examiner

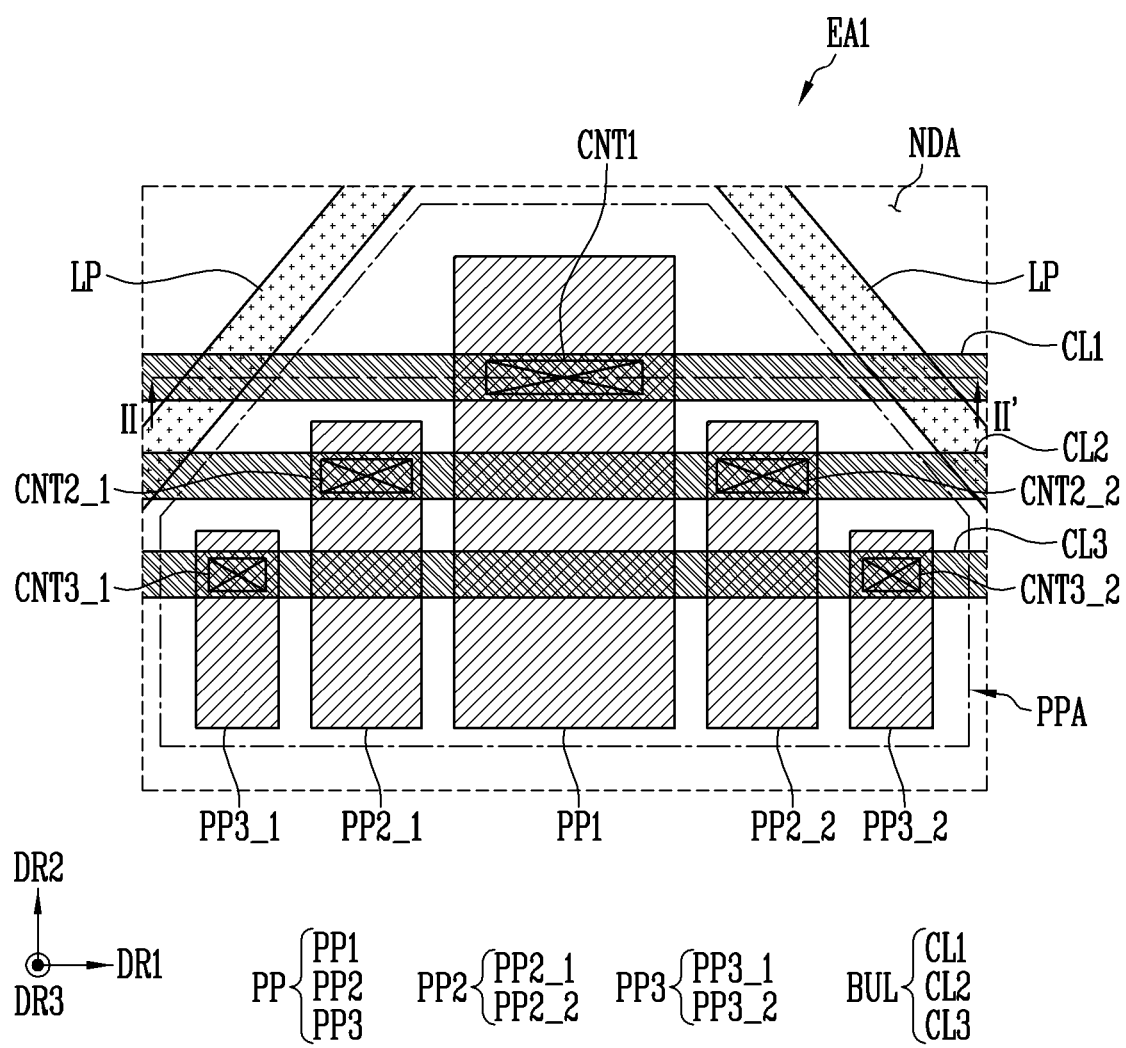

DISPLAY DEVICE

CROSS-REFERENCE TO RELATED APPLICATION

This application claims priority to and the benefit of Korean Patent Application No. 10-2020-0154020 filed in the Korean Intellectual Property Office on Nov. 17, 2020, the entire content of which is incorporated herein by reference.

BACKGROUND

1. Field

The present disclosure relates to a display device.

2. Description of the Related Art

With an increasing interest in information display and an increasing demand for use of portable information media, there are increasing demand and commercialization for display devices.

SUMMARY

The present disclosure provides a display device capable of increasing reliability.

An embodiment of the present disclosure may provide a display device including a substrate including a display region and a non-display region, the non-display region including a fan-out region and a pad region that are sequentially arranged; a plurality of pixels in the display region; a pad portion located in the pad region; a line portion located in the fan-out region and electrically connecting the pad portion to the pixels; a power pad portion located in one region of the non-display region; a first power line located in the display region and connected to the plurality of pixels; a second power line located in the display region, spaced from the first power line, and connected to the plurality of pixels; a first bus line located in the non-display region and connected to the first power line; and a second bus line located in the non-display region and connected to the second power line.

In the embodiment, the power pad portion may include a first power pad electrically connected to the first bus line and a second power pad electrically connected to the second bus line, and the first power pad may receive a first power supply voltage and the second power pad may receive a second power supply voltage.

In the embodiment, the power pad portion may not overlap the line portion.

In the embodiment, the pad portion may include a first pad portion located in the pad region and including a plurality of first pads, and a second pad portion located in the pad region and including a plurality of second pads. Here, the power pad portion may be located between the first pad portion and the second pad portion in the non-display region.

In the embodiment, the first power supply voltage may be a drive power supply voltage of a high potential, and the second power supply voltage may be a drive power supply voltage of a low potential.

In the embodiment, each of the plurality of pixels may include a first electrode, a second electrode, a third electrode, and a fourth electrode that are spaced from each other, and a plurality of light emitting elements arranged between two adjacent electrodes from among the first to fourth electrodes.

In the embodiment, the first and fourth electrodes may include protrusion patterns, each of the protrusion patterns protruding in a direction different from an extension direction of a corresponding one of the first and fourth electrodes. Here, the protrusion pattern of the first electrode may be spaced from the protrusion pattern of the fourth electrode of a pixel from among the plurality of pixels adjacent to the first electrode, and the protrusion pattern of the fourth electrode may be spaced from the protrusion pattern of the first electrode of a pixel from among the plurality of pixels adjacent to the fourth electrode.

In the embodiment, the display device may further include a third bus line in the non-display region and separated from the plurality of pixels, the first bus line, and the second bus line. Here the power pad portion may further include a third power pad electrically connected to the third bus line.

In the embodiment, at least one of the first power pad, the second power pad, and the third power pad may have a different size from other ones of the power pads.

In the embodiment, the second power pad may include a $2\text{-}1^{th}$ power pad and a $2\text{-}2^{th}$ power pad, the first power pad being interposed therebetween. Here, the third power pad may include a $3\text{-}1^{th}$ power pad between the $2\text{-}1^{th}$ power pad and the first pad portion, and a $3\text{-}2^{th}$ power pad between the $2\text{-}2^{th}$ power pad and the second pad portion.

In the embodiment, the third power pad may receive the second power supply voltage or is floated.

In the embodiment, the display device may further include a first connection line having one end connected to the first bus line, extending toward the first electrode, and electrically disconnected from the first electrode; a second connection line having one end connected to the second bus line, extending toward the second electrode, and electrically disconnected from the second electrode; a third connection line having one end connected to the second bus line, extending toward the third electrode, and electrically disconnected from the third electrode; and a fourth connection line having one end connected to the third bus line, extending toward the fourth electrode, and electrically disconnected from the fourth electrode. Here, the first to fourth connection lines may be provided in the non-display region.

Another embodiment of the present disclosure may provide a display device including a substrate including a display region and a non-display region; a plurality of pixels in the display region; a first pad portion located in the non-display region and including a plurality of first pads; a second pad portion located in the non-display region and including a plurality of second pads; a third pad portion located in the non-display region and including a plurality of third pads; power pad portions located respectively between the first pad portion and the second pad portion and between the second pad portion and the third pad portion; a plurality of first power lines located in the display region and connected to the plurality of pixels; a plurality of second power lines located in the display region, spaced from the plurality of first power lines, and connected to the plurality of pixels; a first bus line located in the non-display region and connected to the plurality of first power lines; and a second bus line located in the non-display region and connected to the plurality of second power lines, In the embodiment, the power pad portions may include a first power pad connected to the first bus line to receive a first power supply voltage, and a second power pad connected to the second bus line to receive a second power supply voltage. Here, the first bus line and the first power pad may be integrally provided, and the second bus line and the second power pad may be integrally provided.

According to a display device of an embodiment of the present disclosure, a power pad receiving a drive power supply voltage is arranged between adjacent pad portions so that a line portion connected to the pad portions does not overlap the power pad, thereby reducing or minimizing components under the power pad, and thus, it is possible to prevent failure due to the components.

In addition, according to a display device of another embodiment of the present disclosure, a display region is partitioned into a plurality of regions according to the number of drive circuits, a bus line and a power pad are separated in units of the partitioned regions, and at this time the bus line and a power line are integrally formed to reduce the number of connection members for connecting a power line in the display region to a power pad in a non-display region, and thus, it is possible to prevent contact failure between the power line and the power pad.

Aspects of embodiments according to the present disclosure are not limited to the content described above, and more various aspects of embodiments are included in the present disclosure.

BRIEF DESCRIPTION OF THE DRAWINGS

The above and other aspects and features of some embodiments of the present disclosure will be more apparent from the following description taken in conjunction with the accompanying drawings, in which:

FIGS. 7A and 7B are schematic enlarged views of EA1 of FIG. 3.

DETAILED DESCRIPTION

Figure 1:
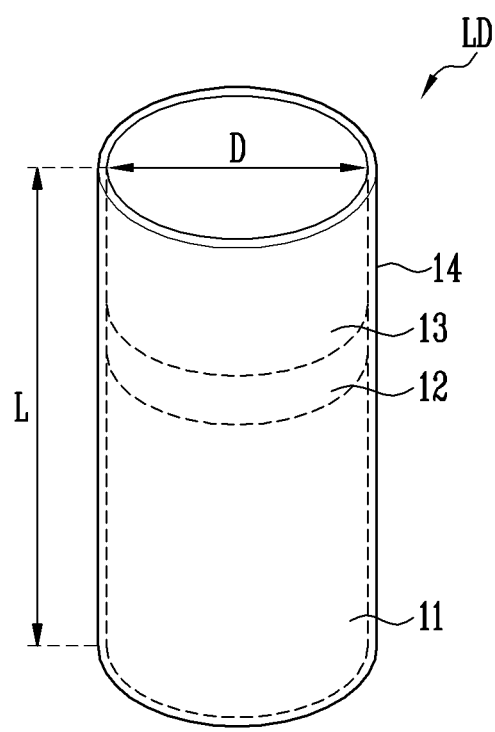
FIG. 1 is a perspective view schematically illustrating a light emitting element according to an embodiment of the present disclosure.

Because the present disclosure may be variously modified and may have various forms, specific embodiments will be illustrated in the drawings and described in detail in the present disclosure. However, this is not intended to limit the present disclosure to a specific disclosure form and should be understood to include all changes, equivalents, and substitutes included in the idea and scope of the present disclosure.

In describing the respective drawings, similar reference numerals are given to similar configuration elements. In the drawings, dimensions of structures are enlarged more than actual structures for the sake of clear illustration of the present disclosure. Terms, "first" and "second", may be used to describe various configuration elements, and the configuration elements are not limited thereto. The terms are used only for the purpose of distinguishing one configuration element from another configuration element. For example, a first configuration element may be referred to as a second element, and similarly, a second element may be referred to as a first element, without departing from the scope of the present disclosure. A singular expression includes a plural expression unless the context clearly indicates otherwise.

In the present disclosure, terms, "comprise" and "have" are intended to designate presence of characteristics, numbers, steps, actions, configuration elements, components, or combinations thereof described in the present disclosure, and it should be understood that possibility of presence or addition of one or more other characteristics, numbers, steps, actions, configuration elements, components, or combinations thereof are not excluded. In addition, when a portion such as layer, film, region, or plate is described as being placed "on" another portion, this includes not only a case in which the portion is "directly on" another portion but also a case in which another portion is therebetween. In addition, in the present disclosure, when a portion such as layer, film, region, or plate is formed on another portion, the formed direction is not limited only to an upper direction and includes a lateral direction or a lower direction. In contrast to this, when a portion such as layer, film, region, or plate is described as being placed "below" another portion, this includes not only a case in which the portion is "directly below" another portion but also a case in which another portion is therebetween.

In the present disclosure, when it is described that a certain configuration element (for example, a "first configuration element") is "connected (operatively or communicatively)" or "coupled" to another configuration element (for example, a "second configuration element"), it should be understood that the certain configuration element may be directly connected to another configuration element or may be connected through another configuration element (for example, a "third configuration element"). In contrast to this, when it is described that a certain configuration element (for example, a "first configuration element") is "directly connected" or "directly coupled" to another configuration element (for example, a "second configuration element"), it may be understood that there are no other configuration elements (for example, a "third configuration element") therebetween.

Hereinafter, embodiments of the present disclosure and other matters necessary for those skilled in the art to easily understand the content of the present disclosure will be described in detail with reference to the accompanying drawings. In the following description, a singular expression also includes a plural expression unless the context clearly includes only the singular expression.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Figure 2:
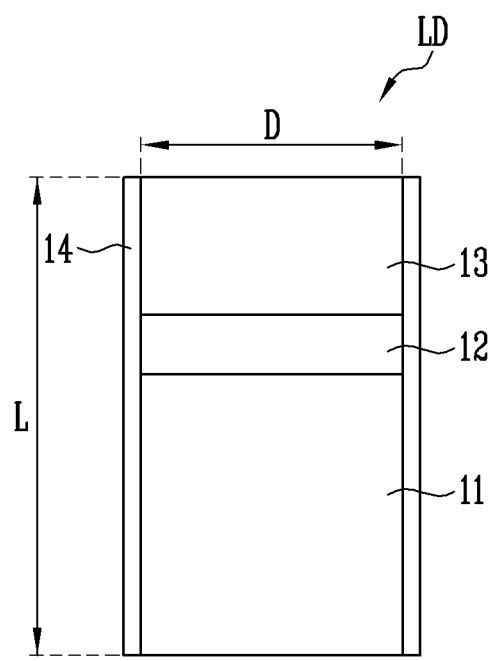
FIG. 2 is a cross-sectional view of the light emitting element of FIG. 1.

FIG. 1 is a perspective view schematically illustrating a light emitting element LD according to an embodiment of the present disclosure, and FIG. 2 is a cross-sectional view of the light emitting element LD of FIG. 1.

In one embodiment of the present disclosure, the type and/or shape of a light emitting element LD is not limited to the embodiments illustrated in FIGS. 1 and 2.

Referring to FIGS. 1 and 2, the light emitting element LD includes a first semiconductor layer 11, a second semiconductor layer 13, and an active layer 12 interposed between the first semiconductor layer 11 and the second semiconductor layer 13. For example, the light emitting element LD may be implemented by a light emitting stack in which the first semiconductor layer 11, the active layer 12, and the second semiconductor layer 13 are sequentially stacked.

The light emitting element LD may be provided in a shape extending in one direction. When an extension direction of the light emitting element LD is referred to as a longitudinal direction, the light emitting element LD may include one end portion (or lower end portion) and the other end portion (or upper end portion) in the extension direction. One of the first and second semiconductor layers 11 and 13 may be located on one end portion (or lower end portion) of the light emitting element LD, and the other one of the first and second semiconductor layers 11 and 13 may be located on the other end portion (or upper end portion) of the light emitting element LD. For example, the first semiconductor layer 11 may be located on one end portion (or lower end portion) of the light emitting element LD, and the second semiconductor layer 13 may be located on the other end portion (or upper end portion) of the light emitting element LD.

The light emitting element LD may be provided in various shapes. For example, the light emitting element LD may have a rod-like shape, a bar-like shape, a column shape, or so on, which is long in a length L direction (that is, an aspect ratio is greater than 1). In one embodiment of the present disclosure, a length L of the light emitting element LD in the length L direction may be greater than a diameter D (or width of a cross section) thereof. However, the present disclosure is not limited thereto, and in some embodiments, the light emitting element LD may also have a rod-like shape, a bar-like shape, a column shape or so on, which is short in the length L direction (that is, an aspect ratio is less than 1). In addition, the light emitting element LD may also have a rod-like shape, a bar-like shape, or a column shape, which have the same length L and the same diameter D. The light emitting element LD may include, for example, a light emitting diode (LED) manufactured to have a very small size such as the diameter D and/or the length L in a range from nanoscale to microscale.

When the light emitting element LD is long in the length L direction (that is, the aspect ratio is greater than 1), the diameter D of the light emitting element LD may be approximately 0.5 µm to 6 µm, and the length L may be approximately 1 µm to 10 µm. However, the diameter D and length L of the light emitting element LD are not limited thereto, and the size of the light emitting element LD may be changed to meet the requirements (or design conditions) of an illumination device or a self-luminous display device to which the light emitting element LD is used.

The first semiconductor layer 11 may include, for example, at least one n-type semiconductor layer. For example, the first semiconductor layer 11 may include any one of InAlGaN, GaN, AlGaN, InGaN, AlN, and InN, and may be an n-type semiconductor layer doped with a first conductive dopant (or n-type dopant) such as Si, Ge, Sn, or so on. However, a material forming the first semiconductor layer 11 is not limited thereto, and the first semiconductor layer 11 may be formed of various other materials. In one embodiment of the present disclosure, the first semiconductor layer 11 may include a gallium nitride (GaN) doped with the first conductive dopant (or n-type dopant). The first semiconductor layer 11 may include an upper surface in contact with the active layer 12 in the length L direction of the light emitting element LD and a lower surface exposed to the outside. The lower surface of the first semiconductor layer 11 may be one end portion (or lower end portion) of the light emitting element LD.

The active layer 12 may be arranged on the first semiconductor layer 11 and may be formed in a single well structure or a multi-quantum well structure. For example, when the active layer 12 is formed in the multi-quantum well structure, the active layer 12 may be formed by stacking repeatedly and periodically units constituted by a barrier layer, a strain reinforcing layer, and a well layer. The strain reinforcing layer may have a smaller lattice constant than the barrier layer, thereby further strengthening a strain applied to the well layer, for example, a compression strain. However, the structure of the active layer 12 is not limited to the above-described embodiment.

The active layer 12 may emit light with a wavelength of 400 nm to 900 nm and may use a double hetero structure. In one embodiment of the present disclosure, a clad layer doped with a conductive dopant may also be formed on and/or under the active layer 12 in the length L direction of the light emitting element LD. For example, the clad layer may be constituted by an AlGaN layer or an InAlGaN layer. In some embodiments, a material such as AlGaN or InAlGaN may be used to form the active layer 12, and various other materials may be used to form the active layer 12. The active layer 12 may include a first surface in contact with the first semiconductor layer 11 and a second surface in contact with the second semiconductor layer 13.

When an electric field of a suitable voltage (e.g., a set or predetermined voltage) or higher is applied between both end portions of the light emitting element LD, electron and holes are coupled to each other in the active layer 12 to cause the light emitting element LD to emit light. By controlling light emission of the light emitting element LD by using this principle, the light emitting element LD may be used as a light source (or light emitting source) of various light emitting devices including pixels of a display device.

The second semiconductor layer 13 may be arranged on a second surface of the active layer 12 and may include a semiconductor layer different from the first semiconductor layer 11. For example, the second semiconductor layer 13 may include at least one p-type semiconductor layer. For example, the second semiconductor layer 13 may include at least one of InAlGaN, GaN, AlGaN, InGaN, AlN, and InN and may include a p-type semiconductor layer doped with a second conductive dopant (or p-type dopant) such as Mg. However, the material forming the second semiconductor layer 13 is not limited thereto, and various other materials may form the second semiconductor layer 13. In one embodiment of the present disclosure, the second semiconductor layer 13 may include a gallium nitride (GaN) semiconductor material doped with the second conductive dopant (or p-type dopant). The second semiconductor layer 13 may include a lower surface in contact with the second surface of the active layer 12 in the length L direction of the light emitting element LD and an upper surface exposed to the outside. Here, the upper surface of the second semiconductor layer 13 may be the other end portion (or upper end portion) of the light emitting element LD.

In one embodiment of the present disclosure, the first semiconductor layer 11 and the second semiconductor layer 13 may have different thicknesses in the length L direction of the light emitting element LD. For example, the first semiconductor layer 11 may have a relatively thicker thickness than the second semiconductor layer 13 in the length L direction of the light emitting element LD. Accordingly, the active layer 12 of the light emitting element LD may be closer to the upper surface of the second semiconductor layer 13 than the lower surface of the first semiconductor layer 11.

Although the first semiconductor layer 11 and the second semiconductor layer 13 are illustrated as each being constituted as one layer, the present disclosure is not limited thereto. In one embodiment of the present disclosure, each of the first semiconductor layer 11 and the second semiconductor layer 13 may also further include at least one or more layers, for example, a clad layer and/or a tensile strain barrier reducing (TSBR) layer depending on the materials of the active layer 12. The TSBR layer may be a strain buffer layer that is arranged between semiconductor layers having different lattice structures and serves as a buffer for reducing a difference in lattice constant. The TSBR layer may be constituted by a semiconductor layer formed of a p-type material such as p-GaInP, p-AlInP, p-AlGaInP, or so on, but the present disclosure is not limited thereto.

In some embodiments, the light emitting element LD may also further include an additional electrode (or electrode layer) (hereinafter referred to as a "first additional electrode") arranged on the second semiconductor layer 13 in addition to the first semiconductor layer 11, the active layer 12, and the second semiconductor layer 13 described above. In addition, in another embodiment, the light emitting element LD may also further include another additional electrode (hereinafter referred to as a "second additional electrode") arranged at one end of the first semiconductor layer 11.

Each of the first and second additional electrodes may be an ohmic contact electrode, but the present disclosure is not limited thereto. In some embodiments, the first and second additional electrodes may be Schottky contact electrodes. The first and second additional electrodes may include a conductive material. For example, the first and second additional electrodes may include an opaque metal using chromium (Cr), titanium (Ti), aluminum (Al), gold (Au), nickel (Ni), and oxide or an alloy thereof alone or in combination, but the present disclosure is not limited thereto. In some embodiments, the first and second additional electrodes may also include transparent conductive oxides such as indium tin oxide (ITO), indium zinc oxide (IZO), zinc oxide (ZnO), indium gallium zinc oxide (IGZO), and indium tin zinc oxide (ITZO).

The materials included in the first and second additional electrodes may be the same as or different from each other. The first and second additional electrodes may be substantially transparent or translucent. Accordingly, light generated by the light emitting element LD may pass through each of the first and second additional electrodes to be emitted to the outside of the light emitting element LD. In some embodiments, when the light generated by the light emitting element LD is emitted to the outside of the light emitting element LD through a region other than both end portions of the light emitting element LD without passing through the first and second additional electrodes, the first and second additional electrodes may also include an opaque metal.

In one embodiment of the present disclosure, the light emitting element LD may further include an insulating film 14. However, in some embodiments, the insulating film 14 may be omitted and may also be provided to cover only some of the first semiconductor layer 11, the active layer 12, and the second semiconductor layer 13.

The insulating film 14 may prevent an electrical short that may occur when the active layer 12 is in contact with a conductive material other than the first and second semiconductor layers 11 and 13 of the light emitting elements LD. In addition, the insulating film 14 may reduce or minimize surface defects of the light emitting element LD, thereby increasing the lifetime and luminous efficiency of the light emitting element LD. In addition, when the plurality of light emitting elements LD are closely arranged, the insulating film 14 may prevent unwanted short circuits that may occur between the light emitting elements LD. As long as the active layer 12 may prevent occurrence of a short circuit with an external conductive material, whether or not the insulating film 14 is provided is not limited.

The insulating film 14 may be provided to partially or entirely surround an outer surface (e.g., an outer circumferential surface or an outer peripheral surface) of a light emitting stack including the first semiconductor layer 11, the active layer 12, and the second semiconductor layer 13.

In the above-described embodiment, the insulating film 14 is described to entirely surround the outer surface (e.g., the outer circumferential surface or the outer peripheral surface) of each of the first semiconductor layer 11, the active layer 12, and the second semiconductor layer 13, but the present disclosure is not limited thereto. In some embodiments, when the light emitting element LD includes the first additional electrode, the insulating film 14 may entirely surround the outer surface (e.g., the outer circumferential surface or the outer peripheral surface) of each of the first semiconductor layer 11, the active layer 12, the second semiconductor layer 13, and the first additional electrode. In addition, in another embodiment, the insulating film 14 may not entirely surround the outer surface (e.g., the outer circumferential surface or the outer peripheral surface) of the first additional electrode or may also surround only a part of the outer surface (e.g., the outer circumferential surface or the outer peripheral surface) of the first additional electrode without surrounding the rest of the outer surface (e.g., the outer circumferential surface or the outer peripheral surface) of the first additional electrode. In addition, in some embodiments, when the first additional electrode is arranged at the other end portion (or upper end portion) of the light emitting element LD and a second additional electrode is arranged at one end portion (or lower end portion) of the light emitting element LD, the insulating film 14 may also expose at least one region of each of the first and second additional electrodes.

The insulating film 14 may include a transparent insulating material. For example, the insulating film 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide (ZnO), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and so on, but the present disclosure is not limited thereto, and various materials having insulating properties may be used form forming the insulating film 14.

The insulating film 14 may be provided in the form of a single film or in the form of multiple films including at least double layers. For example, when the insulating film 14 is composed of double layers including a first layer and a second layer sequentially stacked, the first layer and the second layer may be formed of different materials (or substances) and may be formed in different (or separate) processes. In some embodiments, the first layer and the second layer may be formed of the same material or may also be formed in consecutive processes.

In some embodiments, the light emitting element LD may also be implemented as a light emitting pattern having a core-shell structure. In this case, the above-described first semiconductor layer 11 may be located at a core, that is, a central portion (or the center or the central region) of the light emitting element LD, and the active layer 12 may be provided and/or formed to surround an outer surface (e.g., an outer peripheral surface) of the first semiconductor layer 11, and the second semiconductor layer 13 may be provided and/or formed to surround the active layer 12. In addition, the light emitting element LD may also further include an additional electrode surrounding at least one side of the second semiconductor layer 13. In addition, in some embodiments, the light emitting element LD may further include the insulating film 14 that is provided on an outer surface (e.g., an outer peripheral surface) of a light emitting pattern having a core-shell structure and includes a transparent insulating material. The light emitting element LD implemented as a light emitting pattern having a core-shell structure may be manufactured by using a growth method.

The light emitting element LD described above may be used as a light emitting source (or light source) of various display devices. The light emitting element LD may be manufactured through a surface treatment process. For example, when a plurality of light emitting elements LD are mixed with a fluid solution (or solvent) and supplied to each pixel region (for example, a light emitting region of each pixel or a light emitting region of each sub-pixel), each of the light emitting elements LD may be surface-treated so that the light emitting elements LD are uniformly sprayed without unevenly aggregated in the solution.

The light emitting unit (or light emitting device) including the light emitting element LD described above may be used in various types of electronic devices that include a light source in addition to a display device. For example, when a plurality of light emitting elements LD are arranged in a pixel region of each pixel of a display panel, the light emitting elements LD may be used as a light source for each pixel. However, an application field of the light emitting element LD is not limited to the above-described example. For example, the light emitting element LD may also be used for other types of electronic devices that include a light source, such as an illumination device.

Figure 3:
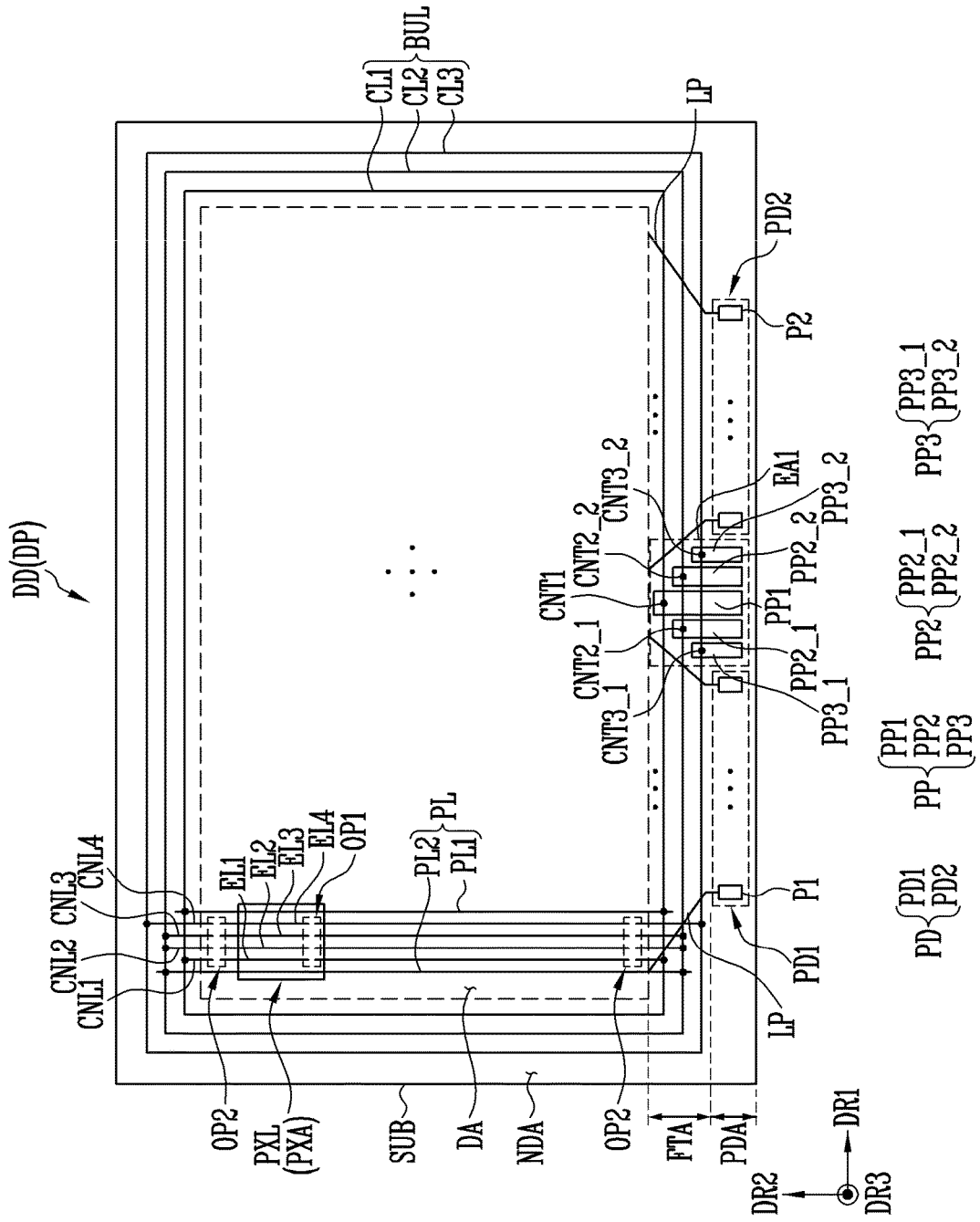
FIG. 3 illustrates a display device according to an embodiment of the present disclosure, and is a schematic plan view of the display device using the light emitting element illustrated in FIGS. 1 and 2 as a light source.

FIG. 3 illustrates a display device DD according to an embodiment of the present disclosure, and is a schematic plan view of a display device DD that uses the light emitting element LD illustrated in FIGS. 1 and 2 as a light source.

For the sake of convenience, FIG. 3 schematically illustrates a display device DD, e.g., a structure of a display panel DP provided in the display device DD centering on a display region DA where an image is displayed.

In one embodiment, a term "connection" between two components may indicate an electrical connection and a physical connection.

The present disclosure may be applied to an electronic device as long as the display device DD is the electronic device having at least one surface to which a display surface is applied, such as smartphone, television, tablet personal computer (PC), mobile phone, video phone, e-book reader, desktop PC, laptop PC, netbook computer, workstation, server, personal digital assistance (PDA), portable multimedia player (PMP), MP3 player, a medical device, a camera, or a wearable device.

Referring to FIGS. 1-3, the display device DD according to an embodiment of the present disclosure may include a substrate SUB, a plurality of pixels PXL, and a line portion LP.

The display device DD may be classified into a passive matrix type display device and an active matrix type display device according to a method of driving the light emitting element LD. For example, when the display device DD is implemented in an active matrix type, each of pixels PXL may include a drive transistor that controls the amount of currents supplied to the light emitting element LD, a switching transistor that transmits a data signal to the drive transistor, and so on.

The display device DD may be provided in various shapes, and for example, a rectangular plate shape having two pairs of sides parallel to each other, but the present disclosure is not limited thereto. When the display device DD is provided in a rectangular plate shape, one of the two pairs of sides may be longer than the other pair of sides. For the sake of convenience, a case in which the display device DD has a rectangular shape having a pair of long sides and a pair of short sides is illustrated, and an extension direction of the long side is illustrated as a first direction DR1, and an extension direction of the short side is illustrated as a second direction DR2, and a direction perpendicular to the extension directions of the long side and the short side is illustrated as a third direction DR3. In the display device DD provided in the shape of a rectangular plate, each corner portion where one long side and one short side are in contact (or meet) with each other may have a round shape, but the present disclosure is not limited thereto.

The substrate SUB may include the display region DA and a non-display region NDA.

The display region DA may be a region in which the pixels PXL displaying an image are provided. For the sake of convenience, only one pixel PXL is illustrated in FIG. 3, but substantially a plurality of pixels PXL may be provided in the display region DA of the substrate SUB.

The substrate SUB may include a transparent insulating material to transmit light therethrough. The substrate SUB may be a rigid substrate or a flexible substrate.

One region on the substrate SUB may be provided as the display region DA in which the pixels PXL are arranged, and the other region on the substrate SUB may be provided as the non-display region NDA. For example, the substrate SUB may include the display region DA including pixel regions in which the pixels PXL are arranged, and the non-display region NDA arranged (or adjacent to the display region DA) around the display region DA along the edge or periphery of the display region.

Each of the pixels PXL may be provided in a pixel region PXA in the display region DA on the substrate SUB. In one embodiment of the present disclosure, the pixels PXL may be arranged in the display region DA in a stripe arrangement structure or a PENTILE® arrangement structure on in the display region DA, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display region DA in various structures and/or manners.

Each of the pixels PXL may include at least one light emitting element (refer to "LD" in FIG. 1) driven by a corresponding scan signal and a corresponding data signal. The light emitting element LD has a size as small as nanoscale to microscale and may be connected in parallel with other light emitting elements LD arranged adjacent to each other, but the present disclosure is not limited thereto. The light emitting element LD may constitute a light source for each of the pixels PXL.

Each of the pixels PXL may include at least one light source driven by a suitable signal (e.g., a set or predetermined signal) (for example, a scan signal and a data signal) and/or a suitable power supply (e.g., a set or predetermined power supply) (for example, a first drive power supply and a second drive power supply, and so on), for example, the light emitting element LD illustrated in FIG. 1. However, the type of the light emitting element LD that may be used as a light source of each of the pixels PXL in the embodiment of the present disclosure is not limited thereto.

A first electrode EL1, a second electrode EL2, a third electrode EL3, and a fourth electrode EL4 that are spaced from each other may be arranged in the pixel region PXA in which each of the pixels PXL is provided. For example, the first electrode EL1 the second electrode EL2, the third electrode EL3, and the fourth electrode EL4 that are spaced from each other along a first direction DR1 and extend in a second direction DR2 may be arranged in the pixel region PXA. At least one light emitting element LD may arranged (or provided) between two adjacent electrodes from among the first electrode EL1, the second electrode EL2, the third electrode EL3, and the fourth electrode EL4. Components arranged in the pixel region PXA will be described below with reference to FIGS. 5 and 6.

At least one first open region OP1 (or electrode separation region) may be located in the pixel region PXA. For example, the first open region OP1 may be located on at least one side of each of the pixels PXL in the second direction DR2. At least one of the first electrode EL1, the second electrode EL2, the third electrode EL3, and the fourth electrode EL4 may be partially removed from the first open region OP1.

Power lines PL for supplying a suitable drive power (e.g., a set or predetermined drive power) to the pixels PXL may be provided in the display region DA. The power lines PL may include a first power line PL1 and a second power line PL2.

The first power line PL1 and the second power line PL2 may extend in one direction, for example, the second direction DR2. A plurality of the first and second power lines PL1 and PL2 may be arranged in the display region DA at intervals of at least one pixel PXL (or pixel region PXA) in the first direction DR1.

The first power line PL1 may be commonly connected to a plurality of pixels PXL sequentially arranged in the same direction as an extension direction thereof. For example, the first power line PL1 may extend in the second direction DR2 to be commonly connected to the plurality of pixels PXL sequentially arranged along the second direction DR2. Similarly, the second power line PL2 may be commonly connected to the plurality of pixels PXL sequentially arranged in the same direction as an extension direction thereof. For example, the second power line PL2 may extend in the second direction DR2 to be commonly connected to the plurality of pixels PXL sequentially arranged along the second direction DR2.

In one embodiment, one region of the first power line PL1 may be arranged to overlap the pixel region PXA of at least one pixel PXL. However, the present disclosure is not limited thereto, and in some embodiment, the first power line PL1 may also be arranged so as not to overlap the pixel region PXA. The first power line PL1 may be electrically connected to a first bus line CL1 (or a first conductive line) arranged in the non-display region NDA to be electrically connected to a first power pad PP1 through the first bus line CL1. When the display device DD is driven, a first drive power supply voltage VDD (for example, a drive power supply voltage of a high potential) may be supplied to the first power pad PP1.

Both ends of the first power line PL1 may be connected to the first bus line CL1. In this case, the first power line PL1 may receive the first drive power supply voltage VDD in both directions while the display device DD is driven. Accordingly, a voltage drop of the first drive power supply voltage VDD may be reduced or minimized. However, the present disclosure is not limited thereto, and in some embodiments, only one end of the first power line PL1 may be connected to the first bus line CL1. In this case, the first power line PL1 may receive the first drive power supply voltage VDD from the one end during a period in which the display device DD is driven.

In one embodiment, one region of the second power line PL2 may be arranged to overlap the pixel region PXA of at least one pixel PXL. However, the present disclosure is not limited thereto, and in some embodiments, the second power line PL2 may also be arranged so as not to overlap the pixel region PXA. The second power line PL2 may be electrically connected to a second bus line CL2 (or second conductive line) arranged in the non-display region NDA to be electrically connected to a second power pad PP2 of a power pad portion PP through the second bus line CL2. When the display device DD is driven, the second drive power supply voltage VSS (for example, drive power supply voltage of a low potential) may be supplied to the second power pad PP2.

Both ends of the second power line PL2 may be connected to the second bus line CL2. In this case, the second power line PL2 may receive the second drive power supply voltage VSS in both directions while the display device DD is driven. Accordingly, a voltage drop of the second drive power supply voltage VSS may be reduced or minimized. However, the present disclosure is not limited thereto, and in some embodiments, only one of both ends of the second power line PL2 may be connected to the second bus line CL2. In this case, the second power line PL2 may receive the second drive power supply voltage VSS from one end during a period in which the display device DD is driven.

The non-display region NDA may be a region in which suitable lines, pads, and/or an embedded circuit portion (e.g., predetermined lines, pads, and/or an embedded circuit portion) electrically connected to the pixels PXL are provided to drive the pixels PXL. For example, the line portion LP, a bus line BUL, a pad portion PD, and the power pad portion PP may be provided in the non-display region NDA.

The non-display region NDA may be provided on at least one side of the display region DA. The non-display region NDA may surround the periphery (or edge) of the display region DA. The non-display region NDA may be divided into a fan-out region FTA and a pad region PDA.

The line portion LP may be provided in the fan-out region FTA and may electrically connect a drive portion to the pixels PXL. The line portion LP may provide a signal to each of the pixels PXL and may include a fan-out line connected to signal lines connected to each of the pixels PXL, such as a scan line, a data line, and a light emission control line. In addition, the line portion LP may be a fan-out line connected to signal lines connected to each of the pixels PXL, for example, a control line, a sensing line, and so on to compensate for a change in electrical characteristics of the pixels PXL in real time.

The bus line BUL may surround (or be at) at least one side of the display region DA. In one embodiment, the bus line BUL may include a first bus line CL1, a second bus line CL2, and a third bus line CL3 (or a third conductive line).

The first bus line CL1 may be connected to the first power line PL1 and the first power pad PP1. For example, the first bus line CL1 may be connected between the first power line PL1 and the first power pad PP1 to transmit, to the first power line PL1, the first drive power supply voltage VDD applied to the first power pad PP1 when the display device DD is driven.

The first bus line CL1 may be connected to a first alignment pad provided on a mother substrate during a step of aligning the light emitting elements LD in the pixel region PXA of each of the pixels PXL in a manufacturing step of the display device DD to transmit a first alignment signal applied to the first alignment pad to the first electrode EL1 of each of the pixels PXL. To this end, the first bus line CL1 may be first formed to be connected to the first electrode EL1 of each of the pixels PXL and may be separated from the first electrode EL1 of each of the pixels PXL after alignment of the light emitting elements LD is completed. During this process, a plurality of first connection lines CNL1 may be formed.

One end of each of the first connection lines CNL1 may be connected to the first bus line CL1 and may extend toward the first electrodes EL1 of adjacent pixels PXL (for example, the pixels PXL in a first pixel row and/or a last pixel row). The other end of each of the first connection lines CNL1 may be disconnected at at least one second open region OP2 (or a connection line separation region) provided around the pixels PXL located closest to the non-display region NDA and may be floated.

The second bus line CL2 may be connected to the second power line PL2 and the second power pad PP2. For example, the second bus line CL2 may be connected between the second power line PL2 and the second power pad PP2 to transmit, to the second power line PL2, the second drive power supply voltage VSS applied to the second power pad PP2 when the display device DD is driven.

The second bus line CL2 may be connected to the second alignment pad provided on the mother substrate during a step of aligning the light emitting elements LD described above to transmit a second alignment signal applied to a second alignment pad to the second and third electrodes EL2 and EL3. To this end, the second bus line CL2 may be first formed to be connected to the second and third electrodes EL2 and EL3 of each of the pixels PXL and may be separated from each of the second and third electrodes EL2 and EL3 of each of the pixels PXL after alignment of the light emitting elements LD is completed. During this process, a plurality of second connection lines CNL2 and a plurality of third connection lines CNL3 may be formed.

One end of each of the second connection lines CNL2 may be connected to the second bus line CL2 and may extend toward the second electrodes EL2 of adjacent pixels PXL. The other end of each of the second connection lines CNL2 may be disconnected at the second open region OP2 and floated. One end of each of third connection lines CNL3 may be connected to the second bus line CL2 and may extend toward the third electrodes EL3 of adjacent pixels PXL. The other end of each of the third connection lines CNL3 may be disconnected at the second open region OP2 and floated.

The third bus line CL3 may be connected to a third power pad PP3. The third bus line CL3 may not be connected to the pixels PXL, the first power line PL1, and the second power line PL2. That is, the third bus line CL3 may be separated from the pixels PXL, the first power line PL1, and the second power line PL2.

In one embodiment, the third bus line CL3 may be connected to the third power pad PP3 to receive the second drive power supply voltage VSS applied to the third power pad PP3 when the display device DD is driven. However, the present disclosure is not limited thereto, and in some embodiments, the third bus line CL3 may also receive a third drive power supply voltage having a level different from the first and second drive power supply voltages VDD and VSS through the third power pad PP3. In addition, in another embodiment, the third bus line CL3 may be connected to the third power pad PP3 but may also be floated when a suitable power supply voltage (e.g., a set or predetermined power supply voltage) is not applied to the third power pad PP3.

The third bus line CL3 may be connected to a third alignment pad disposed (or provided) on the mother substrate during a step of aligning the light emitting elements LD described above to transmit a third alignment signal applied to the third alignment pad to a fourth electrode EL4 of each of the pixels PXL. To this end, the third bus line CL3 may be first formed to be connected to the fourth electrode EL4 of each of the pixels PXL and may be separated from the fourth electrode EL4 of each of the pixels PXL after alignment of the light emitting elements LD is completed. During this process, a plurality of fourth connection lines CNL4 may be formed.

One end of each of the fourth connection lines CNL4 may be connected to the third bus line CL3 and may extend toward the fourth electrodes EL4 of adjacent pixels PXL. The other end of each of the fourth connection lines CNL4 may be disconnected at the second open region OP2 and floated.

In one embodiment, the third bus line CL3 may be arranged at the outermost (or outside) of the bus lines BUL. For example, the third bus line CL3 may be located at an edge of the display panel DP to surround at least one region of the first and second bus lines CL1 and CL2. In this case, the third bus line CL3 may also be used as a shield line in the display device DD.

In some embodiments, at least one of the first to third bus lines CL1 to CL3 may have a closed loop shape. For example, each of the first to third bus lines CL1 to CL3 may have a closed loop shape surrounding an edge of the display region DA. However, the present disclosure is not limited thereto, and in some embodiments, at least one of the first to third bus lines CL1 to CL3 has a closed loop shape, and the other bus lines may have a shape that does not entirely surround the edge of the display region DA, for example, an open loop shape of which a portion is open.

When the first and second bus lines CL1 and CL2 have a closed loop shape, a voltage drop of the first and second drive power supply voltages VDD and VSS may be reduced or minimized. In addition, by connecting the first and second bus lines CL1 and CL2 to both ends of the first and second power lines PL1 and PL2 respectively, the first and second drive power supply voltages VDD and VSS may be supplied in both directions. Accordingly, it is possible to prevent or reduce a luminance deviation of the pixels PXL due to the voltage drop of the first and second drive power supply voltages VDD and VSS.

In addition, when the second bus line CL2 has a closed loop shape, a second alignment signal may be stably applied to the second and third electrodes EL2 and EL3 of each of the pixels PXL during the above-described step of aligning the light emitting devices.

Additionally, when the third bus line CL3 has a closed loop shape, the pixels PXL and the first and second bus lines CL1 and CL2 may be protected from static electricity to be stabilized.

The pad portion PD may be located (or provided) in the pad region PDA and may include a first pad portion PD1 and a second pad portion PD2 spaced apart from each other.

The first pad portion PD1 may include a plurality of first pads P1, and the second pad portion PD2 may include a plurality of second pads P2. The first and second pads P1 and P2 may supply (or transmit) drive power supply voltages and signals for driving the pixels PXL and/or an embedded circuit unit provided in the display region DA. For example, the first pads P1 may be electrically connected to the pixels PXL corresponding to the first pad portion PD1 from among the plurality of pixels PXL to supply the drive power supply voltages and signals to the pixels PXL. The second pads P2 may be electrically connected to the pixels PXL corresponding to the second pad portion PD2 from among the plurality of pixels PXL to supply (or transmit) the drive power supply voltages and signals to the pixels PXL.

The power pad portion PP may include a first power pad PP1, a second power pad PP2, and a third power pad PP3. The power pad portion PP may be located in a region between the first pad portion PD1 and the second pad portion PD2 in the non-display region NDA.

The first power pad PP1 may be connected to the first bus line CL1. For example, the first power pad PP1 may be connected to the first bus line CL1 through a first contact portion CNT1. The first contact portion CNT1 may be a through-hole (or a contact hole) penetrating at least one insulating layer between the first bus line CL1 and the first power pad PP1. When the display device DD is driven, the first power pad PP1 may receive the first drive power supply voltage VDD and transmit the first drive power supply voltage VDD to the first power line PL1 through the first bus line CL1. The first power pad PP1 may receive a first alignment signal during a step of aligning the light emitting elements LD and transmit the first alignment signal to the first electrode EL1 of each of the pixels PXL through the first bus line CL1.

The second power pad PP2 may include a 2-1$^{th}$ power pad PP2_1 and a 2-2$^{th}$ power pad PP2_2 spaced from each other with the first power pad PP1 interposed therebetween. The 2-1$^{th}$ power pad PP2_1 and the 2-2$^{th}$ power pad PP2_2 may be connected to the second bus line CL2. For example, the 2-1$^{th}$ power pad PP2_1 may be connected to the second bus line CL2 through the 2-1$^{th}$ contact portion CNT2_1, and the 2-2$^{th}$ power pad PP2_2 may be connected to the second bus line CL2 through the 2-2$^{th}$ contact portion CNT2_2. The 2-1$^{th}$ contact portion CNT2_1 may be a through-hole (or a contact hole) penetrating at least one insulating layer between the second bus line CL2 and the 2-1$^{th}$ power pad PP2_1. The 2-2$^{th}$ contact portion CNT2_2 may be a through-hole (or a contact hole) penetrating at least one insulating layer between the second bus line CL2 and the 2-2$^{th}$ power pad PP2_2. When the display device DD is driven, the second power pad PP2 may receive the second drive power supply voltage VSS and transmit the second drive power supply voltage VSS to the second power line PL2 through the second bus line CL2. The second power pad PP2 may receive a second alignment signal during a step of aligning the light emitting elements LD and transmit the second alignment signal to the second and third electrodes EL2 and EL3 of each of the pixels PXL through the second bus line CL2.

The third power pad PP3 may include a 3-1$^{th}$ power pad PP3_1 and a 3-2$^{th}$ power pad PP3_2 spaced from each other. The 3-1$^{th}$ power pad PP3_1 may be located adjacent to, for example, one side of the 2-1$^{th}$ power pad PP2_1. In this case, the 2-1$^{th}$ power pad PP2_1 may be located between the first power pad PP1 and the 3-1$^{th}$ power pad PP3_1. The 3-2$^{th}$ power pad PP3_2 may be located adjacent to, for example, one side of the 2-2$^{th}$ power pad PP2_2. In this case, the 2-2$^{th}$ power pad PP2_2 may be located between the first power pad PP1 and the 3-2$^{th}$ power pad PP3_2. The 3-1$^{th}$ power pad PP3_1 and the 3-2$^{th}$ power pad PP3_2 may be connected to the third bus line CL3. For example, the 3-1$^{th}$ power pad PP3_1 may be connected to the third bus line CL3 through the 3-1$^{th}$ contact portion CNT3_1, and the 3-2$^{th}$ power pad PP3_2 may be connected to the third bus line CL3 through the 3-2$^{th}$ contact portion CNT3_2. The 3-1$^{th}$ contact portion CNT3_1 may be a through-hole (or a contact hole) penetrating at least one insulating layer between the third bus line CL3 and the 3-1$^{th}$ power pad PP3_1. The 3-2$^{th}$ contact portion CNT3_2 may be a through-hole (or a contact hole) penetrating at least one insulating layer between the third bus line CL3 and the 3-2$^{th}$ power pad PP3_2. When the display device DD is driven, the third power pad PP3 may receive the second drive power supply voltage VSS or the third drive power supply voltage or may be floated. The third power pad PP3 may receive a third alignment signal during a step of aligning the light emitting elements LD and transmit the third alignment signal to the fourth electrode EL4 of each of the pixels PXL through the third bus line CL3.

The power pad portion PP including the first power pad PP1, the second power pad PP2, and the third power pad PP3 described above may be located in one region of the non-display region NDA so as not to overlap the line portion LP located in a fan-out region FTA. In one embodiment, the power pad portion PP may be located in one region of the non-display region NDA between the first pad portion PD1 and the second pad portion PD2 and may not overlap the line portion LP connected to the first pad portion PD1 and the line portion LP connected to the second pad portion PD2. Because the power pad portion PP does not overlap the line portion LP connected to the plurality of first and second pads P1 and P2, components arranged under the power pad portion PP may be reduced or minimized, thereby reducing or minimizing occurrence of a step difference due to the components. Accordingly, the power pad unit PP may be prevented from being lifted due to the step difference, thereby increasing reliability of the power pad portion PP.

In addition, by obtaining the size (or area) of the third power pad PP3 to a certain level or more, contact resistance of the third power pad PP3 is reduced, resulting in reduction or minimization of burnt failure which may occur due to an increase in resistance caused by a small area, and thus, reliability of the third power pad PP3 may be further increased.

Figure 4:
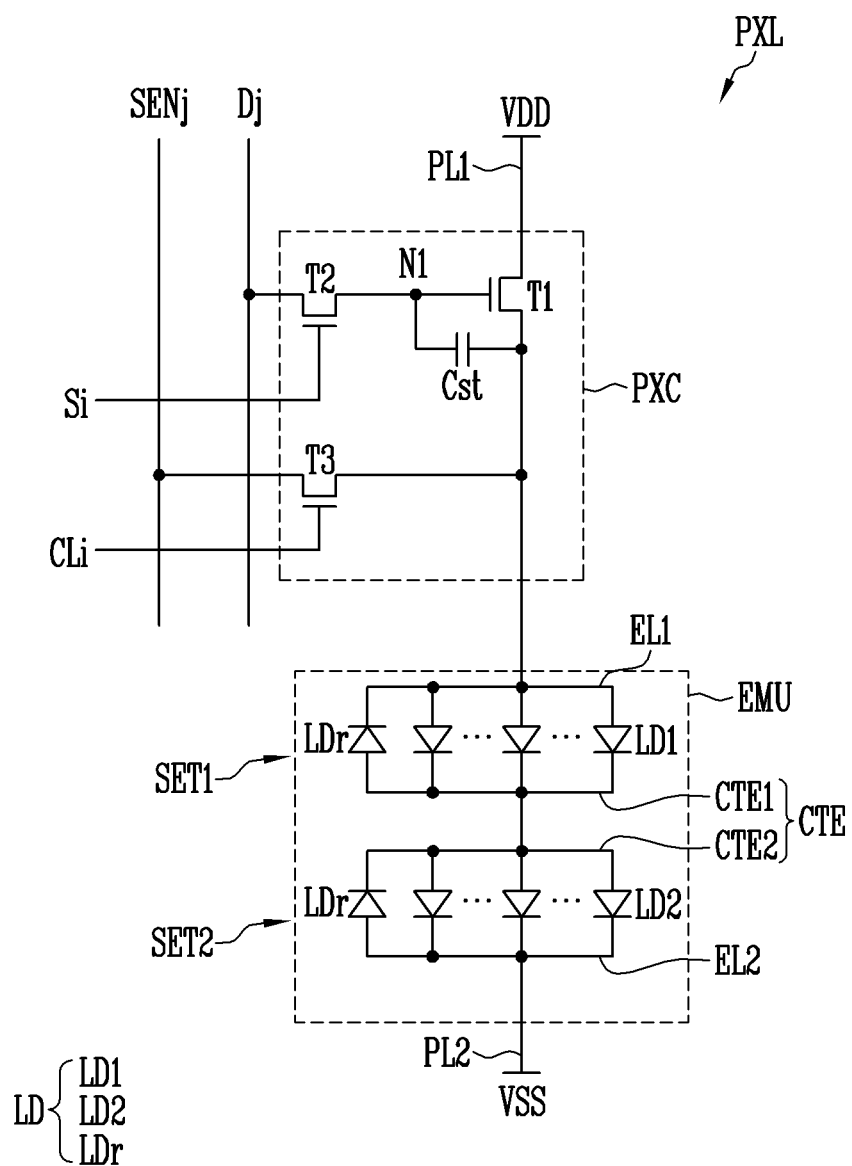
FIG. 4 is a circuit diagram illustrating an electrical connection relationship between components included in one pixel illustrated in FIG. 3, according to an embodiment.

FIG. 4 is a circuit diagram illustrating an electrical connection relationship between components included in one pixel PXL illustrated in FIG. 3, according to an embodiment.

For example, FIG. 4 illustrates an electrical connection relationship between components included in the pixel PXL that may be used for an active display device, according to an embodiment. However, the type of components included in the pixel PXL to which the embodiment of the present disclosure may be applied is not limited thereto.

In FIG. 4, not only the components included in each of the pixels PXL illustrated in FIG. 3, but also a region in which the components are provided, are referred to as the pixel PXL.

Referring to FIGS. 1-4, one pixel PXL (hereinafter, referred to as a "pixel") may include a light emitting unit EMU that generates light with a luminance corresponding to a data signal. In addition, the pixel PXL may selectively further include a pixel circuit PXC for driving the light emitting unit EMU.

In some embodiments, the light emitting unit EMU may include a plurality of light emitting elements LD connected in parallel between the first power line PL1 to which the first drive power supply voltage VDD is applied and the second power line PL2 to which the second drive power supply voltage VSS is applied. For example, the light emitting unit EMU may include the first electrode EL1 (or a "first alignment electrode") connected to the first drive power supply voltage VDD through the pixel circuit PXC and the first power line PL1, the second electrode EL2 (or a "second alignment electrode") connected to the second drive power supply voltage VSS through the second power line PL2, and a plurality of light emitting elements LD connected in parallel in the same direction between the first electrode EL1 and the second electrode EL2. In one embodiment of the present disclosure, the first electrode EL1 may be an anode, and the second electrode EL2 may be a cathode. Here, the first power line PL1 may be the first power line PL1 described with reference to FIG. 3, and the second power line PL2 may be the second power line PL2 described with reference to FIG. 3.

Each of the light emitting elements LD included in the light emitting unit EMU may have one end portion connected to the first drive power supply voltage VDD through the first electrode EL1 and the other end connected to the second drive power supply voltage VSS through the second electrode EL2. The first drive power supply voltage VDD and the second drive power supply voltage VSS may have different potentials. For example, the first drive power supply voltage VDD may be set to a power supply voltage of a high potential, and the second drive power supply voltage VSS may be set to a power supply voltage of a low potential. In this case, a potential difference between the first drive power supply voltage VDD and the second drive power supply voltage VSS may be set to be greater than or equal to threshold voltages of the light emitting elements LD during a light emission period of the pixel PXL. The first drive power supply voltage VDD described above may be the first drive power supply voltage VDD described with reference to FIG. 3, and the second drive power supply voltage VSS described above may be the second drive power supply voltage VSS described with reference to FIG. 3.

As described above, the light emitting elements LD connected in parallel in the same direction (for example, forward direction) between the first electrode EL1 and the second electrode EL2 to which voltages of different potentials are supplied may constitute effective light sources. The effective light sources may be collected (or connected together) to form the light emitting unit EMU of the pixel PXL.

The light emitting elements LD of the light emitting unit EMU may emit light with a luminance corresponding to a drive current supplied through the corresponding pixel circuit PXC. For example, during each frame period, the pixel circuit PXC may supply a drive current corresponding to a gradation value of the corresponding frame data to the light emitting unit EMU. The drive current supplied to the light emitting unit EMU may be divided and flow into each of the light emitting elements LD. Accordingly, while each light emitting element LD emits light with a luminance corresponding to a current flowing therethrough, the light emitting unit EMU may emit light with a luminance corresponding to the drive current.

An embodiment in which both end portions of the light emitting elements LD are connected in the same direction between the first and second drive power supply voltages VDD and VSS is illustrated, but the present disclosure is not limited thereto. In some embodiments, the light emitting unit EMU may further include at least one non-effective light source, for example, a reverse light emitting element LDr in addition to the light emitting elements LD constituting respective effective light sources. The reverse light emitting element LDr may be connected in parallel between the first and second electrodes EL1 and EL2 together with the light emitting elements LD constituting effective light sources and may be connected between the first electrode EL1 and the second electrode EL2 in a direction opposite to the light emitting elements LD. The reverse light emitting element LDr maintains an inactive state even when a suitable drive voltage (e.g., a set or predetermined drive voltage) (for example, a forward drive voltage) is applied between the first electrode EL1 and the second electrode EL2, and a current does not substantially flow through the reverse light emitting element LDr.

The pixel circuit PXC may be connected to a scan line Si and a data line Dj of the pixel PXL. For example, when the pixel PXL is arranged in an $i^{th}$ (i is a natural number) row and a $j^{th}$ (j is a natural number) column of the display region DA, the pixel circuit PXC of the pixel PXL may be connected to the $i^{th}$ scan line Si and the $j^{th}$ data line Dj of the display region DA. In addition, the pixel circuit PXC may be connected to an $i^{th}$ control line CLi and a $j^{th}$ sensing line SENj of the display region DA.

The pixel circuit PXC described above may include first to third transistors T1 to T3 and a storage capacitor Cst.

A first terminal of the first transistor T1 (e.g., a driving transistor) may be connected to the first drive power supply voltage VDD, and a second terminal thereof may be electrically connected to the first electrode EL1 of each of the light emitting elements LD. A gate electrode of the first transistor T1 may be connected to a first node N1. The first transistor T1 may control the amount of drive currents supplied to the light emitting elements LD in response to a voltage at the first node N1.

A first terminal of the second transistor T2 (e.g., a switching transistor) may be connected to the $j^{th}$ data line Dj, and a second terminal thereof may be connected to the first node N1. Here, the first terminal and the second terminal of the second transistor T2 may be different terminals, and for example, when the first terminal is a source electrode, the second terminal may be a drain electrode. In addition, a gate electrode of the second transistor T2 may be connected to the $i^{th}$ scan line Si.

The second transistor T2 is turned on when a scan signal having a voltage by which the second transistor T2 may be turned on (e.g., a high level voltage) is supplied from the $i^{th}$ scan line Si, and thereby, the $j^{th}$ data line Dj and the first node N1 are electrically connected to each other. In this case, a data signal of the corresponding frame is supplied to the $j^{th}$ data line Dj, and accordingly, the data signal is transmitted to the first node N1. The data signal transmitted to the first node N1 is charged in the storage capacitor Cst. For example, the storage capacitor Cst may hold a charge corresponding to the data signal transmitted to the first node N1.

The third transistor T3 may be connected between the first transistor T1 and the $j^{th}$ sensing line SENj. For example, a first terminal of the third transistor T3 may be connected to the second terminal (for example, the source electrode) of the first transistor T1 connected to the first electrode EL1, and a second terminal of the transistor T3 may be connected to the $j^{th}$ sensing line SENj. A gate electrode of the third transistor T3 may be connected to the $i^{th}$ control line CLi. The third transistor T3 is turned on by a control signal having a gate-on voltage (e.g., a high level voltage) supplied to the $i^{th}$ control line CLi during a sensing period (e.g., a set or predetermined sensing period), and thereby, the $j^{th}$ sensing line SENj and the first transistor T1 are electrically connected to each other.

The sensing period may be a period in which characteristic information (for example, a threshold voltage of the first transistor T1) of each of the pixels PXL arranged in the display region DA is extracted.

One electrode of the storage capacitor Cst may be connected to the first node N1, and the other electrode may be connected to the second terminal of the first transistor T1. The storage capacitor Cst may charge a voltage (or hold a charge) corresponding to the data signal supplied to the first node N1 and maintain the charged voltage until a data signal of a next frame is supplied.

Each light emitting unit EMU may also be constituted to include at least one series stage including a plurality of light emitting elements LD connected in parallel with each other. That is, the light emitting unit EMU may also be constituted in a series-parallel structure as illustrated in FIG. 4.

The light emitting unit EMU may include first and second series stages SET1 and SET2 sequentially connected between the first and second drive power supply voltages VDD and VSS. Each of the first and second series stages SET1 and SET2 may include two electrodes EL1 and CTE1 or CTE2 and EL2 constituting an electrode pair of the corresponding series stage, and a plurality of light emitting elements LD connected in parallel in the same direction between the two electrodes EL1 and CTE1 or CTE2 and EL2.

The first series stage SET1 may include the first electrode EL1, a first intermediate electrode CTE1, and one or more first light emitting elements LD1 connected between the first electrode EL1 and the first intermediate electrode CTE1. In addition, the first series stage SET1 may include a reverse light emitting element LDr connected between the first electrode EL1 and the first intermediate electrode CTE1 in a direction opposite to the first light emitting elements LD1.

The second series stage SET2 may include a second intermediate electrode CTE2, the second electrode EL2, and one or more second light emitting elements LD2 connected between the second intermediate electrode CTE2 and the second electrode EL2. In addition, the second series stage SET2 may include a reverse light emitting element LDr connected between the second intermediate electrode CTE2 and the second electrode EL2 in a direction opposite to the second light emitting elements LD2.

The first intermediate electrode CTE1 of the first series stage SET1 and the second intermediate electrode CTE2 of the second series stage SET2 may be integrally provided and connected to each other. That is, the first intermediate electrode CTE1 and the second intermediate electrode CTE2 may constitute an intermediate electrode CTE that electrically connects the consecutive first and second series stages SET1 and SET2. When the first intermediate electrode CTE1 and the second intermediate electrode CTE2 are provided integrally, the first intermediate electrode CTE1 and the second intermediate electrode CTE2 are different regions of the intermediate electrode CTE.

In the above-described embodiment, the first electrode EL1 of the first series stage SET1 may be an anode electrode of the light emitting unit EMU of the pixel PXL, and the second electrode EL2 of the second series stage SET2 may be a cathode electrode of the light emitting unit EMU.

Although FIG. 4 discloses an embodiment in which all of the first to third transistors T1 to T3 are N-type transistors, the present disclosure is not limited thereto. For example, at least one of the first to third transistors T1 to T3 described above may also be changed to a P-type transistor. In addition, although FIG. 4 discloses an embodiment in which the light emitting unit EMU is connected between the pixel circuit PXC and the second drive power supply voltage VSS, the light emitting unit EMU may also be connected between the first drive power supply voltage VDD and the pixel circuit PXC.

The structure of the pixel circuit PXC may be variously changed. For example, the pixel circuit PXC may also further include at least one transistor element such as a transistor element for initializing the first node N1 and/or a transistor element for controlling the light emission time of the light emitting elements LD, or other circuit elements such as a boosting capacitor for boosting a voltage of the first node N1.

The structure of the pixel PXL applicable to the present disclosure is not limited to the embodiment illustrated in FIG. 4, and the pixel PXL may have various structures. For example, the pixels PXL may be provided in a passive light emitting display device or so on. In this case, the pixel circuit PXC may be omitted, and both end portions of the light emitting elements LD included in the light emitting unit EMU may be directly connected the $i^{th}$ scan line Si, the $j^{th}$ data line Dj, the first power line PL1 to which the first drive power supply voltage VDD is applied, the second power line PL2 to which the second drive power supply voltage VSS is applied, a control line (e.g., a set or predetermined control line), and/or so on.

Figure 5:
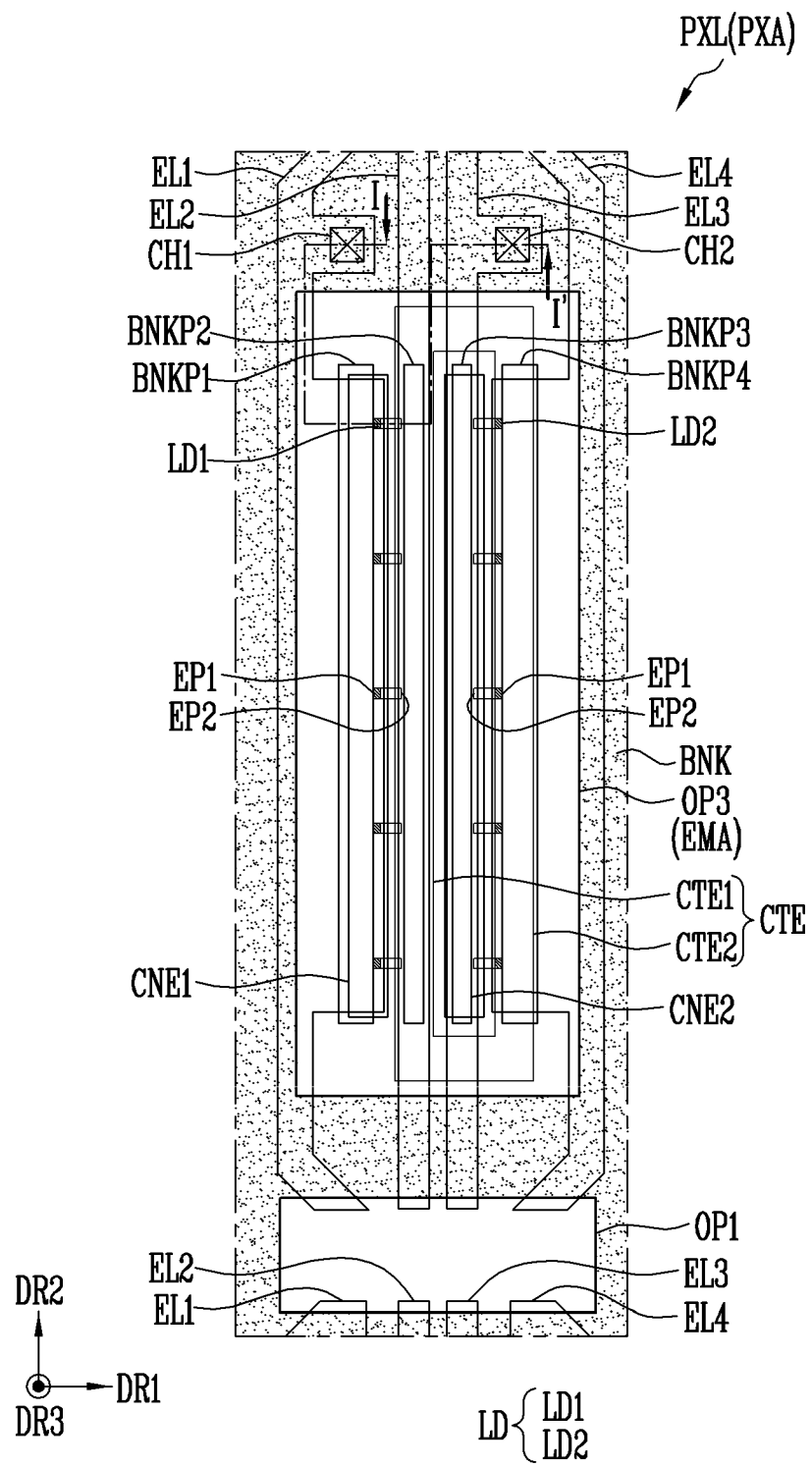
FIG. 5 is a plan view schematically illustrating one pixel illustrated in FIG. 3.

FIG. 5 is a plan view schematically illustrating one pixel PXL illustrated in FIG. 3.

For the sake of convenience, FIG. 5 does not illustrate transistors T electrically connected to the light emitting elements LD and signal lines electrically connected to the transistors T.

For the sake of convenient description, one embodiment of the present disclosure illustrates a width direction (or horizontal direction) of the substrate SUB on a plane as the first direction DR1, a height direction (or vertical direction) of the substrate SUB on the plane as the second direction DR2, and a thickness direction of the substrate SUB on a cross section as the third direction DR3. The first to third directions DR1, DR2, and DR3 may refer to the directions as indicated in FIG. 5, for example.

In one embodiment, a term "connection" between two components may indicate an electrical connection and a physical connection in general.

In addition, in one embodiment, "formed and/or provided in the same layer" means being formed in the same process, and "formed and/or provided in different layers" means being formed in different processes.

Referring to FIGS. 3 and 5, each of the pixels PXL may be provided and/or formed in the pixel region PXA. The pixel region PXA may include a light emitting region (or an emission region) EMA and a non-light emitting region (or a non-emission region). The non-light emitting region may be a region surrounding the light emitting region EMA and may not emit light.

In some embodiments, each of the pixels PXL may include a bank BNK located in a non-light emitting region.

The bank BNK may be a structure, for example, a pixel defining film for defining (or partitioning) the pixel region PXA or the light emitting region EMA of each of the corresponding pixel PXL and adjacent pixels PXL. For example, the pixel region PXA may be partitioned to include one light emitting region EMA by the bank BNK. However, the present disclosure is not limited thereto, and in some embodiments, the pixel region PXA may be partitioned to include at least two or more light emitting regions by the bank BNK.

In one embodiment, during a process of supplying (or introducing) the light emitting elements LD to each of the pixels PXL, the bank BNK may be a pixel defining film or a dam structure for defining each light emitting regions EMA to which the light emitting elements LD are to be supplied. For example, as the light emitting regions EMA of the pixels PXL are partitioned by the bank BNK, a mixed solution (for example, Ink) including the light emitting elements LD of a desirable amount and/or type may be supplied (or introduced) to in the light emitting regions EMA.

The bank BNK may be formed to include at least one light blocking material and/or a reflective material to prevent leakage of light between adjacent pixels PXL. In some embodiments, the bank BNK may include a transparent material (or substance). The transparent material may include, for example, polyamides resin, polyimide resin, and so on, but the present disclosure is not limited thereto. According to another embodiment, a reflective material layer may also be separately provided and/or formed on the bank BNK to further increase efficiency of light emitted from each of the pixels PXL.

The bank BNK may include one or more open regions exposing components under the bank BNK in the pixel region PXA of the corresponding pixel PXL. For example, the bank BNK may include a first open region OP1 and a third open region OP3 exposing components under the bank BNK in the pixel region PXA of the corresponding pixel PXL. In one embodiment, the light emitting region EMA of each of the pixels PXL and the third open region OP3 of the bank BNK may correspond to each other.

In the pixel region PXA, the first open region OP1 of the bank BNK may be spaced from the third open region OP3 and may be adjacent to one side (for example, an upper side or a lower side) of the pixel region PXA. For example, the first open region OP1 of the bank BNK may be adjacent to the lower side of the pixel region PXA. Here, the first open region OP1 of the bank BNK may be the first open region OP1 described with reference to FIG. 3.

The pixels PXL are arranged in the first direction DR1 and may include the first electrode EL1, the second electrode EL2, the third electrode EL3, and the fourth electrode EL4 arranged to be spaced from each other.

The first electrode EL1, the second electrode EL2, the third electrode EL3, and the fourth electrode EL4 may be sequentially arranged along the first direction DR1. The first electrode EL1, the second electrode EL2, the third electrode EL3, and the fourth electrode EL4 may extend a direction different from the first direction DR1, for example, in a second direction DR2 crossing the first direction. Ends of each of the first to fourth electrodes EL1 to EL4 may be located in the first open region OP1 of the bank BNK. After the light emitting elements LD are aligned during a process of manufacturing the display device DD, the first to fourth electrodes EL1 to EL4 of the pixel PXL may be separated from the first to fourth electrodes EL1 to EL4 of the adjacent pixels (for example, the adjacent pixels PXL in the second direction DR2) in the first open region OP1. The first open region OP1 of the bank BNK may be provided for a separation process of the first electrode EL1, the second electrode EL2, the third electrode EL3, and the fourth electrode EL4.

The first electrode EL1 may include a protrusion portion protruding from the light emitting region EMA of each of the pixels PXL toward the second electrode EL2 in the first direction DR1. The protrusion portion of the first electrode EL1 may be provided to maintain an interval (e.g., a set or predetermined interval) between the first electrode EL1 and the second electrode EL2 in the light emitting region EMA of the pixel PXL. Similarly, the fourth electrode EL4 may include a protrusion portion protruding from the light emitting region EMA toward the third electrode EL3 in the first direction DR1. The protrusion portion of the fourth electrode EL4 may be provided to maintain an interval (e.g., a set or predetermined interval) between the third electrode EL3 and the fourth electrode EL4 in the light emitting region EMA.

However, the first electrode EL1, the second electrode EL2, the third electrode EL3, and the fourth electrode EL4 are not limited thereto. For example, the shape and/or a mutual arrangement relationship of the first electrode EL1, the second electrode EL2, the third electrode EL3, and the fourth electrode EL4 may be variously changed. For example, each of the first electrode EL1 and the fourth electrode EL4 may also have a curved shape without including the protrusion portion. In another example, the third electrode EL3 may extend to adjacent pixels PXL in the second direction DR2.

The first electrode EL1 may be connected to the first transistor T1 described with reference to FIG. 4 through a first contact hole CH1, and the third electrode EL3 may be connected to the second drive power supply voltage VSS (or the second power line PL2) described with reference to 4 through a second contact hole CH2. In one embodiment, the first electrode EL1 may be the first electrode EL1 described with reference to FIG. 4, and the third electrode EL3 may be the second electrode EL2 described with reference to FIG. 4. That is, the first electrode EL1 may be an anode of the light emitting unit (refer to "EMU" in FIG. 4) of each of the pixels PXL, and the third electrode EL3 may be a cathode of the light emitting unit EMU.

Each of the first to fourth electrodes EL1 to EL4 may receive an alignment signal (e.g., a set or predetermined alignment signal) from the power pad portion PP located in the non-display region NDA before the light emitting elements LD are aligned in the light emitting region EMA of each of the pixels PXL and may be used as an alignment electrode (or alignment line) for aligning the light emitting elements LD.

The first electrode EL1 may be connected to the first bus line CL1 during a step of aligning the light emitting elements LD to receive a first alignment signal from the first power pad PP1 and to be used as a first alignment electrode. The second electrode EL2 may be connected to the second bus line CL2 during the step of aligning the light emitting elements LD to receive a second alignment signal from the second power pad PP2 to be used as a second alignment electrode. During the above-described step of aligning the light emitting elements LD, the third electrode EL3 may be connected to the second electrode EL2 to receive the second alignment signal from the second power pad PP2 to be used as the second alignment electrode. The fourth electrode EL4 may be connected to the third bus line CL3 during a step of aligning the light emitting elements LD to receive a third alignment signal from the third power pad PP3 to be used as a third alignment electrode. The above-described first to third alignment signals may be signals having a voltage difference and/or a phase difference so that the light emitting elements LD may be aligned between the first to fourth electrodes EL1 to EL4. At least one of the first to third alignment signals may be an AC signal, but the present disclosure is not limited thereto.

In some embodiments, each of the pixels PXL may include a support member (or pattern) for supporting each of the first to fourth electrodes EL1 to EL4 to change a surface profile (or shape) of each of the first to fourth electrodes EL1 to EL4 so that the light emitted from the light emitting elements LD is guided in an image display direction (or front direction) of the display device DD. The support member may include a first bank pattern BNKP1 (or first pattern) overlapping one region of the first electrode EL1, a second bank pattern BNKP2 (or second pattern) overlapping one region of the second electrode EL2, a third bank pattern BNKP3 (or third pattern) overlapping one region of the third electrode EL3, and a fourth bank pattern BNKP4 (or fourth pattern) overlapping one region of the fourth electrode EL4.

The first bank pattern BNKP1, the second bank pattern BNKP2, the third bank pattern BNKP3, and the fourth bank pattern BNKP4 may be spaced from each other along the first direction DR1 in the pixel region PXA (or light emitting region EMA) of each of the pixels PXL, and one region of each of the first electrode EL1 the second electrode EL2, the third electrode EL3, and the fourth electrode EL4 may protrude in an upper direction.

Each of the pixels PXL may include a plurality of light emitting elements LD. The light emitting elements LD may include the first light emitting elements LD1 and the second light emitting element LD2. In some embodiments, each of the pixels PXL may also further include the reverse light emitting element LDr described with reference to FIG. 4.

At least two to tens of the light emitting elements LD may be aligned and/or provided in the pixel region PXA of each of the pixels PXL, but the number of light emitting elements LD is not limited thereto. In some embodiments, the number of light emitting elements LD arranged and/or provided in the pixel region PXA may be variously changed.

The light emitting elements LD may be arranged between two adjacent electrodes from among the first to fourth electrodes EL1 to EL4.

The first light emitting elements LD1 may be arranged and/or aligned between the first electrode EL1 and the second electrode EL2. The first end portion EP1 (or one end portion) of each of the first light emitting elements LD1 may face the first electrode EL1 and the second end portion EP2 (or the other end portion) of each of the first light emitting element LD1 may face the second electrode EL2. When there are a plurality of first light emitting elements LD1, the plurality of first light emitting elements LD1 are connected in parallel between the first electrode EL1 and the second electrode EL2 and may constitute the first series stage SET1 described with reference to FIG. 4 together with the two electrodes EL1 and EL2.

The second light emitting elements LD2 may be arranged and/or aligned between the third electrode EL3 and the fourth electrode EL4. The first end portion EP1 (or one end portion) of each of the second light emitting elements LD2 may face the fourth electrode EL4, and the second end portion EP2 (or the other end portion) of each of the second light emitting elements LD2 may face the third electrode EL3. When there are a plurality of second light emitting elements LD2, the plurality of second light emitting elements LD2 may be connected in parallel between the third electrode EL3 and the fourth electrode EL4 and may constitute the second series stage SET2 described with reference to FIG. 4 together with the third and fourth electrodes EL3 and EL4.

In one embodiment, the first end portion EP1 of each of the first light emitting elements LD1 and the first end portion EP1 of each of the second light emitting elements LD2 may include semiconductor layers (for example, the second semiconductor layer 13 described above with reference to FIG. 1) of the same type. The second end portion EP2 of each the first light emitting elements LD1 and the second end portion EP2 of each of the second light emitting elements LD2 may include semiconductor layers (for example, the first semiconductor layer 11 described above with reference to FIG. 1) of the same type.

Each of the light emitting elements LD may be a light emitting diode of a subminiature size such as a size as small as nanoscale to microscale, and may include a material having an inorganic crystal structure. For example, each of the light emitting elements LD may be the light emitting element LD described with reference to FIGS. 1 and 2. Each of the light emitting elements LD may emit light of a color and/or white light.

The light emitting elements LD may be prepared in a form scattered in a solution (or ink) and may be introduced (or supplied) to the light emitting region EMA of each of the pixels PXL. The light emitting elements LD may be introduced (or supplied) to the light emitting region EMA of each of the pixels PXL through an inkjet printing method, a slit coating method, or various other methods. For example, the light emitting elements LD may be mixed with a volatile solvent and introduced (or supplied) to the light emitting region EMA through an inkjet printing method or a slit coating method. In this case, when an alignment signal corresponding to each of the first to fourth electrodes EL1 to EL4 is applied, an electric field may be formed between two adjacent electrodes from among the first to fourth electrodes EL1 to EL4. Accordingly, the light emitting elements LD may be aligned between two adjacent electrodes from among the first to fourth electrodes EL1 to EL4. As described above, the same alignment signal is applied to the second and third electrodes EL2 and EL3, and thereby, the light emitting elements LD may not be aligned between the second electrode EL2 and the third electrode EL3. However, the present disclosure is not limited thereto. In some embodiments, when the alignment signal is applied to the second and third electrodes EL2 and EL3, a potential difference may occur between the alignment signals applied to the second electrode EL2 and the third electrode EL3 due to line resistances of the second and third electrodes EL2 and EL3, influence of an electric field induced between adjacent electrodes, and so on. In this case, the light emitting elements LD may also be aligned between the second and third electrodes EL2 and EL3. The light emitting elements LD may be stably aligned between the first to fourth electrodes EL1 to EL4 by volatilizing the solvent or removing the solvent by using other methods after the light emitting elements LD are aligned.

In some embodiments, each of the pixels PXL may include a first contact electrode (or a first connection electrode) CNE1, a second contact electrode (or a second connection electrode) CNE2, and an intermediate electrode CTE.

The first contact electrode CNE1, the second contact electrode CNE2, and the intermediate electrode CTE may electrically and more stably connect the first to fourth electrodes EL1 to EL4 to the light emitting elements LD.

The first contact electrode CNE1 may be formed on the first end portion EP1 of each of the first light emitting elements LD1 and on at least one region of the first electrode EL1 corresponding thereto and may physically and/or electrically connect the first end portion EP1 to the first electrode EL1.

When viewed in a plane, the first contact electrode CNE1 may have a bar shape extending in the second direction DR2, but the present disclosure is not limited thereto. In some embodiments, the shape of the first contact electrode CNE1 may be variously changed within a range in which the first contact electrode CNE1 is electrically and stably connected to the first end portion EP1 of each of the first light emitting elements LD1. In addition, the shape of the first contact electrode CNE1 may be variously changed in consideration of a connection relationship with the first electrode EL1 arranged under the first contact electrode CNE1.

The second contact electrode CNE2 may be formed on the second end portion EP2 of each of the second light emitting elements LD2 and on at least one region of the third electrode EL3 corresponding thereto and may physically and/or electrically connect the second end portion EP2 of each of the second light emitting elements LD2 to the third electrode EL3.

When viewed in a plane, the second contact electrode CNE2 may have a bar shape extending in the second direction DR2, but the present disclosure is not limited thereto. In some embodiments, the shape of the second contact electrode CNE2 may be variously changed within a range in which the second contact electrode CNE2 is electrically and stably connected to the second end portion EP2 of each of the second light emitting elements LD2. In addition, the shape of the second contact electrode CNE2 may be variously changed in consideration of a connection relationship with the third electrode EL3 arranged under the second contact electrode CNE2.

The intermediate electrode CTE may include a first intermediate electrode CTE1 and a second intermediate electrode CTE2 extending in the second direction DR2.

The first intermediate electrode CTE1 may be provided and/or formed on the second end portion EP2 of each of the first light emitting elements LD1 and on at least one region of the second electrode EL2 corresponding thereto. The first intermediate electrode CTE1 may physically and/or electrically connect the second end portion EP2 of each of the first light emitting elements LD1 to the second electrode EL2. In one embodiment, when viewed in a plane, the first intermediate electrode CTE1 may be provided in a shape extending in the second direction DR2 between the first contact electrode CNE1 and the second contact electrode CNE2.

The second intermediate electrode CTE2 may be provided and/or formed on the first end portion EP1 of each of the second light emitting elements LD2 and on at least one region of the fourth electrode EL4 corresponding thereto. The second intermediate electrode CTE2 may physically and/or electrically connect the first end portion EP1 of each of the second light emitting elements LD2 to the fourth electrode EL4. In one embodiment, when viewed in a plane, the second intermediate electrode CTE2 may be provided in a shape extending in the second direction DR2 between the second contact electrode CNE2 and the bank BNK located in a peripheral region.

The first intermediate electrode CTE1 and the second intermediate electrode CTE2 may be provided integrally and may be connected to each other. The first intermediate electrode CTE1 and the second intermediate electrode CTE2 may be different regions of the intermediate electrode CTE. The first intermediate electrode CTE1 may have the same configuration as the first intermediate electrode CTE1 described with reference to FIG. 4, and the second intermediate electrode CTE2 may have the same configuration as the second intermediate electrode CTE2 described with reference to FIG. 4. The intermediate electrode CTE may be a bridge electrode (or a connection electrode) that electrically connects the second end portion EP2 of each of the first light emitting elements LD1 to the first end portion EP1 of each of the second light emitting elements LD2. That is, the intermediate electrode CTE may be a bridge electrode or a connection electrode that connects the first series stage SET1 to the second series stage SET2.

The intermediate electrode CTE including the first intermediate electrode CTE1 and the second intermediate electrode CTE2 may be spaced from the second contact electrode CNE2 when viewed in a plane and may have a closed loop shape surrounding (or around) a periphery (or circumference) of the second contact electrode CNE2, but the present disclosure is not limited thereto. In some embodiments, the intermediate electrode CTE may be changed into various shapes within a range in which the consecutive first and second series stages SET1 and SET2 are stably connected to each other. For example, the intermediate electrode CTE may also have a shape surrounding (or around) the other region of the second contact electrode CNE2 except for at least one region, for example, an open loop shape having an open region without forming a complete closed loop shape.

The first contact electrode CNE1, the second contact electrode CNE2, and the intermediate electrode CTE may be spaced from each other when viewed in a plane.

Hereinafter, description will be made with reference to FIG. 6 by focusing on a stack structure of each of the pixels PXL according to the above-described embodiment.

Figure 6:
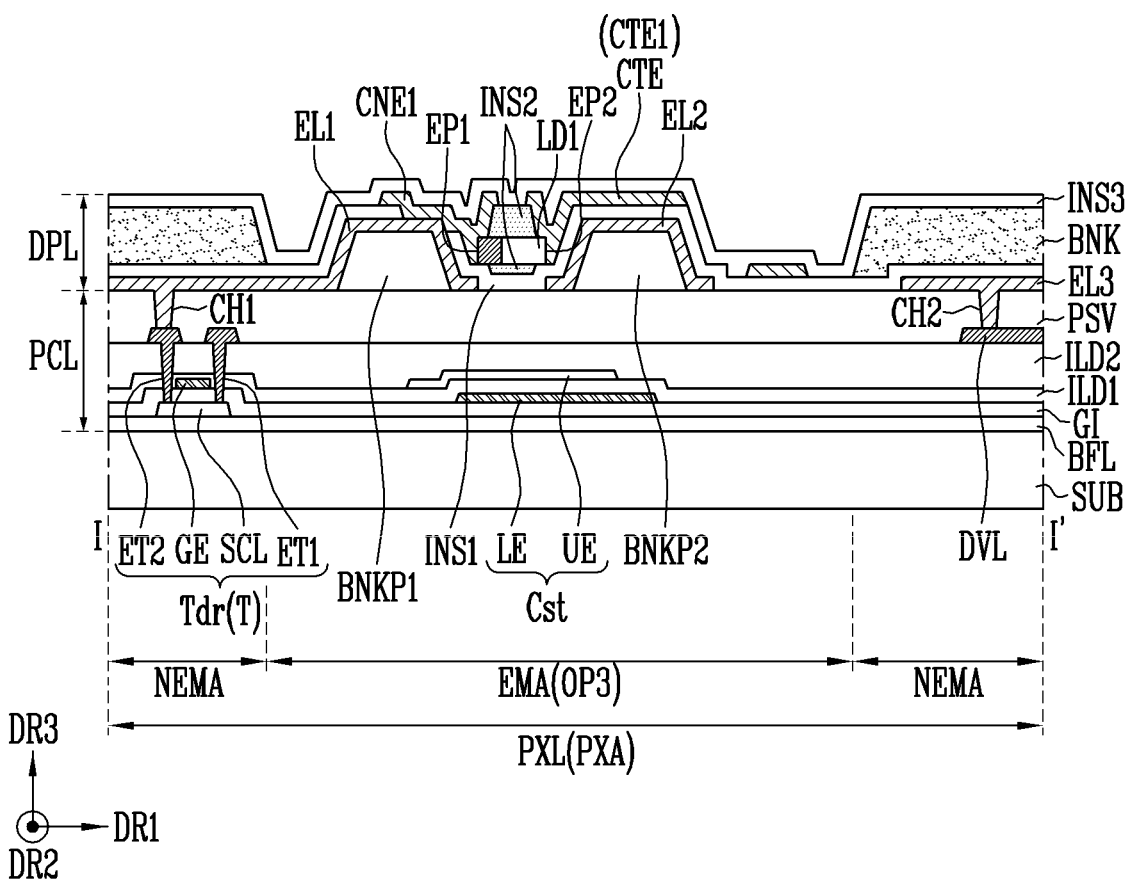
FIG. 6 is a cross-sectional view taken along the line I-I' of FIG. 5.

FIG. 6 is a cross-sectional view taken along the line I-I' of FIG. 5.

FIG. 6 simply illustrates one pixel PXL, such as illustrating each electrode as a single-film electrode and illustrating each insulating layer as a single-film insulating layer, but the present disclosure is not limited thereto.

Referring to FIGS. 3, 5, and 6, the pixel PXL may include the substrate SUB, a pixel circuit layer PCL, and a display element layer DPL.

The substrate SUB may include a transparent insulating material so that light passes therethrough. The substrate SUB may be a rigid substrate or a flexible substrate.

The rigid substrate may be one of, for example, an organic substrate, a quartz substrate, a glass ceramic substrate, and a crystalline glass substrate.

The flexible substrate may be one of a film substrate including a polymer organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

A plurality of insulating layers and a plurality of conductive layers may be arranged on the substrate SUB. The insulating layers may include, for example, a buffer layer BFL, a gate insulating layer GI, first and second interlayer insulating layers ILD1 and ILD2, a passivation layer PSV, and first to third insulating layers INS1 to INS3 sequentially disposed (or provided) on the substrate SUB. The conductive layers may include, for example, a first conductive layer provided on the gate insulating layer GI, a second conductive layer provided on the first interlayer insulating layer ILD1, a third conductive layer provided on the second interlayer insulating layer ILD2, a fourth conductive layer provided on the passivation layer PSV, and a fifth conductive layer provided on the first and second insulating layers INS1 and INS2. However, the insulating layers and conductive layers provided on the substrate SUB are not limited to the above-described embodiments, and in some embodiments, other insulating layers and other conductive layers in addition to the above-described insulating layers and conductive layers may also be formed on the substrate SUB.

The pixel circuit layer PCL may include the buffer layer BFL, at least one transistor T, at least one storage capacitor Cst, and the passivation layer PSV.

The buffer layer BFL may prevent impurities from diffusing into the transistor T included in the pixel circuit (refer to "PXC" in FIG. 4). The buffer layer BFL may be an inorganic insulating film including an inorganic material. The buffer layer BFL may include at least one of metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single film but may also be provided as multiple films of at least double films. When the buffer layer BFL is provided as multiple films, each of the multiple films may be formed of the same material or different materials. The buffer layer BFL may also be omitted depending on materials and process conditions of the substrate SUB.

The transistor T may include a driving transistor Tdr that controls drive currents of the light emitting elements LD. However, the present disclosure is not limited thereto, and the pixel circuit PXC may further include circuit elements that perform other functions in addition to the driving transistor Tdr. The driving transistor Tdr may be the first transistor T1 described with reference to FIG. 4.

The driving transistor Tdr may include a semiconductor pattern SCL, a gate electrode GE, a first terminal ET1, and a second terminal ET2. The first terminal ET1 may be any one of a source electrode and a drain electrode, and the second terminal ET2 may be the other electrode. For example, the first terminal ET1 may be a source electrode, and the second terminal ET2 may be a drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap the gate electrode GE of the drive transistor Tdr in the third direction DR3. The semiconductor pattern SCL may be a semiconductor pattern formed of poly silicon, amorphous silicon, an oxide semiconductor, or so on. The channel region may be, for example, a semiconductor pattern undoped with impurities and may be an intrinsic semiconductor. The first and second contact regions may be semiconductor patterns doped with impurities. The gate insulating layer GI may be provided on the buffer layer BFL and the semiconductor pattern SCL.

The gate electrode GE may be provided and/or formed on the gate insulating layer GI to correspond to the channel region of the semiconductor pattern SCL. The gate electrode GE may be provided on the gate insulating layer GI to overlap the channel region of the semiconductor pattern SCL in the third direction DR3. The gate electrode GE may be constituted by a single film formed of a single material selected from a group consisting of copper (Cu), molybdenum (Mo), tungsten (W), aluminum neodymium (AlNd), titanium (Ti), aluminum (Al), silver (Ag), and an alloy thereof or formed of a mixture thereof, or may be formed in a double-layer structure or a multilayer structure of low-resistance materials such as molybdenum (Mo), titanium (Ti), copper (Cu), aluminum (Al), and silver (Ag) to reduce line resistance. In one embodiment, the gate electrode GE may be a first conductive layer.

The gate insulating layer GI may be an inorganic insulating film including an inorganic material. For example, the gate insulating layer GI may include at least one of metal oxides such as silicon nitride (SiNx), silicon oxide (SiOx), silicon oxynitride (SiOxNy), and aluminum oxide (AlOx). However, the materials of the gate insulating layer GI are not limited to the above-described embodiments. In some embodiments, the gate insulating layer GI may also be formed of an organic insulating film including an organic material. The gate insulating layer GI may be provided as a single film but may also be provided as multiple films of at least double films.

The first interlayer insulating layer ILD1 may be provided on the gate insulating layer GI and the second interlayer insulating layer ILD2 may be provided on the first interlayer insulating layer ILD1. Each of the first terminal ET1 and the second terminal ET2 may be provided and/or formed on the second interlayer insulating layer ILD2 and may be in contact with a first contact region and a second contact region of the semiconductor pattern SCL through respective contact holes sequentially penetrating the gate insulating layer GI and the first and second interlayer insulating layers ILD1 and ILD2. For example, the first terminal ET1 may be in contact with the first contact region of the semiconductor pattern SCL, and the second terminal ET2 may be in contact with the second contact region of the semiconductor pattern SCL. Each of the first and second terminals ET1 and ET2 may include the same material as the gate electrode GE or may include one or more materials selected from materials discussed as constituent materials of the gate electrode GE. In one embodiment, the first and second terminals ET1 and ET2 may be a third conductive layer.

The first interlayer insulating layer ILD1 may include the same material as the gate insulating layer GI or may include at least one material selected from materials discussed as constituent materials of the gate insulating layer GI. The first interlayer insulating layer ILD1 may be disposed on the gate insulating layer and the gate electrode GE.

The second interlayer insulating layer ILD2 may be provided and/or formed on the first interlayer insulating layer ILD1. The second interlayer insulating layer ILD2 may be an inorganic insulating film including an inorganic material or an organic insulating film including an organic material. In some embodiments, the second interlayer insulating layer ILD2 may include the same material as the first interlayer insulating layer ILD1, but the present disclosure is not limited thereto. The second interlayer insulating layer ILD2 may be provided as a single film but may also be provided as multiple films of at least double films.

In the above-described embodiment, a case is described in which the first and second terminals ET1 and ET2 of the driving transistor Tdr are different electrodes electrically connected to the semiconductor pattern SCL through the respective contact holes sequentially penetrating the gate insulating layer GI and the first and second interlayer insulating layers ILD1 and ILD2, but the present disclosure is not limited thereto. In some embodiments, the first terminal ET1 of the driving transistor Tdr may be a first contact region adjacent to a channel region of the corresponding semiconductor pattern SCL, and the second terminal ET2 of the driving transistor Tdr may be a second contact region adjacent to a channel region of the corresponding semiconductor pattern SCL. In this case, the second terminal ET2 of the driving transistor Tdr may be electrically connected to the light emitting elements LD of the corresponding pixel PXL through another connection member such as a bridge electrode.

In one embodiment of the present disclosure, the driving transistor Tdr may be constituted by a low-temperature polysilicon thin film transistor, but the present disclosure is not limited thereto. In some embodiments, the driving transistor Tdr may also be constituted by an oxide semiconductor thin film transistor (TFT). In addition, in the above-described embodiment, a case in which the driving transistor Tdr is a thin film transistor having a top gate structure is described as an example, but the present disclosure is not limited thereto, and the structure of the driving transistor Tdr may be variously changed.

The storage capacitor Cst may include a lower electrode LE provided on the gate insulating layer GI and an upper electrode UE provided on the first interlayer insulating layer ILD1 and overlapping the lower electrode LE in the third direction DR3.

The lower electrode LE may be provided on the same layer as the gate electrode GE of the driving transistor Tdr and may include the same material as the gate electrode GE. The lower electrode LE may be provided integrally with the gate electrode GE of the driving transistor Tdr. In this case, the lower electrode LE may be regarded as one region of the gate electrode GE of the driving transistor Tdr. In one embodiment, the lower electrode LE may be a first conductive layer. In some embodiments, the lower electrode LE may also be constituted differently (or non-integrally) from the gate electrode GE of the driving transistor Tdr. In this case, the lower electrode LE may be electrically connected to the gate electrode GE of the driving transistor Tdr through another connection member.

The upper electrode UE may overlap the lower electrode LE in the third direction DR3 and may cover the lower electrode LE. Capacitance of the storage capacitor Cst may be increased by increasing an overlapping area of the upper electrode UE and the lower electrode LE. The upper electrode UE may be electrically connected to the first power line PL1. The storage capacitor Cst may be covered by the second interlayer insulating layer ILD2. In one embodiment, the upper electrode UE may be a second conductive layer.

The pixel circuit layer PCL may include a drive voltage line DVL provided and/or formed on the second interlayer insulating layer ILD2. The drive voltage line DVL may have the same configuration as the second power line PL2 described with reference to FIGS. 3 and 4. Accordingly, the second drive power supply voltage VSS may be applied to the drive voltage line DVL. In one embodiment, the drive voltage line DVL may be a third conductive layer. The pixel circuit layer PCL may further include the first power line PL1 connected to the first drive power supply voltage VDD. Although not illustrated directly in the drawings, the first power line PL1 may be provided on the same layer as the drive voltage line DVL or on a layer different from the drive voltage line DVL. Although the above-described embodiment describes that the drive voltage line DVL is provided on the same layer as the first and second terminals ET1 and ET2 of the transistors T, the present disclosure is not limited thereto. In some embodiments, the drive voltage line DVL may also be provided at the same layer as any one of the conductive layers provided in the pixel circuit layer PCL. That is, the position of the drive voltage line DVL may be variously changed in the pixel circuit layer PCL.

Each of the first power line PL1 and the drive voltage line DVL may be constituted by a single film formed of a single material selected from a group consisting of copper (Cu), molybdenum (Mo), tungsten (W), aluminum neodymium (AlNd), titanium (Ti), aluminum (Al), silver (Ag), and an alloy thereof or formed of a mixture thereof, or may be formed in a double-layer structure or a multilayer structure of low-resistance materials such as molybdenum (Mo), titanium (Ti), copper (Cu), aluminum (Al), and silver (Ag) to reduce line resistance. For example, each of the first power line PL1 and the drive voltage line DVL may be constituted by double films in which titanium (Ti) and copper (Cu) are sequentially stacked.

The first power line PL1 may be electrically connected to a component of the display element layer DPL, for example, the first electrode EL1, and the drive voltage line DVL may be electrically connected to another component of the display element layer DPL, for example, the third electrode EL3.

The passivation layer PSV may be provided and/or formed on the transistors T and the drive voltage line DVL.

The passivation layer PSV may be provided in a form including an organic insulating film, an inorganic insulating film, or an organic insulating film arranged on the inorganic insulating film. The inorganic insulating film may include at least one of metal oxides such as silicon oxide ($SiO_x$), silicon nitride ($SiN_x$), silicon oxynitride ($SiO_xN_y$), and aluminum oxide ($AlO_x$). The organic insulating film may include at least one of, for example, acrylic resin, epoxy resin, phenolic resin, polyamides resin, polyimide resin, unsaturated polyester resin, poly-phenylene ethers resin, polyphenylene sulfides resin, and benzocyclobutene resin.

The passivation layer PSV may include a first contact hole CH1 exposing the second terminal ET2 of the driving transistor Tdr and a second contact hole CH2 exposing the drive voltage line DVL.

The display element layer DPL may be provided on the passivation layer PSV.

The display element layer DPL may include the first to fourth bank patterns BNKP1 to BNKP4, the bank BNK, the first to fourth electrodes EL1 and EL4, the light emitting elements LD, the first and second contact electrodes CNE1 and CNE2, the intermediate electrode CTE, and first to third insulating layers INS1 to INS3.

The first to fourth bank patterns BNKP1 to BNKP4 may be provided and/or formed on the passivation layer PSV. The first to fourth bank patterns BNKP1 to BNKP4 may be arranged to be spaced from each other in the pixel region PXA (or the light emitting region EMA) of each of the pixels PXL. The first to fourth bank patterns BNKP1 to BNKP4 may protrude in the third direction DR3 on the pixel circuit layer PCL. The first to fourth bank patterns BNKP1 to BNKP4 may have substantially the same height, but the present disclosure is not limited thereto. In some embodiments, the first to fourth bank patterns BNKP1 to BNKP4 may also have different heights.

The first bank pattern BNKP1 may be provided and/or formed between the passivation layer PSV and the first electrode EL1, and the second bank pattern BNKP2 may be provided and/or formed between the passivation layer PSV and the second electrode EL2, the third bank pattern BNKP3 may be provided and/or formed between the passivation layer PSV and the third electrode EL3, and the fourth bank pattern BNKP4 may be provided and/or formed between the passivation layer PSV and the fourth electrode EL4.

The first to fourth bank patterns BNKP1 to BNKP4 may each be an inorganic insulating film including an inorganic material or an organic insulating film including an organic material. In some embodiments, the first to fourth bank patterns BNKP1 to BNKP4 may each include an organic insulating film of a single film and/or an inorganic insulating film of a single film, but the present disclosure is not limited thereto. In some embodiments, the first to fourth bank patterns BNKP1 to BNKP4 may each also be provided in the form of multiple films in which at least one organic insulating film and at least one inorganic insulating film are stacked. However, the materials of the first to fourth bank patterns BNKP1 to BNKP4 are not limited to the above-described embodiment, and in some embodiments, the first to fourth bank patterns BNKP1 to BNKP4 may each also include a conductive material (or material). In some embodiments, at least one of the first to fourth bank patterns BNKP1 to BNKP4 may be omitted or positions thereof may also be changed.

In one embodiment, the first to fourth bank patterns BNKP1 to BNKP4 may each function (or be utilized) as a reflective member. For example, the first to fourth bank patterns BNKP1 to BNKP4 may each function (or be utilized) as a reflective member that directs light emitted from the light emitting elements LD in a desirable direction together with the first to fourth electrodes EL1 to EL4 provided thereon to increase light emission efficiency of each of the pixels PXL.

The first to fourth electrodes EL1 to EL4 may be arranged on the first to fourth bank patterns BNKP1 to BNKP4, respectively. The first to fourth electrodes EL1 to EL4 may be arranged to be spaced from each other in the pixel region PXA (or the light emitting region EMA) of each of the pixels PXL. In one embodiment, the first to fourth electrodes EL1 to EL4 may be a fourth conductive layer.

In some embodiments, the first to fourth electrodes EL1 to EL4, and so on arranged on the first to fourth bank patterns BNKP1 to BNKP4 respectively may each have a shape corresponding to the shape of each of the first to fourth bank patterns BNKP1 to BNKP4. For example, the first to fourth electrodes EL1 to EL4 may protrude in the third direction DR3 while each having an inclined or curved surface corresponding to the first to fourth bank patterns BNKP1 to BNKP4.

Each of the first to fourth electrodes EL1 to EL4 may be formed of a material with a constant reflectance in order to propagate the light emitted from each of the light emitting elements LD in an image display direction (or front direction) of the display device DD. Each of the first to fourth electrodes EL1 to EL4 may be formed of a conductive material (or substance) with a constant reflectance. The conductive material (or substance) may include an opaque metal that is desirable for reflecting light emitted from the light emitting elements LD in the image display direction of the display device DD. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. In some embodiments, each of the first to fourth electrodes EL1 to EL4 may include a transparent conductive material (or substance). The transparent conductive material (or substance) may include a conductive oxide such as indium tin oxide (ITO), indium tin zinc oxide (ITZO), zinc oxide (ZnO), indium gallium zinc oxide (IGZO), or indium tin zinc oxide (ITZO), a conductive polymer such as poly(3,4-ethylenedioxythiophene) (PEDOT), or so on. When the first to fourth electrodes EL1 to EL4 each include a transparent conductive material (or substance), another conductive layer formed of an opaque metal may also be added to reflect light emitted from the light emitting elements LD in the image display direction of the display device DD. However, the materials of the first to fourth electrodes EL1 to EL4 are not limited to the above-described materials.

In addition, each of the first to fourth electrodes EL1 to EL4 may be provided and/or formed as a single film, but the present disclosure is not limited thereto. In some embodiments, each of the first to fourth electrodes EL1 to EL4 may also be provided and/or formed as multiple films in which at least two of metals, alloys, conductive oxides, and conductive polymers are stacked. Each of the first to fourth electrodes EL1 to EL4 may also be constituted by multiple films of at least double films to reduce or minimize distortion due to signal delay when transmitting a signal (or voltage) to both end portions EP1 and EP2 of each of the light emitting elements LD.

The first electrode EL1 may be electrically connected to the driving transistor Tdr of the pixel circuit layer PCL through the first contact hole CH1 of the passivation layer PSV, and the third electrode EL3 may be electrically connected to the drive voltage line DVL of the pixel circuit layer PCL through the second contact hole CH2 of the passivation layer PSV. The first to fourth electrodes EL1 to EL4 may be used as alignment electrodes for aligning the light emitting elements LD. In addition, the first and third electrodes EL1 and EL3 from among the first to fourth electrodes EL1 to EL4 may be used as drive electrodes for driving the light emitting elements LD.

The first insulating layer INS1 may be provided and/or formed on the first to fourth electrodes EL1 to EL4. For example, the first insulating layer INS1 may be formed to cover one region of the first to fourth electrodes EL1 to EL4 and may include an opening exposing another region of the first to fourth electrodes EL1 to EL4.

The first insulating layer INS1 may include an inorganic insulating film formed of an inorganic material or an organic insulating film formed of an organic material. The first insulating layer INS1 may be formed of an inorganic insulating film that is suitable for protecting the light emitting elements LD from the pixel circuit layer PCL. For example, the first insulating layer INS1 may include at least one of metal oxides such as silicon nitride (SiNx), silicon oxide (SiOx), silicon oxynitride (SiOxNy), and aluminum oxide (AlOx), but the present disclosure is not limited thereto. In some embodiments, the first insulating layer INS1 may also be formed of an organic insulating film that is suitable for flattening support surfaces of the light emitting elements LD. The first insulating layer INS1 may be provided as a single film or multiple films.

The first insulating layer INS1 may be provided and/or formed on the passivation layer PSV to entirely cover the first to fourth electrodes EL1 to EL4. After the light emitting elements LD are supplied (or introduced) and aligned on the first insulating layer INS1, the first insulating layer INS1 may be partially opened to expose one region of each of the first and third electrodes EL1 and EL3. After the light emitting elements LD are supplied (or introduced) and aligned, the first insulating layer INS1 may also be patterned in the form of individual patterns that are locally arranged under the light emitting elements LD. The first insulating layer INS1 may cover regions other than the one region of each of the first and third electrodes EL1 and EL3. In some embodiments, the first insulating layer INS1 may also be omitted. In addition, in another embodiment, the first insulating layer INS1 may be partially opened to expose one region of each of the first to fourth electrodes EL1 to EL4.

The bank BNK may be provided and/or formed on the first insulating layer INS1.

The light emitting elements LD may be supplied (or introduced) and aligned in the light emitting region EMA of each of the pixels PXL in which the bank BNK is formed. For example, when the light emitting elements LD are supplied (or introduced) to the light emitting region EMA through an inkjet printing method or so on, the light emitting elements LD may be aligned between the first to fourth electrodes EL1 to EL4 by an alignment signal (e.g., a set or predetermined alignment signal) applied to each of the first to fourth electrodes EL1 to EL4. For example, at least one first light emitting element LD1 may be aligned between the first electrode EL1 and the second electrode EL2, and at least one second light emitting element LD2 may be aligned between the third electrode EL3 and the fourth electrode EL4.

The second insulating layer INS2 may be provided and/or formed on each of the light emitting elements LD. The second insulating layer INS2 may be provided and/or formed on each of the light emitting elements LD to partially cover an outer surface (e.g., an outer circumferential surface or an outer peripheral surface (or surface)) of each of the light emitting elements LD and to expose the first end portion EP1 and the second end portion EP2 of each of the light emitting elements LD.

The second insulating layer INS2 may be formed as a single film or multiple films and may include an inorganic insulating film including at least one inorganic material or an organic insulating film including at least one organic material. The second insulating layer INS2 may include an inorganic insulating film that is suitable for protecting an active layer (refer to "12" of FIG. 1) of each of the light emitting elements LD from external oxygen and moisture. However, the present disclosure is not limited thereto, and the second insulating layer INS2 may also be formed of an organic insulating film including an organic material depending on design conditions of the display device DD to which the light emitting elements LD are applied. After the alignment of the light emitting elements LD in the pixel region PXA (or light emitting region EMA) of each of the pixels PXL is completed, the second insulating layer INS2 is formed on each of the light emitting elements LD, and thus, the light emitting elements LD may be prevented from being separated from the aligned positions.

When there is an empty gap (or space) between the first insulating layer INS1 and the light emitting elements LD before the formation of the second insulating layer INS2, the empty gap may be filled with the second insulating layer INS2 during a process of forming the second insulating layer INS2. In this case, the second insulating layer INS2 may also be formed of an organic insulating film which is suitable for filling the empty gap between the first insulating layer INS1 and the light emitting elements LD.

The first contact electrode CNE1 may be provided and/or formed on the first electrode EL1 and the first end portion EP1 of the first light emitting element LD1. The first contact electrode CNE1 may electrically connect the first electrode EL1 to the first end portion EP1 of the first light emitting element LD1.

The second contact electrode CNE2 may be arranged on the third electrode EL3 and the second end portion EP2 of the second light emitting element LD2. The second contact electrode CNE2 may electrically connect the third electrode EL3 to the second end portion EP2 of the second light emitting element LD2.

The first and second contact electrodes CNE1 and CNE2 may be formed of various transparent conductive materials so that the light emitted from the light emitting elements LD and reflected by the first to fourth electrodes EL1 to EL4 travels in the image display direction of the display device DD without loss. For example, the first and second contact electrodes CNE1 and CNE2 may include at least one of various transparent materials (substances) including indium tin oxide (ITO), indium zinc oxide (IZO), zinc oxide (ZnO), indium gallium zinc oxide (IGZO), and indium tin zinc oxide (ITZO) and may be substantially transparent or translucent to satisfy a desirable light-transmittance (e.g., a set or predetermined light-transmittance) (or penetrance). However, the materials of the first and second contact electrodes CNE1 and CNE2 are not limited to the above-described embodiment. In some embodiments, the first and second contact electrodes CNE1 and CNE2 may also be formed of various opaque conductive materials (or substances). The first and second contact electrodes CNE1 and CNE2 may each also be formed as a single film or multiple films. In one embodiment, the first and second contact electrodes CNE1 and CNE2 may be a fifth conductive layer.

In one embodiment, the first contact electrode CNE1 and the second contact electrode CNE2 may be provided at the same layer. In this case, the first contact electrode CNE1 and the second contact electrode CNE2 may be formed by the same process. However, the present disclosure is not limited thereto, and in some embodiments, the first contact electrode CNE1 and the second contact electrode CNE2 may also be formed by different processes and provided on different layers.

The intermediate electrode CTE may include the first intermediate electrode CTE1 and the second intermediate electrode CTE2. The first intermediate electrode CTE1 may be provided and/or formed on the second electrode EL2 and the second end portion EP2 of the first light emitting element LD1. The second intermediate electrode CTE2 may be provided and/or formed on the fourth electrode EL4 and the first end portion EP1 of the second light emitting element LD2.

The intermediate electrode CTE may be formed of various transparent conductive materials so that light emitted from the light emitting elements LD and reflected by the first to fourth electrodes EL1 to EL4 travels in the image display direction of the display device DD without loss. For example, the intermediate electrode CTE may include the same material as the first and second contact electrodes CNE1 and CNE2 or may include one or more materials selected from materials discussed as constituent materials of the first and second contact electrodes CNE1 and CNE2.

The intermediate electrode CTE may be provided on the same layer as the first and second contact electrodes CNE1 and CNE2 and formed through the same process. For example, the intermediate electrode CTE and the first and second contact electrodes CNE1 and CNE2 may be provided and/or formed on the second insulating layer INS2. In this case, the intermediate electrode CTE may be a fifth conductive layer. However, the present disclosure is not limited thereto, and the intermediate electrode CTE may also be provided on a layer different from the layer of the first and second contact electrodes CNE1 and CNE2 and may be formed through a process different the process of forming the first and second contact electrodes CNE1 and CNE2.

The third insulating layer INS3 may be provided and/or formed on the first contact electrode CNE1, the second contact electrode CNE2, and the intermediate electrode CTE. The third insulating layer INS3 may be an inorganic insulating film including an inorganic material or an organic insulating film including an organic material. For example, the third insulating layer INS3 may have a structure in which at least one inorganic insulating film and at least one organic insulating film is alternately stacked. The third insulating layer INS3 may entirely cover the display element layer DPL to block moisture or humidity from flowing into the display element layer DPL including the light emitting elements LD.

In one embodiment, the display element layer DPL may also be formed to selectively further include an optical layer on the third insulating layer INS3. For example, the display element layer DPL may further include a color conversion layer including color conversion particles that convert light emitted from the light emitting elements LD into light of a certain color. In addition, in another embodiment, at least one overcoat layer (for example, a layer that flattens an upper surface of the display element layer DPL) may also be further arranged on the third insulating layer INS3.

Figure 7B:
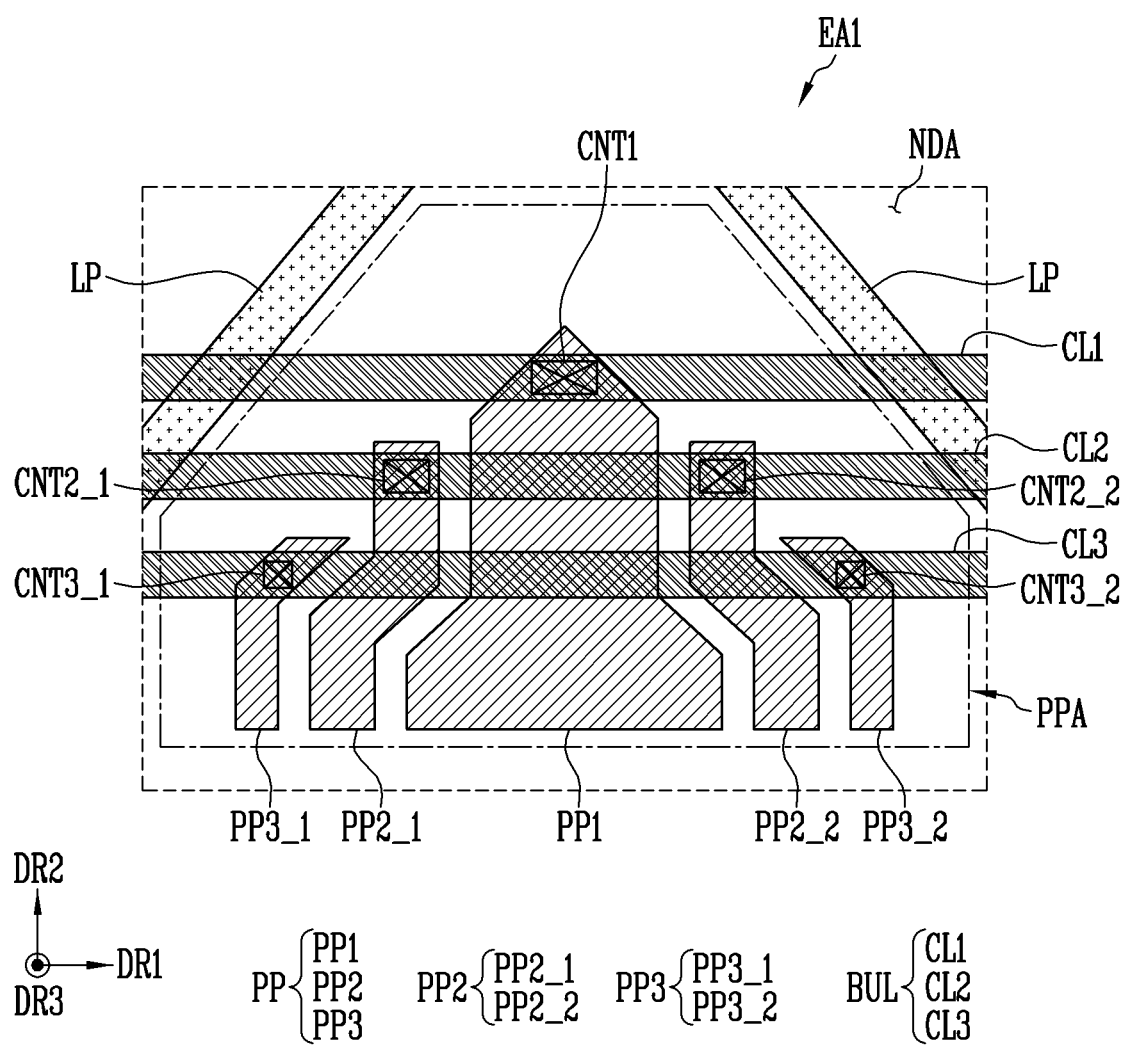
Figure 8:
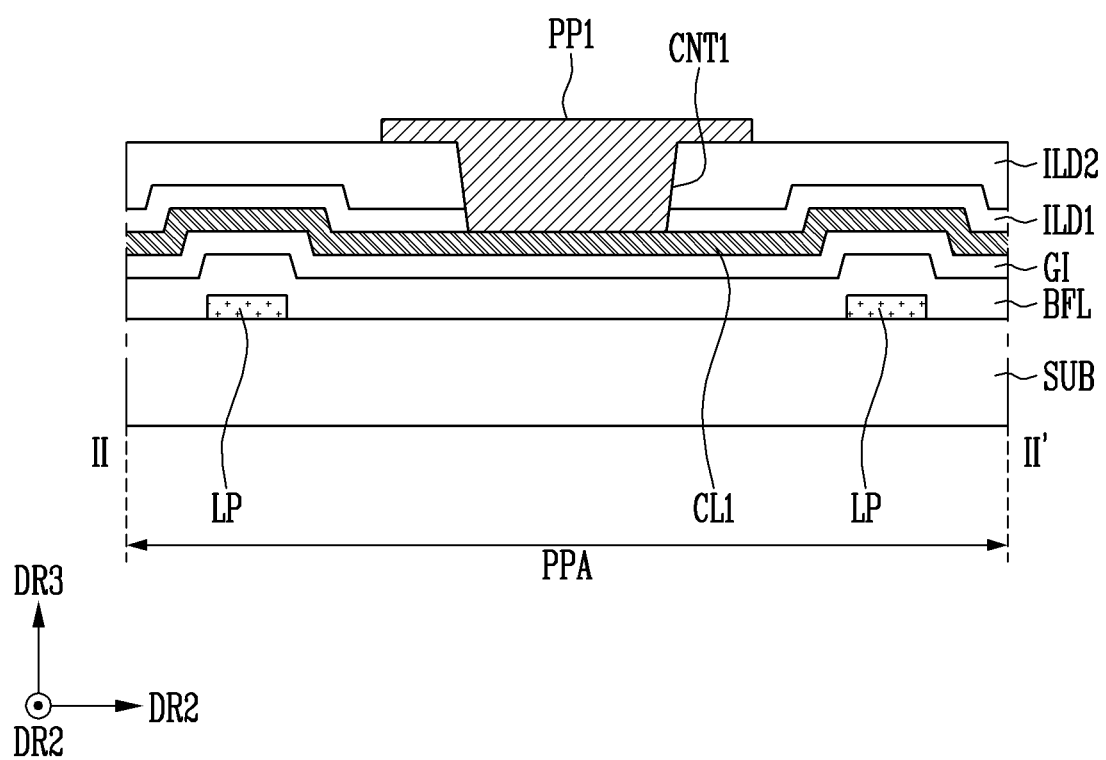
FIG. 8 is a cross-sectional view taken along the line II-II' of FIG. 7A.

FIGS. 7A and 7B are schematic enlarged views of EA1 of FIG. 3, and FIG. 8 is a cross-sectional view taken along the line II-II' of FIG. 7A.

Referring to FIGS. 3, 7A, 7B, and 8, the non-display region NDA may include the power pad region PPA in which the power pad portion PP is arranged.

In one embodiment, the power pad region PPA may be one region of the non-display region NDA between the first pad portion PD1 and the second pad portion PD2. At least one region of the bus line BUL may be located in the power pad region PPA. For example, at least one region of each of the first to third bus lines CL1 to CL3 may be located in the power pad region PPA.

The power pad portion PP may include a first power pad PP1, a second power pad PP2, and a third power pad PP3. The first power pad PP1, the second power pad PP2, and the third power pad PP3 may be formed by the same process and may include the same material and may be provided at the same layer. However, the present disclosure is not limited thereto. The second power pad PP2 may include a 2-$1^{th}$ power pad PP2_1 and a 2-$2^{th}$ power pad PP2_2. The third power pad PP3 may include a 3-$1^{th}$ power pad PP3_1 and a 3-$2^{th}$ power pad PP3_2. Here, the 3-$1^{th}$ power pad PP3_1 may be located between the first pad portion PD1 and the 2-$1^{th}$ power pad PP2_1, and the 3-$2^{th}$ power pad PP3_2 may be located between the second pad portion PD2 and the 2-$2^{th}$ power pad PP2_2.

The first power pad PP1, the second power pad PP2, and the third power pad PP3 may be designed to have sizes (or areas) different from each other. For example, the first power pad PP1 may be designed to have the largest size, and the third power pad PP3 may be designed to have the smallest size. However, the present disclosure is not limited thereto, and in some embodiments, the first power pad PP1 and the second power pad PP2 may also be designed to have the same size (or area).

The first power pad PP1, the second power pad PP2, and the third power pad PP3 may have a bar shape or a rectangular shape extending in the second direction DR2 in the power pad region PPA as illustrated in FIG. 7A, but the present disclosure is not limited thereto. In some embodiments, the first power pad PP1, the second power pad PP2, and the third power pad PP3 may also have a polygonal shape as illustrated in FIG. 7B. The shapes of the first power pad PP1, the second power pad PP2, and the third power pad PP3 may be variously changed within a range in which the first to third power pads are electrically and stably connected to corresponding bus lines and are electrically disconnected from power pads adjacent thereto.

The first to third power pads PP1 to PP3 may have substantially similar or identical structures. Accordingly, description on the second and third power pads PP2 and PP3 will be replaced with description on the first power pad PP1 with reference to FIG. 8.

The first power pad PP1 in the power pad region PPA may be entirely or partially exposed to the outside for electrical connection with an external power supply. Accordingly, the first power pad PP1 may have a stacked structure on an uppermost layer from among components in the power pad region PPA. For example, the first power pad PP1 may be a third conductive layer on a second interlayer insulating layer ILD2 of the non-display region NDA. Here, the second interlayer insulating layer ILD2 may be the second interlayer insulating layer ILD2 described with reference to FIG. 6.

When viewed in a plane, the first power pad PP1 may overlap at least one region of each of the first to third bus lines CL1 to CL3 located in the power pad region PPA. The first to third bus lines CL1 to CL3 may be formed by the same process and may include the same material and may be provided at the same layer. For example, the first to third bus lines CL1 to CL3 may be constituted by a first conductive layer on a gate insulating layer GI of the non-display region NDA. Here, the gate insulating layer GI may be the gate insulating layer GI described with reference to FIG. 6.

As illustrated in FIG. 8, the first power pad PP1 may be connected to the first bus line CL1 through the first contact unit CNT1. For example, the first power pad PP1 may be connected to the first bus line CL1 through the first contact portion CNT1 sequentially penetrating the first and second interlayer insulating layers ILD1 and ILD2. Accordingly, when the first drive power supply voltage VSS or a first alignment signal is supplied from an external power supply to the first power pad PP1, the first power pad PP1 may transmit the first drive power supply voltage VSS or the first alignment signal to the first bus line CL1.

The first power pad PP1 described above may be provided in the power pad region PPA and may not overlap the line portion LP provided in the fan-out region FTA. In this case, the line portion LP may include a plurality of lines (for example, fan-out lines) connected to the first pads P1 included in the first pad portion PD1 and the second pads P2 included in the second pad portion PD2. The line portion LP including the plurality of lines may be constituted by a bottom metal layer between the substrate SUB and the buffer layer BFL in the fan-out region FTA. Here, the substrate SUB may be the substrate SUB described with reference to FIG. 6, and the buffer layer BFL may be the buffer layer BFL described with reference to FIG. 6.

Because the line portion LP is not located under the first power pad PP1, a step difference between insulating layers located thereon, particularly, a step difference between insulating layers formed of an inorganic material may be reduced or minimized by the plurality of lines included in the line portion LP, and thus, failure due to the step difference may be prevented from occurring. For example, it is possible to prevent occurrence of a defect that the first power pad PP1 thereon is lifted due to the step difference between the insulating layers thereunder. As a result, the number of components under the power pad portion PP may be reduced or minimized by arranging the power pad portion PP and the line portion LP so as not to overlap each other by collectively arranging the power pad portion PP that applies the drive power supply voltage and/or an alignment signal to the pixels PXL only in the power pad region PPA between the first pad portion PD1 and the second pad portion PD2. Accordingly, it is possible to stably supply a drive power supply voltage and/or an alignment signal to the pixels PXL by preventing a defect such as lifting of the power pad portion PP to increase reliability the power pad portion PP.

Figure 9:
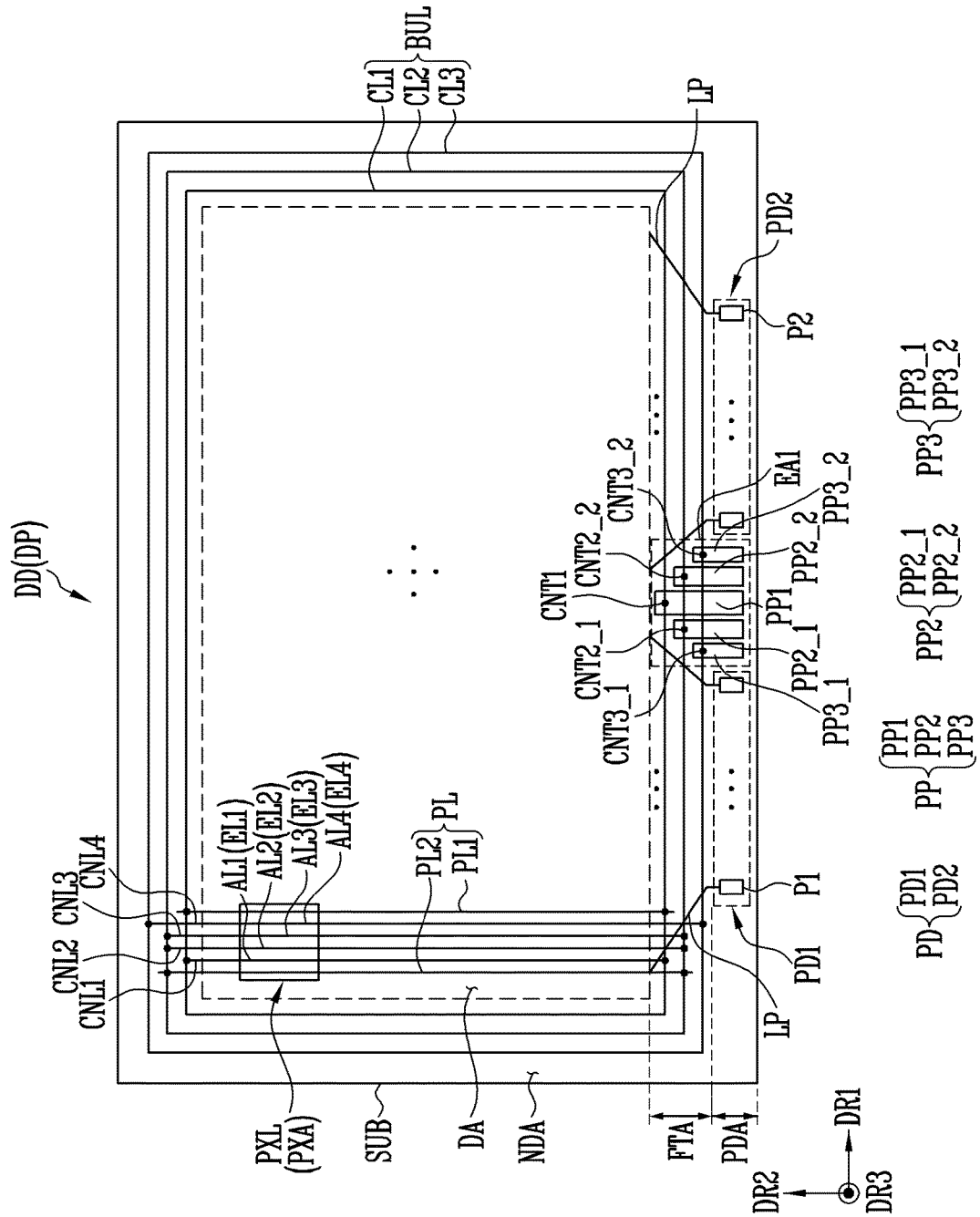
FIG. 9 is a plan view schematically illustrating some components of the display device of FIG. 3 before light emitting elements are aligned.

FIG. 9 is a plan view schematically illustrating some components of the display device DD of FIG. 3 before light emitting elements LD are aligned.

In relation to the display device DD of FIG. 9, different points from the above-described embodiment will be mainly described to avoid redundant description.

Referring to FIGS. 3-9, before the light emitting elements LD are aligned in the display device DD, each of the first to fourth electrodes EL1 to EL4 may constitute an alignment line extending in the second direction DR2 in the display region DA without being separated as a unit of the pixel PXL. For example, the first electrode EL1 may be provided as a first alignment line AL1 extending in the second direction DR2 in the display region DA without being separated as a unit of the pixel PXL. The second electrode EL2 may be provided as a second alignment line AL2 extending in the second direction DR2 without being separated as a unit of the pixel PXL. The third electrode EL3 may be provided as a third alignment line AL3 extending in the second direction DR2 in the display region DA without being separated as a unit of the pixel PXL. The third electrode EL3 may be provided as a fourth alignment line AL4 extending in the second direction DR2 without being separated as a unit of the pixel PXL.

The first alignment line AL1 may be connected to the first power pad PP1 through the first bus line CL1 and may receive a first alignment signal from the first power pad PP1. In one embodiment, the first alignment signal may be a direct current (DC) signal.

The second alignment line AL2 may be connected to the second power pad PP2 through the second bus line CL2 and may receive a second alignment signal from the second power pad PP2. In one embodiment, the second alignment signal may be an alternating current (AC) signal.

The third alignment line AL3 may be connected to the second power pad PP2 through the second bus line CL2 and may receive the second alignment signal from the second power pad PP2. In the drawing, the third alignment line AL3 is illustrated to be spaced from the second alignment line AL2, thereby being viewed as a separate configuration from the second alignment line AL2, but in reality the third alignment line AL3 may be provided integrally with the second alignment line AL2 to be regarded as one region of the second alignment line AL2.

The fourth alignment line AL4 may be connected to the third power pad PP3 through the third bus line CL3 and may receive a third alignment signal from the third power pad PP3. In one embodiment, the third alignment signal may be a DC signal.

An alignment signal may be applied to each of the first to fourth alignment lines AL1 through AL4, and thereby, an electric field may be formed between the first alignment line AL1 and the second alignment line AL2 and between the third alignment line AL3 and the fourth alignment line AL4. Accordingly, the light emitting elements LD may be aligned between the first to fourth alignment lines AL1 to AL4.

After the alignment of the light emitting elements LD is completed, a part of each of the first to fourth alignment lines AL1 to AL4 may be removed from the first open region OP1 of each pixel region PXA, and thereby, the first alignment line AU may be separated as the first electrode EL1 separated as a unit of the pixel PXL, the second alignment line AL2 may be separated as the second electrode EL2 separated as a unit of the pixel PXL, the third alignment line AL3 may be separated as the third electrode EL3 separated as a unit of the pixel PXL, and the fourth alignment line AL4 may be separated as the fourth electrode EL4 separated as a unit of the pixel PXL.

During a period in which the display device DD is driven, the first drive power supply voltage VDD may be supplied to the first power line PL1 through the first power pad PP1 and the first bus line CL1, and the second drive power supply voltage VSS may be supplied to the second power line PL2 through the second power pad PP2 and the second bus line CL2. Accordingly, the drive power supply voltages may be supplied to the pixels PXL.

Figure 10:
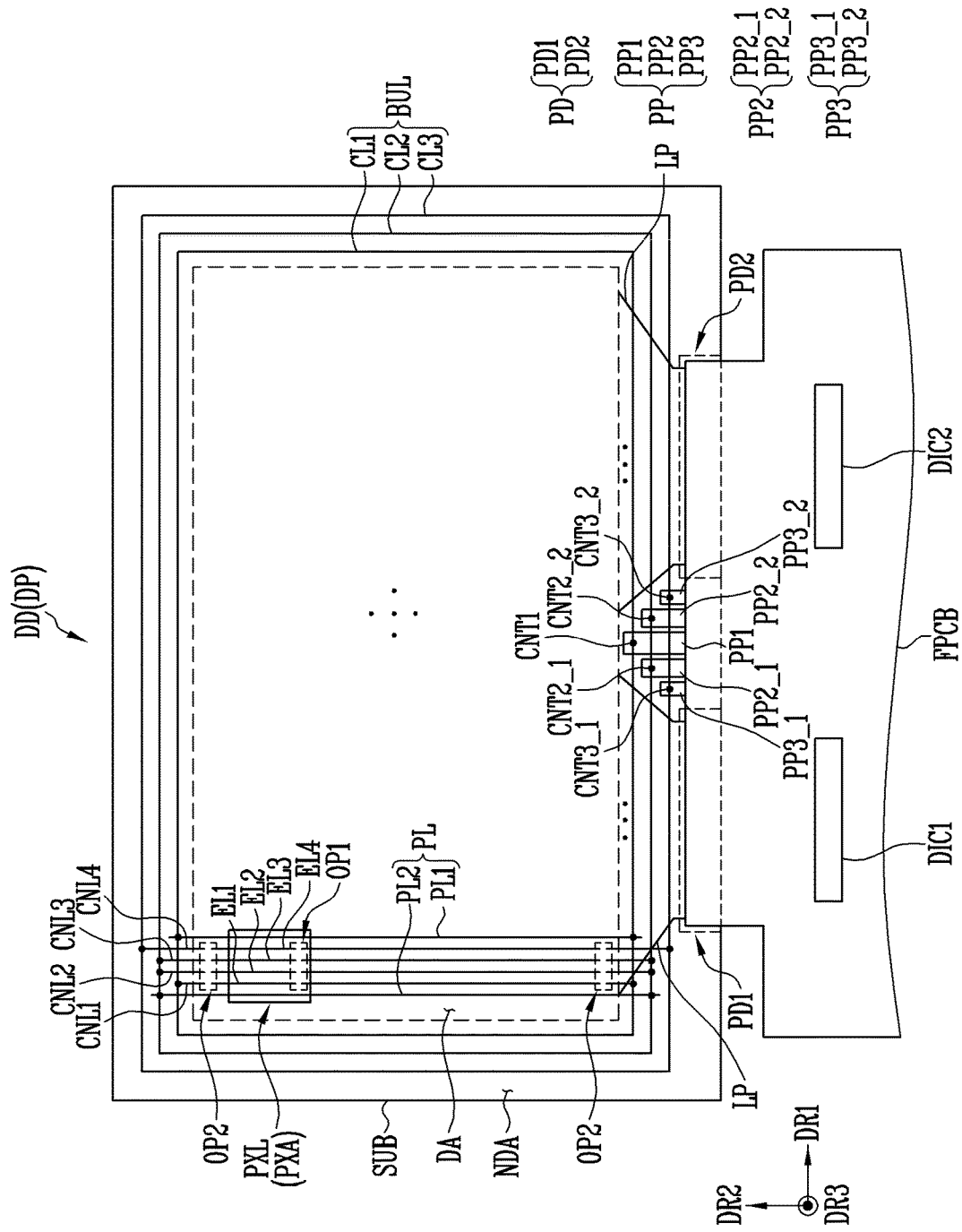
FIG. 10 is a plan view schematically illustrating a display device according to an embodiment of the present disclosure.

FIG. 10 is a plan view schematically illustrating a display device DD according to an embodiment of the present disclosure.

Referring to FIGS. 3-10, the display device DD may further include a circuit board FPCB connected to the display panel DP through the pad portion PD. The circuit board FPCB may be a flexible circuit board, but the present disclosure is not limited thereto.

The circuit board FPCB may process various signals inputted from a printed circuit board and output signals to the display panel DP. To this end, one end of the circuit board FPCB may be attached to the display panel DP, and the other end facing (or opposite) the first end may be attached to the printed circuit board. The circuit board FPCB may be connected to the display panel DP and the printed circuit board by a conductive adhesive member. The conductive adhesive member may include an anisotropic conductive film.

A drive circuit may be mounted on the circuit board FPCB. The drive circuit may include a first drive circuit DIC1 and a second drive circuit DIC2. Here, the first and second drive circuits DIC1 and DIC2 may be integrated circuits (ICs). The first and second drive circuits DIC1 and DIC2 may receive drive signals outputted from the printed circuit board and may output suitable signals (e.g., predetermined signals) and so on to be provided to the pixels PXL based on the received drive signals. For example, the first drive circuit DIC1 may supply suitable signals (e.g., predetermined signals) to the pixels PXL connected to the first pads P1 through the first pads P1 of the first pad portion PD1, and the second drive circuit DIC2 may supply suitable signals (e.g., predetermined signals) to the pixels PXL connected to the second pads P2 through the second pads P2 of the second pad portion PD2.

At least one of the first and second drive circuits DIC1 and DIC2 may include a power supply pad connected to the power pad portion PP to supply a drive power supply voltage to the power pad portion PP when the display device DD is driven.

Figure 11:
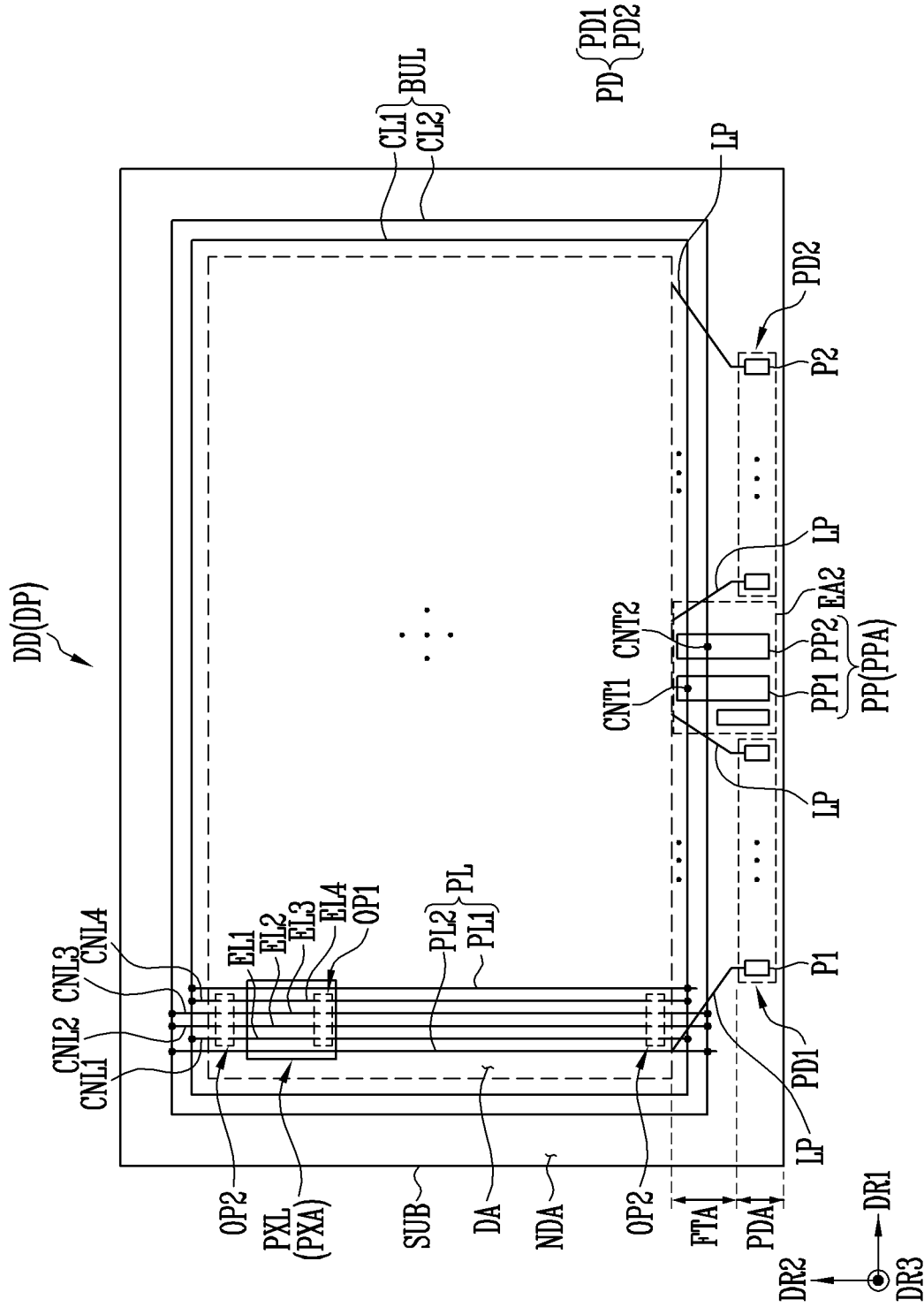
FIG. 11 is a plan view schematically illustrating a display device according to another embodiment of the present disclosure.
Figure 12A:
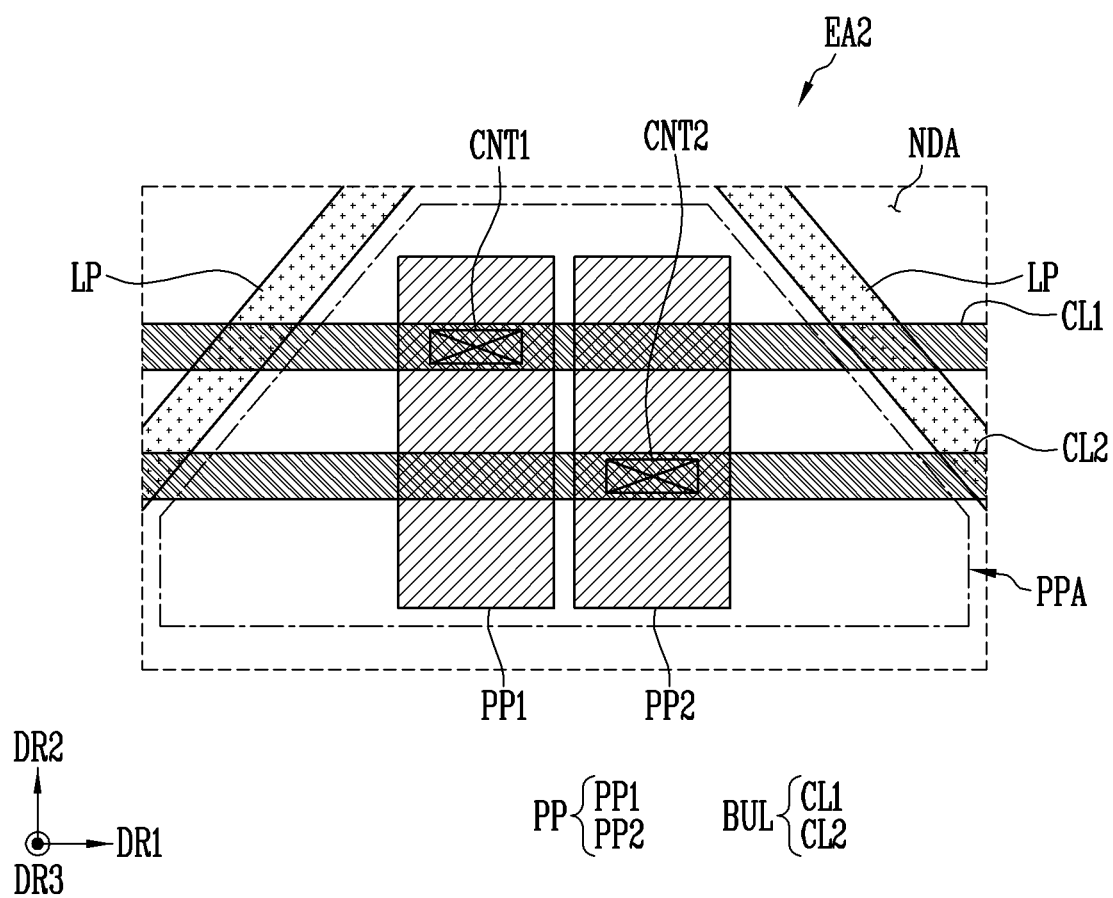
FIGS. 12A and 12B are schematic enlarged views of EA2 of FIG. 11.
Figure 12B:
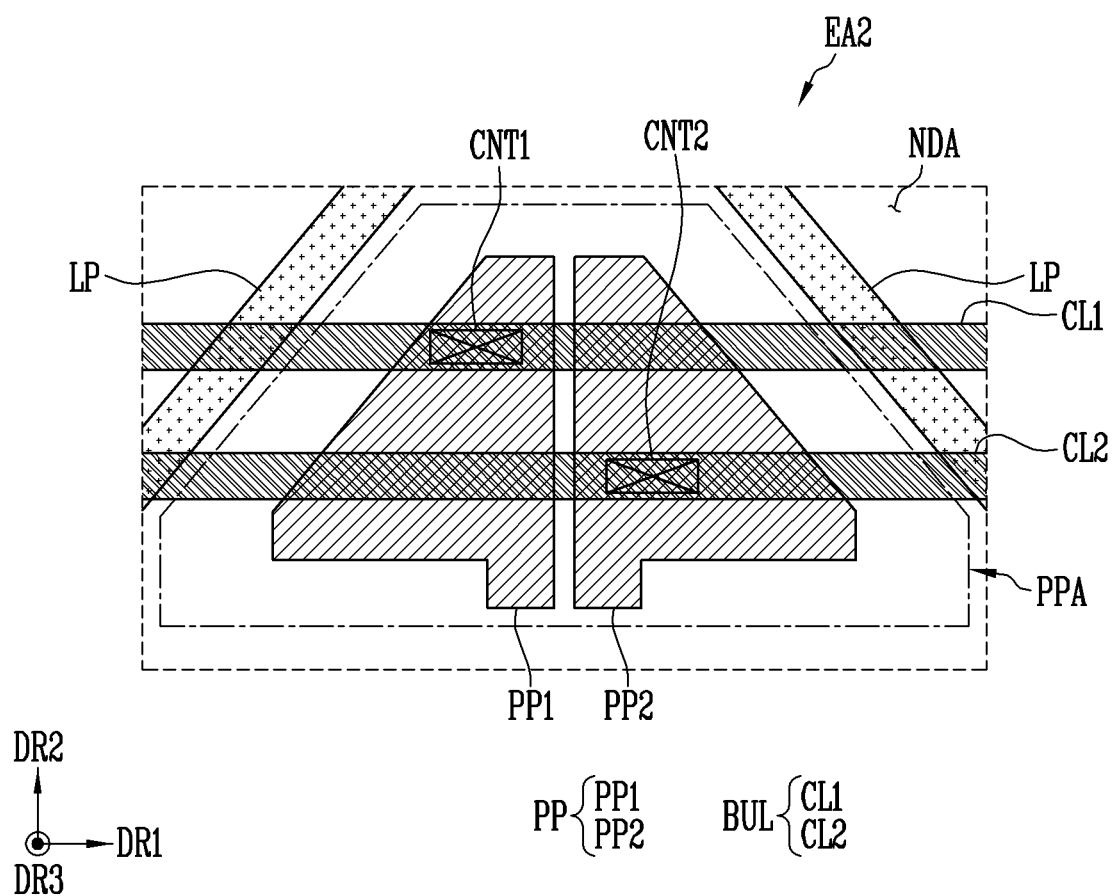

FIG. 11 is a plan view schematically illustrating a display device DD according to another embodiment of the present disclosure, and FIGS. 12A and 12B are schematic enlarged views of area EA2 of FIG. 11.

A display device DD illustrated in FIG. 11 may have a configuration substantially the same as or similar to the display device DD illustrated in FIG. 3 except that the third bus line and the third power pad are omitted.

Accordingly, different points from the above-described embodiment will be mainly described to avoid redundant description in relation to the display device DD of FIG. 11. Parts not described in particular in one embodiment of the present disclosure are according to the above-described embodiment, and the same numbers indicate the same components, and similar numbers indicate similar components.

Referring to FIGS. 11-12B, the display device DD according to another embodiment of the present disclosure may include a substrate SUB, pixels PXL, and a line portion LP, among other components. Here, the pixels PXL may be provided in a display region DA of the substrate SUB, and the line portion LP may be provided in a fan-out region FTA of a non-display region NDA of the substrate SUB.

In addition, a pad portion PD, a power pad portion PP, and a bus line BUL may be provided in the non-display region NDA.

The bus line BUL may surround (or be around) at least one side of the display region DA. In one embodiment, the bus line BUL may include a first bus line CL1 and a second bus line CL2.

The first bus line CL1 may be connected to the first power line PL1 and the first power pad PP1. The first bus line CL1 may be connected to a first alignment pad provided on a mother substrate during a step of aligning light emitting elements LD in a pixel region PXA of each of the pixels PXL in a manufacturing step of the display device DD to transmit a first alignment signal to the first and fourth electrodes EL1 and EL4 of each of the pixels PXL. To this end, the first bus line CL1 may be first formed to be connected to the first and fourth electrodes EL1 and EL4 of each of the pixels PXL and may be separated from the first and fourth electrodes EL1 and EL4 of each of the pixels PXL after alignment of the light emitting elements LD is completed. During this process, a plurality of first connection lines CNL1 and a plurality of fourth connection lines CNL4 may be formed.

The second bus line CL2 may be connected to the second power line PL2 and the second power pad PP2. The second bus line CL2 may be connected to a second alignment pad provided on a mother substrate during a step of aligning the light emitting elements LD described above to transmit the second alignment signal to the second and third electrodes EL2 and EL3 of each of the pixels PXL. To this end, the second bus line CL2 may be first formed to be connected to the second and third electrodes EL2 and EL3 of each of the pixels PXL, and after the alignment of the light emitting elements LD is completed, the second bus line CL2 may be separated from each of the second and third electrodes EL2 and EL3 of each of the pixels PXL. In this process, a plurality of second connection lines CNL2 and a plurality of third connection lines CNL3 may be formed.

The pad portion PD may be provided in the pad region PDA of the non-display region NDA and may include a first pad portion PD1 and a second pad portion PD2 spaced from each other. The first pad portion PD1 may include a plurality of first pads P1 that connect at least some of the pixels PXL to the line portion LP, and the second pad portion PD2 may include a plurality of second pads P2 that connect the other ones of the pixels PXL to the line portion LP.

The power pad portion PP may include a first power pad PP1 and a second power pad PP2. The power pad portion PP may be located in the power pad region PPA which is one region between the first pad portion PD1 and the second pad portion PD2 in the non-display region NDA.

The first power pad PP1 may be connected to the first bus line CL1 through a first contact portion CNT1. When the display device DD is driven, the first power pad PP1 may receive a first drive power supply voltage (refer to "VDD" of FIG. 4) and supply the first drive power supply voltage to the first power line PL1 through the first bus line CL1, and the first power pad PP1 may receive a first alignment signal during a step of aligning the light emitting elements LD and transmit the first alignment signal to the first and fourth electrodes EL1 and EL4 of each of the pixels PXL through the first bus line CL1. Here, the first alignment signal may be a DC signal.

The second power pad PP2 may be connected to the second bus line CL2 through a second contact portion CNT2. When the display device DD is driven, the second power pad PP2 may receive a second drive power supply voltage (refer to "VSS" of FIG. 4) and supply the second drive power supply voltage to the second power line PL2 through the second bus line CL2, and the second power pad PP2 may receive the second alignment signal during a step of aligning the light emitting elements LD and transmit the second alignment signal to the second and third electrodes EL2 and EL3 of each of the pixels PXL through the second bus line CL2. Here, the second alignment signal may be an AC signal.

The first power pad PP1 and the second power pad PP2 may be designed to have the same size, but the present disclosure is not limited thereto. In some embodiments, the first power pad PP1 may be designed to have a larger size than the second power pad PP2 or the second power pad PP2 may be designed to have a larger size than the first power pad PP1. The sizes of the first and second power pads PP1 and PP2 may be variously changed to meet requirements (or design conditions) of the display device DD to be applied.

The first power pad PP1 and the second power pad PP2 may have a bar shape or a rectangular shape extending in the second direction DR2 as illustrated in FIG. 12A, but the present disclosure is not limited thereto. In some embodiments, the first power pad PP1 and the second power pad PP2 may also have a polygonal shape as illustrated in FIG. 12B. The shapes of the first power pad PP1 and the second power pad PP2 may be variously changed within a range in which the first and second power pads are electrically and stably connected to corresponding bus lines and are electrically disconnected from power pads adjacent thereto.

The first power pad PP1 and the second power pad PP2 may be provided in the power pad region PPA so as not to overlap the line portion LP provided in the fan-out region FTA. Because the line portion LP is not located under the power pad portion PP including the first and second power pads PP1 and PP2, a step difference between insulating layers, which are formed of an inorganic material, located thereon may be reduced or minimized by the plurality of lines included in the line portion LP, and thus, failure due to the step difference may be prevented from occurring.

Figure 13:
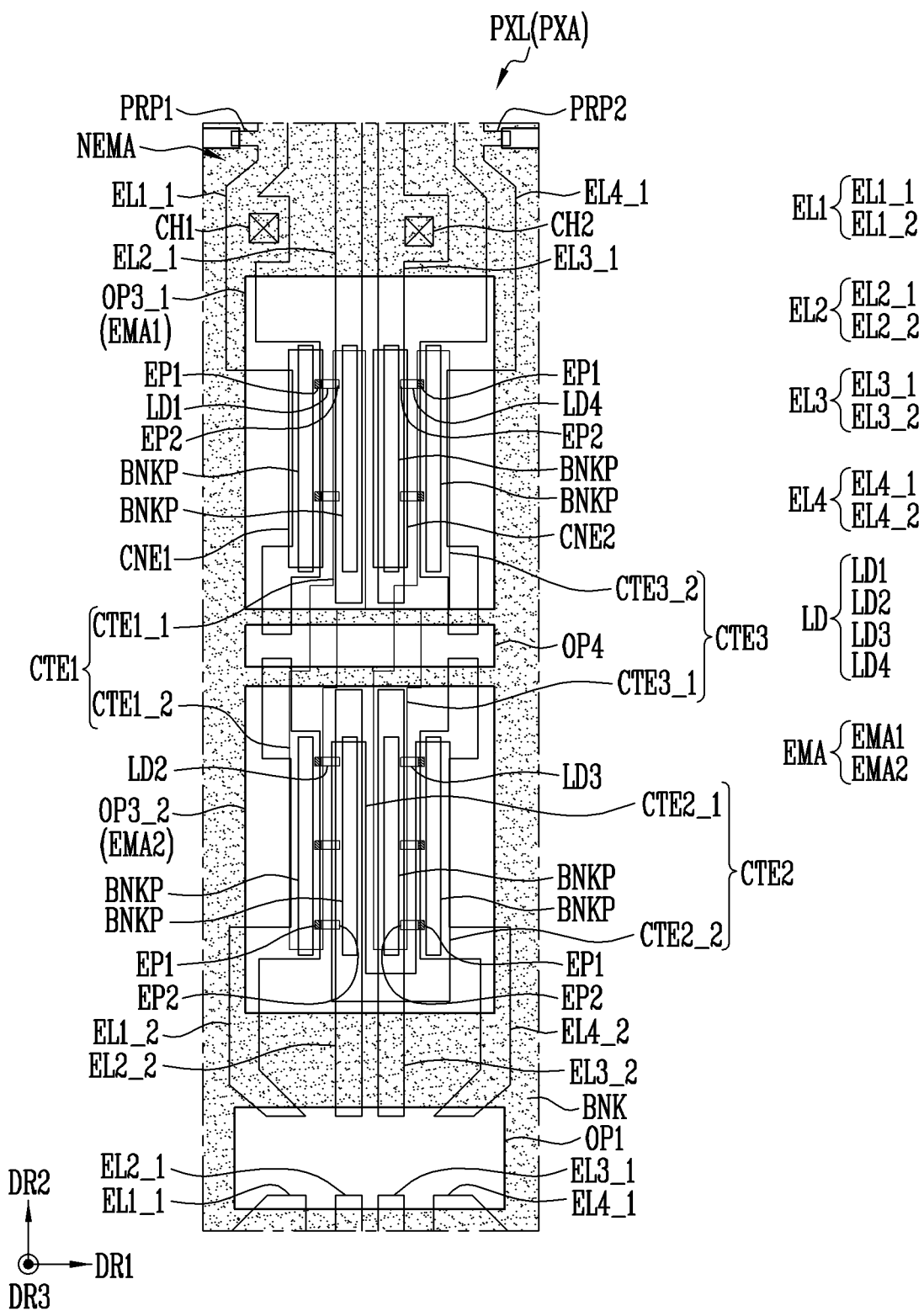
FIG. 13 is a plan view schematically illustrating one pixel illustrated in FIG. 11.

FIG. 13 is a plan view schematically illustrating one pixel PXL illustrated in FIG. 11.

With respect to the pixel PXL of FIG. 13, different points from the above-described embodiment will be mainly described to avoid redundant description.

Referring to FIGS. 11 and 13, each of the pixels PXL may be provided and/or formed in the pixel region PXA on the substrate SUB. The pixel region PXA may include a light emitting region EMA and a non-light emitting region NEMA. In one embodiment, the light emitting region EMA may include a first light emitting region EMA1 and a second light emitting region EMA2.

Each of the pixels PXL may include a bank BNK located in the non-light emitting region NEMA.

The bank BNK is a structure that defines (or partitions) the pixel region PXA or the light emitting region EMA of each of the corresponding pixel PXL and the pixels PXL adjacent thereto, and may be, for example, a pixel definition layer.

The bank BNK may include one or more open regions exposing components under the bank BNK in the pixel region PXA of the corresponding pixel PXL. For example, the bank BNK may include a first open region OP1, a 3-$1^{th}$ open region OP3_1, a 3-$2^{th}$ open region OP3_2, and a fourth open region OP4 that expose components under the bank BNK in the pixel region PXA of the corresponding pixel PXL. In one embodiment, the first light emitting region EMA1 of each of the pixels PXL and the 3-$1^{th}$ open region OP3_1 of the bank BNK may correspond to each other, and the second light emitting region EMA2 of the corresponding pixel PXL and the 3-$2^{th}$ open region OP3_2 of the bank BNK may correspond to each other.

Each of the pixels PXL may include the first electrode EL1, the second electrode EL2, the third electrode EL3, and the fourth electrode EL4 which are arranged along the first direction DR1 and are spaced from each other.

Each of the first to fourth electrodes EL1 to EL4 may include two electrodes located in the same column within the pixel region PXA of each of the pixels PXL. For example, the first electrode EL1 may include a 1-$1^{th}$ electrode EL1_1 and a 1-$2^{th}$ electrode EL1_2 that are located in the same column and are spaced from each other along the second direction DR2, the second electrode EL2 may include a 2-$1^{th}$ electrode EL2_1 and a 2-$2^{th}$ electrode EL2_2 that are located in the same column and are spaced from each other along the second direction DR2, the third electrode EL3 may include a 3-$1^{th}$ electrode EL3_1 and a 3-$2^{th}$ electrode EL3_2 that are located in the same column and are spaced from each other along the second direction DR2, and the fourth electrode EL4 may include a 4-$1^{th}$ electrode EL4_1 and a 4-$2^{th}$ electrode EL4_2 that are located in the same column and are spaced from each other along the second direction DR2.

The 1-$1^{th}$ electrode EL1_1, the 2-$1^{th}$ electrode EL2_1, the 3-$1^{th}$ electrode EL3_1, and the 4-$1^{th}$ electrode EL4_1 may be located in the first light emitting region EMA1 of the corresponding pixel PXL. The 1-$2^{th}$ electrode EL1_2, the 2-$2^{th}$ electrode EL2_2, the 3-$2^{th}$ electrode EL3_2, and the 4-$2^{th}$ electrode EL4_2 may be located in the second light emitting region EMA2 of the corresponding pixel PXL.

One end of each of the 1-$1^{th}$ to 4-$1^{th}$ electrodes EL1_1 to EL4_1 and/or one end of each of the 1-$2^{th}$ to 4-$2^{th}$ electrodes EL1_2 to EL4_2 may be located in a first open region OP1 of the bank BNK. The first to fourth electrodes EL1 to EL4 may be separated from other electrodes (for example, electrodes of adjacent pixels PXL in the second direction DR2) in the first open region OP1 after the light emitting elements LD are aligned. Here, the first open region OP1 may be the first open region OP1 described with reference to FIG. 3.

In addition, one end of each of the 1-$1^{th}$ to 4-$1^{th}$ electrodes EL1_1 to EL4_1 and the other end of each of the 1-$2^{th}$ to 4-$2^{th}$ electrodes EL1_2 to EL4_2 may be located in the fourth open region OP4 of the bank BNK. Each of the 1-$1^{th}$ to 4-$1^{th}$ electrodes EL1_1 to EL4_1 and each of the 1-$2^{th}$ to 4-$2^{th}$ electrodes EL1_2 to EL4_2 may be separated from each other in the fourth open region OP4 after the light emitting elements LD are aligned to cause a light emitting unit (refer to "EMU" of FIG. 4) of each of the pixels PXL to be constituted by four series stages. In one embodiment, the fourth open region OP4 of the bank BNK may correspond to an area that is in a center or central region of the light emitting region EMA of the corresponding pixel PXL.

The first to fourth electrodes EL1 to EL4 may be formed of materials with constant reflectance to make light emitted from each of the light emitting elements LD travel in an image display direction (for example, a front direction) of the display device DD. The first to fourth electrodes EL1, EL2, EL3, and EL4 may be formed of a conductive material with constant reflectance.

The 1-1$^{th}$ electrode EL1_1, the 2-1$^{th}$ electrode EL2_1, the 3-1$^{th}$ electrode EL3_1, and the 4-1$^{th}$ electrode EL4_1 are symmetrical to the 1-2$^{th}$ electrode EL1_2, the 2-2$^{th}$ electrode EL2_2, the 3-2$^{th}$ electrode EL3_2, and the 4-2$^{th}$ electrode EL4_2, respectively, with the fourth open region OP4 of the bank BNK as the center, and thus, the 1-1$^{th}$ electrode EL1_1, the 2-1$^{th}$ electrode EL2_1, the 3-1$^{th}$ electrode EL3_1, and the 4-1$^{th}$ electrode EL4_1 will be mainly described.

The 1-1$^{th}$ electrode EL1_1 may have a shape curved toward the 2-1$^{th}$ electrode EL2_1 in the first direction DR1 in the first light emitting region EMA1. The curved shape of the 1-1$^{th}$ electrode EL1_1 may be provided to maintain a suitable distance (e.g., a set or predetermined distance) between the 1-1$^{th}$ electrode EL1_1 and the 2-1$^{th}$ electrode EL2_1 in the first light emitting region EMA1. Similarly, the 4-1$^{th}$ electrode EL4_1 may have a shape curved toward the 3-1$^{th}$ electrode EL3_1 in the first direction DR1 in the first light emitting region EMA1. The curved shape of the 4-1$^{th}$ electrode EL4_1 may be provided to maintain a suitable distance (e.g., a set or predetermined distance) between the 3-1$^{th}$ electrode EL3_1 and the 4-1$^{th}$ electrode EL4_1 in the first light emitting region EMA1. However, the shapes of the 1-1$^{th}$ electrode EL1_1 and the 4-1$^{th}$ electrode EL4_1 are not limited thereto.

The 1-1$^{th}$ electrode EL1_1 may include a first protrusion pattern PRP1 protruding in the first direction DR1 in the non-light emitting region NEMA around the first light emitting region EMA1. The first protrusion pattern PRP1 may protrude toward a fourth electrode of a pixel adjacent to the first electrode EL1 of the corresponding pixel PXL from among the pixels PXL located in the same pixel row as the corresponding pixel PXL. The first protrusion pattern PRP1 may be formed in a process in which the first electrode EL1 is separated from the first electrode EL1 of the adjacent pixel PXL in the second direction DR2 during a manufacturing step of the display device DD. At least a part of the first protrusion pattern PRP1 may not overlap the bank BNK.

The 4-1$^{th}$ electrode EL4_1 may include a second protrusion pattern PRP2 protruding in the first direction DR1 in the non-light emitting region NEMA around the first light emitting region EMA1. The second protrusion pattern PRP2 may protrude toward a first electrode of a pixel adjacent to the fourth electrode EL4 of the corresponding pixel PXL from among the pixels PXL located in the same pixel row as the corresponding pixel PXL. The second protrusion pattern PRP2 may be formed in a process in which the fourth electrode EL4 is separated from the fourth electrode EL4 of the adjacent pixel PXL during the manufacturing step of the display device DD. At least a part of the second protrusion pattern PRP2 may not overlap the bank BNK.

In one embodiment, the first protrusion pattern PRP1 and the second protrusion pattern PRP2 may protrude in opposite directions from each other. That is, a protrusion direction of the first protrusion pattern PRP1 may be different from a protrusion direction of the second protrusion pattern PRP2. For example, the first protrusion pattern PRP1 may protrude toward one side (for example, left) of a plane in a direction that is opposite to the first direction DR1, and the second protrusion pattern PRP2 may protrude toward the other side (for example, right) of a plane in the first direction DR1.

Description on formation of the first and second protrusion patterns PRP1 and PRP2 will be made below with reference to FIGS. 14A and 14B.

The 1-1$^{th}$ electrode EL1_1 may be connected to the first transistor T1 described with reference to FIG. 4 through the first contact hole CH1, and the 3-1$^{th}$ electrode EL3_1 may be connected to the second drive power supply voltage VSS (or the second power line PL2) described with reference to FIG. 4 through the second contact hole CH2. In one embodiment, the 1-1$^{th}$ electrode EL1_1 may be an anode of the light emitting unit EMU of each of the pixels PXL, and the 3-1$^{th}$ electrode EL3_1 may be a cathode of the light emitting unit EMU of the corresponding pixel PXL.

In one embodiment, each of the pixels PXL may include a bank pattern BNKP which is a support member (or pattern) supporting each of the first to fourth electrodes EL1 to EL4. Because the bank pattern BNKP corresponds to the same configuration as the first to fourth bank patterns BNKP1 to BNKP4 described with reference to FIG. 5, detailed description thereof will not be repeated.

The pixel PXL may include a plurality of light emitting elements LD. The light emitting elements LD may include a first light emitting element LD1, a second light emitting element LD2, a third light emitting element LD3, and a fourth light emitting element LD4.

The first light emitting element LD1 may be arranged between the 1-1$^{th}$ electrode EL1_1 and the 2-1$^{th}$ electrode EL2_1 of each of the pixels PXL. A first end portion EP1 of the first light emitting element LD1 may face the 1-1$^{th}$ electrode EL1_1, and a second end portion EP2 of the first light emitting element LD1 may face the 2-1$^{th}$ electrode EL2_1. When a plurality of first light emitting elements LD1 are provided, the plurality of first light emitting elements LD1 may be connected to each other in parallel between the 1-1$^{th}$ electrode EL1_1 and the 2-1$^{th}$ electrode EL2_1 and may constitute a first series stage.

The second light emitting element LD2 may be arranged between the 1-2$^{th}$ electrode EL1_2 and the 2-2$^{th}$ electrode EL2_2 of the pixel PXL. A first end portion EP1 of the second light emitting element LD2 may face the 1-2$^{th}$ electrode EL1_2, and a second end portion EP2 of the second light emitting element LD2 may face the 2-2$^{th}$ electrode EL2_2. When a plurality of second light emitting elements LD2 are provided, the plurality of second light emitting elements LD2 may be connected to each other in parallel between the 1-2$^{th}$ electrode EL1_2 and the 2-2$^{th}$ electrode EL2_2 and may constitute a second series stage.

The third light emitting element LD3 may be arranged between the 3-2$^{th}$ electrode EL3_2 and the 4-2$^{th}$ electrode EL4_2 of the pixel PXL. A first end portion EP1 of the third light emitting element LD3 may face the 4-2$^{th}$ electrode EL4_2, and a second end portion EP2 of the third light emitting element LD3 may face the 3-2$^{th}$ electrode EL3_2. When a plurality of third light emitting elements LD3 are provided, the plurality of third light emitting elements LD3 may be connected to each other in parallel between the 3-2$^{th}$ electrode EL3_2 and the 4-2$^{th}$ electrode EL4_2 and may constitute a third series stage.

The fourth light emitting element LD4 may be arranged between the 3-1$^{th}$ electrode EL3_1 and the 4-1$^{th}$ electrode EL4_1 of the pixel PXL. A first end portion EP1 of the fourth light emitting element LD4 may face the 4-1$^{th}$ electrode EL4_1, and a second end portion EP2 of the fourth light emitting element LD4 may face the 3-1$^{th}$ electrode EL3_1. When a plurality of fourth light emitting elements LD4 are provided, the plurality of fourth light emitting elements LD4 may be connected to each other in parallel between the 3-1$^{th}$ electrode EL3_1 and the 4-1$^{th}$ electrode EL4_1 and may constitute a fourth series stage.

In some embodiments, each of the first light emitting element LD1, the second light emitting element LD2, the third light emitting element LD3, and the fourth light emitting element LD4 may be a light emitting diode of a subminiature size such as a size as small as nanoscale to microscale, which uses a material having an inorganic crystal structure. For example, each of the first light emitting element LD1, the second light emitting element LD2, the third light emitting element LD3, and the fourth light emitting element LD4 may be the light emitting element LD illustrated in FIG. 1.

In some embodiments, each of the pixels PXL may include a first contact electrode CNE1, a second contact electrode CNE2, a first intermediate electrode CTE1, a second intermediate electrode CTE2, and a third intermediate electrode CTE3.

The first contact electrode CNE1 may be formed on the first end portion EP1 of the first light emitting element LD1 and on at least one region of the $1\text{-}1^{th}$ electrode EL1_1 corresponding thereto to physically and/or electrically connect the first end portion EP1 of the first light emitting element LD1 to the $1\text{-}1^{th}$ electrode EL1_1.

The second contact electrode CNE2 may be formed on the second end portion EP2 of the fourth light emitting element LD4 and on at least one region of the corresponding $3\text{-}1^{th}$ electrode EL3_1 to physically and/or electrically connect the second end portion EP2 of the fourth light emitting element LD4 to the $3\text{-}1^{th}$ electrode EL3_1.

The first intermediate electrode CTE1 may include a $1\text{-}1^{th}$ intermediate electrode CTE1_1 and a $1\text{-}2^{th}$ intermediate electrode CTE1_2 extending in the second direction DR2. The $1\text{-}1^{th}$ intermediate electrode CTE1_1 may be formed on the second end portion EP2 of the first light emitting element LD1 and on at least one region of the $2\text{-}1^{th}$ electrode EL2_1 corresponding thereto. The first intermediate electrode CTE1 may extend from the $2\text{-}1^{th}$ electrode EL2_1 (or the $1\text{-}1^{th}$ intermediate electrode CTE1_1) to the $1\text{-}2^{th}$ electrode EL1_2 (or the $1\text{-}2^{th}$ intermediate electrode CTE1_2), and the $1\text{-}2^{th}$ intermediate electrode CTE1_2 may be formed on the first end portion EP1 of the second light emitting element LD2 and on at least one region of the $1\text{-}2^{th}$ electrode EL1_2 corresponding thereto. The first intermediate electrode CTE1 may electrically connect the second end portion EP2 of the first light emitting element LD1 to the first end portion EP1 of the second light emitting element LD2. That is, the first intermediate electrode CTE1 may be a first bridge electrode (or a first connection electrode) connecting the first series stage to the second series stage.

The second intermediate electrode CTE2 may include a $2\text{-}1^{th}$ intermediate electrode CTE2_1 and a $2\text{-}2^{th}$ intermediate electrode CTE2_2 extending in the second direction DR2. The $2\text{-}1^{th}$ intermediate electrode CTE2_1 may be formed on the second end portion EP2 of the second light emitting element LD2 and on at least one region of the $2\text{-}2^{th}$ electrode EL2_2 corresponding thereto. The second intermediate electrode CTE2 may extend from the $2\text{-}2^{th}$ electrode EL2_2 by bypassing the third intermediate electrode CTE3 or the third light emitting element LD3, and the $2\text{-}2^{th}$ intermediate electrode CTE2_2 may be formed on the first end portion EP1 of the third light emitting element LD3 and on at least one region of the $4\text{-}2^{th}$ electrode EL4_2 corresponding thereto. The second intermediate electrode CTE2 may electrically connect the second end portion EP2 of the second light emitting element LD2 to the first end portion EP1 of the third light emitting element LD3. That is, the second intermediate electrode CTE2 may be a second bridge electrode (or a second connection electrode) connecting the second series stage to the third series stage.

The third intermediate electrode CTE3 may include a $3\text{-}1^{th}$ intermediate electrode CTE3_1 and a $3\text{-}2^{th}$ intermediate electrode CTE3_2 extending in the second direction DR2. The $3\text{-}1^{th}$ intermediate electrode CTE3_1 may be formed on the second end portion EP2 of the third light emitting element LD3 and on at least one region of the $3\text{-}2^{th}$ electrode EL3_2 corresponding thereto. The third intermediate electrode CTE3 may extend from the $3\text{-}2^{th}$ electrode EL3_2 (or the $3\text{-}1^{th}$ intermediate electrode CTE3_1) to the $4\text{-}1^{th}$ electrode EL4_1 (or the $3\text{-}2^{th}$ intermediate electrode CTE3_2), and the $3\text{-}2^{th}$ intermediate electrode CTE3_2 may be formed on the first end portion EP1 of the fourth light emitting element LD4 and on at least one region of the $4\text{-}1^{th}$ electrode EL4_1 corresponding thereto. The third intermediate electrode CTE3 may electrically connect the second end portion EP2 of the third light emitting element LD3 to the first end portion EP1 of the fourth light emitting element LD4. That is, the third intermediate electrode CTE3 may be a third bridge electrode (or a third connection electrode) connecting the third series stage to the fourth series stage.

Each of the first contact electrode CNE1, the second contact electrode CNE2, the first intermediate electrode CTE1, the second intermediate electrode CTE2, and the third intermediate electrode CTE3 may be formed of various transparent conductive materials so that light emitted from the light emitting elements LD and reflected by the first to fourth electrodes EL1 to EL4 travels in an image display direction of the display device DD without loss.

The first to third intermediate electrodes CTE1 to CTE3 may be provided at the same layer as the first and second contact electrodes CNE1 and CNE2 and may be formed through the same process. However, the present disclosure is not limited thereto, and in some embodiments, the first to third intermediate electrodes CTE1 to CTE3 may also be provided on a layer different from the layer of the first and second contact electrodes CNE1 and CNE2 and may be formed through a process different from the process of the first and second contact electrodes CNE1 and CNE2.

As described above, the first light emitting element LD1 may be connected in series to the second light emitting element LD2 through the first intermediate electrode CTE1, the second light emitting element LD2 may be connected in series to the third light emitting element LD3 through the second intermediate electrode CTE2, and the third light emitting element LD3 may be connected in series to the fourth light emitting element LD4 through the third intermediate electrode CTE3.

During each frame period, a drive current may flow from the $1\text{-}1^{th}$ electrode EL1_1 to the $3\text{-}1^{th}$ electrode EL3_1 through the first light emitting element LD1, the first intermediate electrode CTE1, the second light emitting element LD2, the second intermediate electrode CTE2, the third light emitting element LD3, the third intermediate electrode CTE3, and the fourth light emitting element LD4 in each of the pixels PXL.

The first light emitting element LD1, the second light emitting element LD2, the third light emitting element LD3, and the fourth light emitting element LD4 may be connected to each other in series between the $1\text{-}1^{th}$ electrode EL1_1 and the $3\text{-}1^{th}$ electrode EL3_1 through the first intermediate electrode CTE1, the second intermediate electrode CTE2, and the third intermediate electrode CTE3. In this way, the light emitting unit EMU of the pixel PXL may be constituted by connecting the light emitting elements LD aligned in the pixel region PXA of each of the pixels PXL in a series-parallel hybrid structure. Accordingly, it is possible to constitute the light emitting unit EMU as a series-parallel structure including four series stages while reducing or minimizing an area occupied by alignment electrodes (or without increasing the number of alignment electrodes), and thus, a high-resolution and high-definition display device DD may be implemented.

Figure 14A:
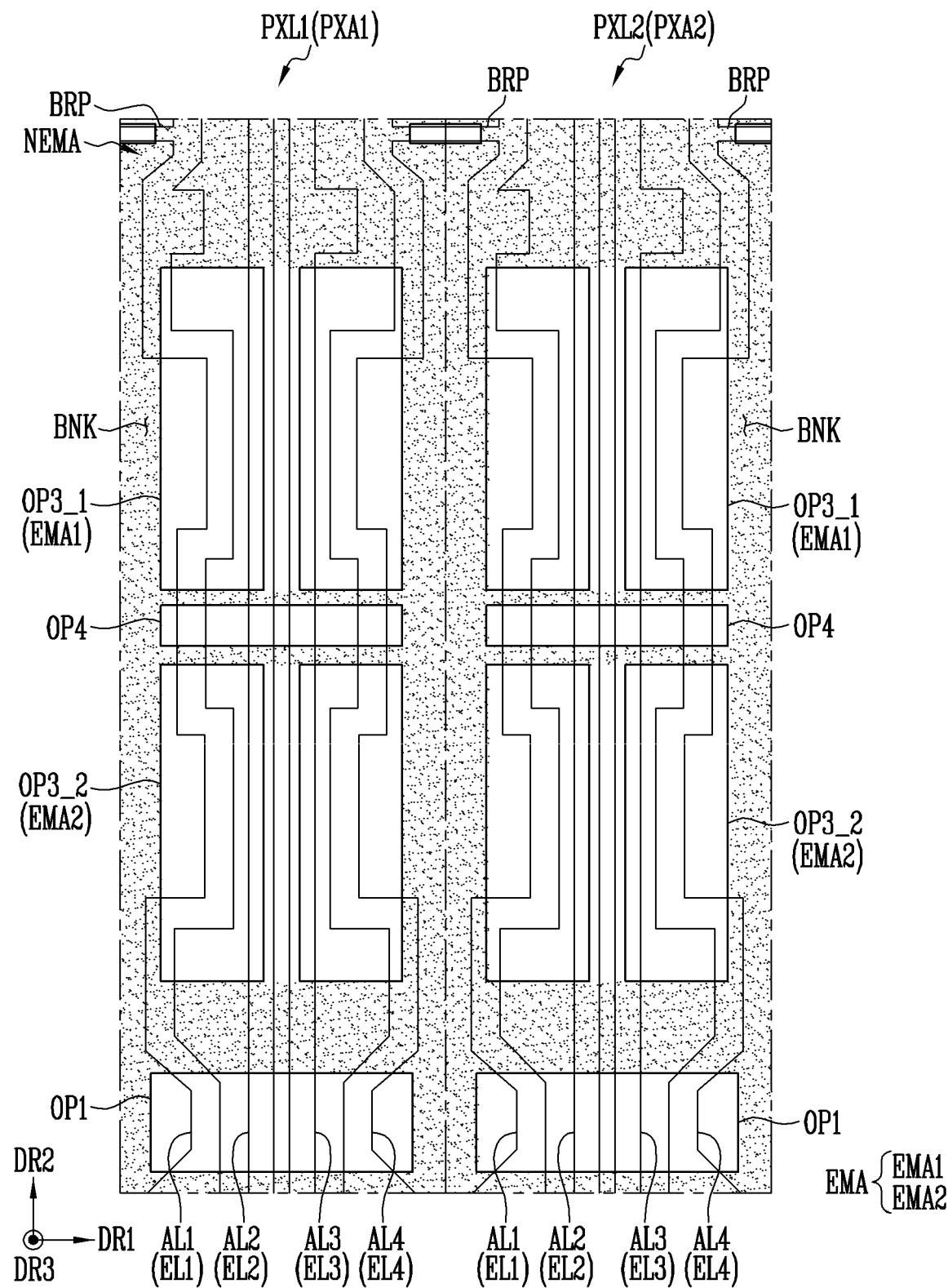
FIG. 14A is a plan view schematically illustrating a partial configuration of two adjacent pixels before light emitting elements are aligned in the display device of FIG. 11.
Figure 14B:
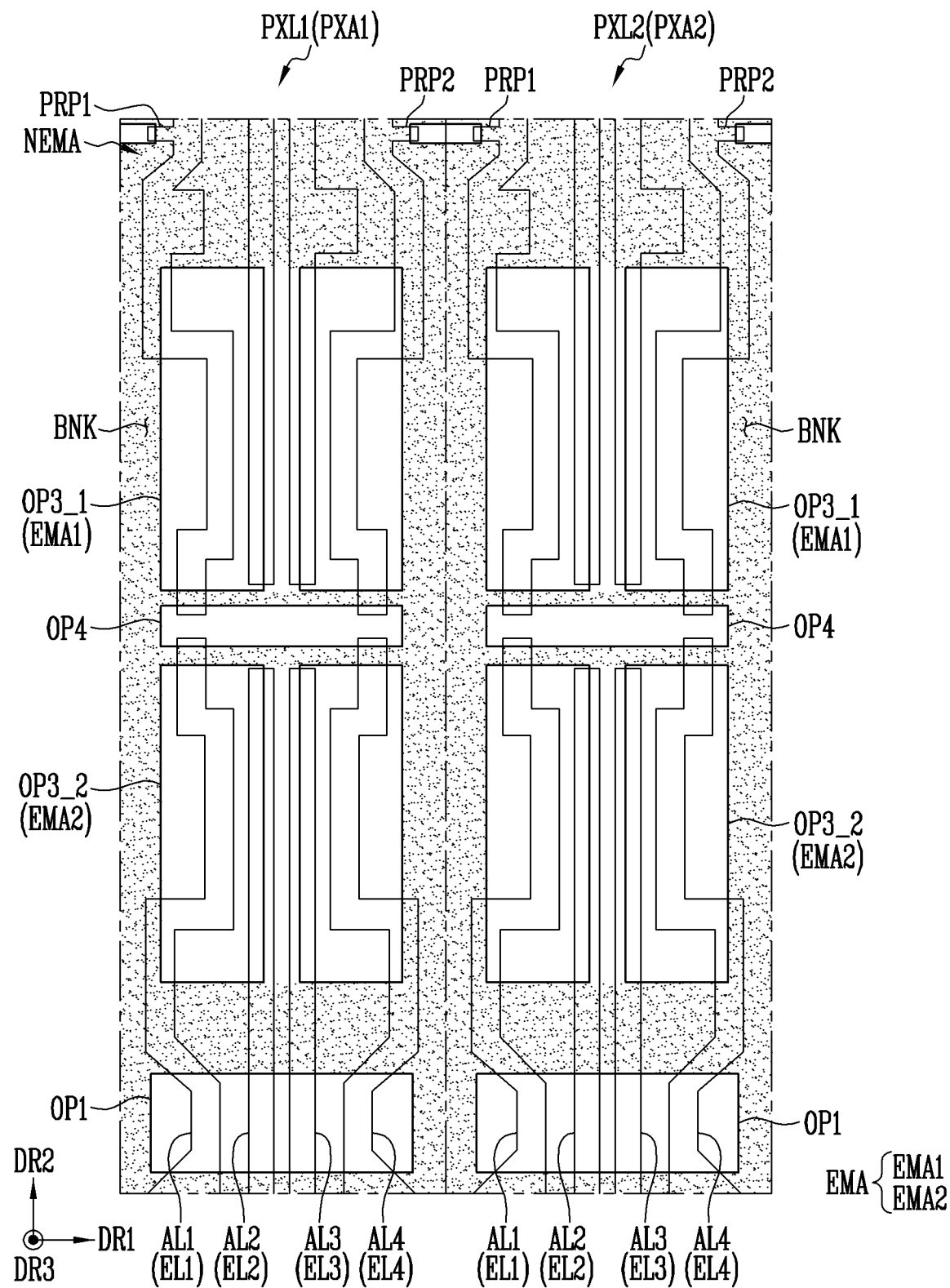
FIG. 14B is a plan view schematically illustrating a partial configuration of two adjacent pixels after light emitting elements are aligned in the display device of FIG. 11.

FIG. 14A is a plan view schematically illustrating a partial configuration of two adjacent pixels before the light emitting elements LD are aligned in the display device DD of FIG. 11, and FIG. 14B is a plan view schematically illustrating a partial configuration of two adjacent pixels after the light emitting elements LD are aligned in the display device DD of FIG. 11. For example, FIGS. 14A and 14B illustrate only the bank BNK and the first to fourth electrodes EL1 to EL4 for the sake of convenience.

Referring to FIGS. 11-14B, a first pixel PXL1 and a second pixel PXL2 adjacent to each other in the first direction DR1 may be provided. The first pixel PXL1 and the second pixel PXL2 may be the pixels PXL located in the same pixel row.

The first pixel PXL1 may be provided in a first pixel region PXA1 of the display region DA of the substrate SUB, and the second pixel PXL2 may be provided in a second pixel region PXA2 of the display region DA.

Before the light emitting elements LD are aligned in the display device DD, each of the first to fourth electrodes EL1 to EL4 of each of the first and second pixels PXL1 and PXL2 may be formed as an alignment line extending in the second direction DR2 in the display region DA without being separated as a unit of the pixel PXL. For example, the first electrode EL1 may be formed as a first alignment line AL1, the second electrode EL2 may be formed as a second alignment line AL2, the third electrode EL3 may be formed as a third alignment line AL3, and the fourth electrode EL4 may be formed as a fourth alignment line AL4.

The first and fourth alignment lines AL1 and AL4 may be connected to the first power pad PP1 through the first bus line CL1 and receive a first alignment signal from the first power pad PP1. In one embodiment, the first alignment signal may be a DC signal. The second and third alignment lines AL2 and AL3 may be connected to the second power pad PP2 through the second bus line CL2 and receive a second alignment signal from the second power pad PP2. In one embodiment, the second alignment signal may be an AC signal.

A corresponding alignment signal may be applied to each of the first to fourth alignment lines AL1 to AL4, thereby forming an electric field between the first and second alignment lines AL1 and AL2 and between the third and fourth alignment lines AL3 and AL4. Accordingly, the light emitting elements LD may be aligned between the first to fourth alignment lines AL1 to AL4.

The fourth alignment line AL4 of the first pixel PXL1 and the first alignment line AL1 of the second pixel PXL2 may be connected to each other through a bridge pattern BRP. One end of the bridge pattern BRP may be connected to the fourth alignment line AL4 of the first pixel PXL1, and the other end of the bridge pattern BRP may be connected to the first alignment line AL1 of the second pixel PXL2. Accordingly, the same alignment signal, that is, a first alignment signal may be applied to the fourth alignment line AL4 of the first pixel PXL1 and the first alignment line AL1 of the second pixel PXL2.

The bridge pattern BRP may be provided integrally with the fourth alignment line AL4 of the first pixel PXL1 and may be regarded as one region of the fourth alignment line AL4. In addition, the bridge pattern BRP may be provided integrally with the first alignment line AL1 of the second pixel PXL2 and may be regarded as one region of the first alignment line AL1. At least a part of the bridge pattern BRP may not overlap the bank BNK. That is, at least a part of the bridge pattern BRP may correspond to an open region (e.g., a set or predetermined open region) of the bank BNK, and thereby, a part of the bridge pattern BRP may be removed during a process of forming the first to fourth electrodes EL1 to EL4.

The bridge pattern BRP may be partially removed during a process in which each of the first to fourth alignment lines AL1 to AL4 of the corresponding pixel PXL is implemented as the first to fourth electrodes EL1 to EL4 including two electrodes located in the same column after the alignment of the light emitting elements LD is completed. In this process, the first protrusion pattern PRP1 and the second protrusion pattern PRP2 may be formed. The first protrusion pattern PRP1 may be one region of the bridge pattern BRP connected to the first alignment line AL1 of the second pixel PXL2, and the second protrusion pattern PRP2 may be another region of the bridge pattern BRP connected to the fourth alignment line AL4 of the first pixel PXL1. The first protrusion pattern PRP1 may protrude from the first electrode EL1 of the second pixel PXL2 toward the fourth electrode EL4 of the first pixel PXL1, and the second protrusion pattern PRP2 may protrude from the fourth electrode EL4 of the first pixel PXL1 toward the first electrode EL1 of the second pixel PXL2. The first protrusion pattern PRP1 and the second protrusion pattern PRP2 may be spaced from each other in the first direction DR1. Accordingly, the fourth electrode EL4 of the first pixel PXL1 and the first electrode EL1 of the second pixel PXL2 may be electrically disconnected from each other.

The first alignment line AL1 of the first pixel PXL1 may be connected to a fourth alignment line of a pixel located on one side (for example, left) of the first pixel PXL1 in a direction that is opposite to the first direction DR1 through the bridge pattern BRP. After the alignment of the light emitting elements LD is completed, the bridge pattern BRP may be partially removed. In this process, the first protrusion pattern PRP1 may be formed on the first electrode EL1 of the first pixel PXL1, and the second protrusion pattern may be formed on the fourth electrode of the pixel located on the left of the first pixel PXL1.

The fourth alignment line AL4 of the second pixel PXL2 may be connected to a first alignment line of a pixel located on one side (for example, right) of the second pixel PXL2 in the first direction DR1 through the bridge pattern BRP. After the alignment of the light emitting elements LD is completed, the bridge pattern BRP may be partially removed. In this process, the second protrusion pattern PRP2 may be formed on the fourth electrode EL4 of the second pixel PXL2, and the first protrusion pattern may be formed on the first electrode of the pixel located on the right of the second pixel PXL2.

As described above, during a step of aligning the light emitting elements LD, the fourth alignment line AL4 of the first pixel PXL1 and the first alignment line AL1 of the second pixel PXL2 may be connected to each other through the bridge pattern BRP to receive the same alignment signal, for example, the first alignment signal from the first power pad PP1 through the first bus line CL1. After the alignment of the light emitting elements LD is completed, the bridge pattern BRP may be partially removed, and thereby, the fourth electrode EL4 of the first pixel PXL1 and the first electrode EL1 of the second pixel PXL2 may be electrically disconnected from each other. Accordingly, when the display device DD is driven, the first pixel PXL1 and the second pixel PXL2 may be independently (or individually) driven to emit desired light (e.g., predetermined light).

Figure 15:
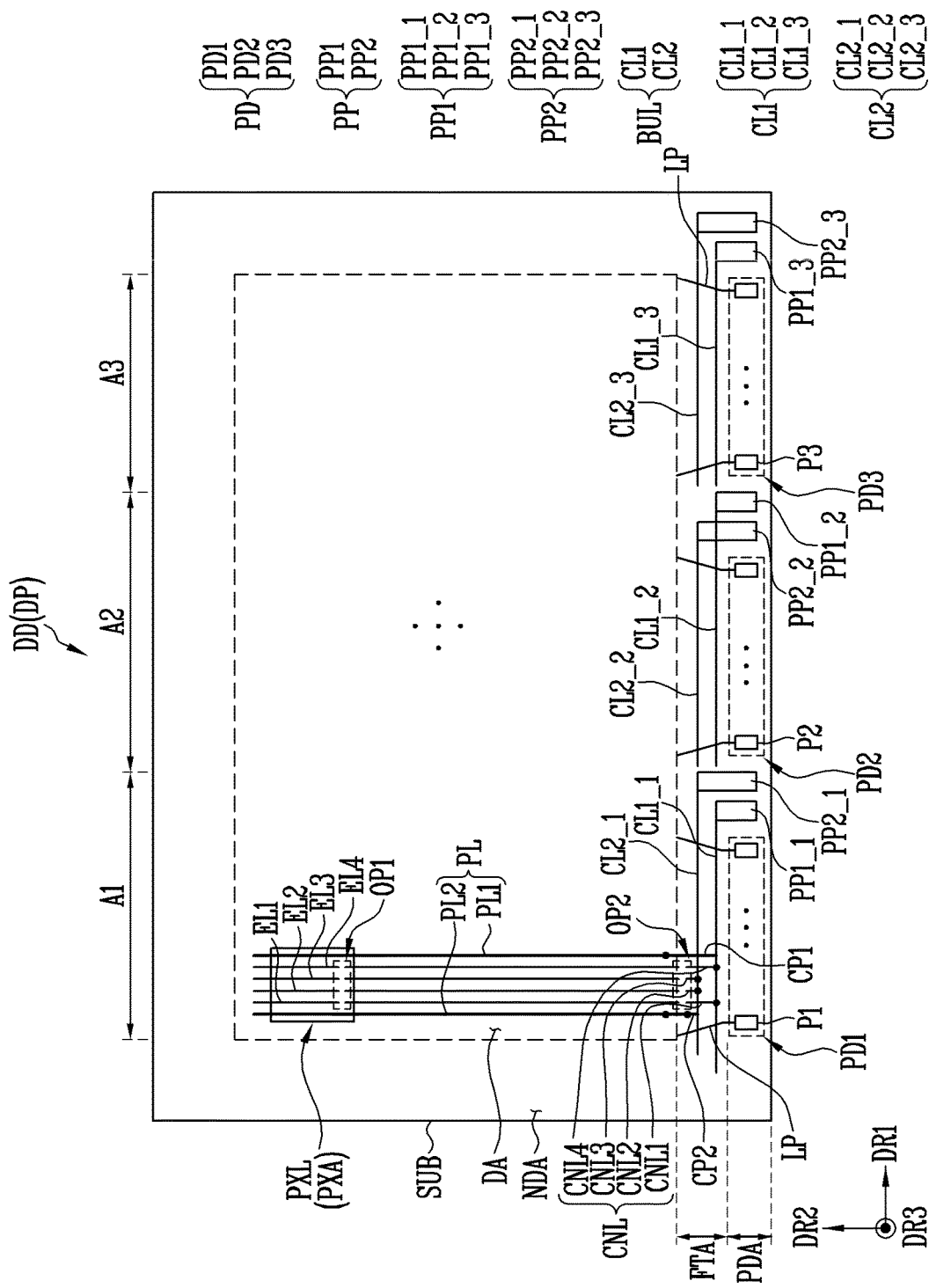
FIGS. 15 and 16 are plan views schematically illustrating a display device according to an embodiment of the present disclosure.
Figure 16:
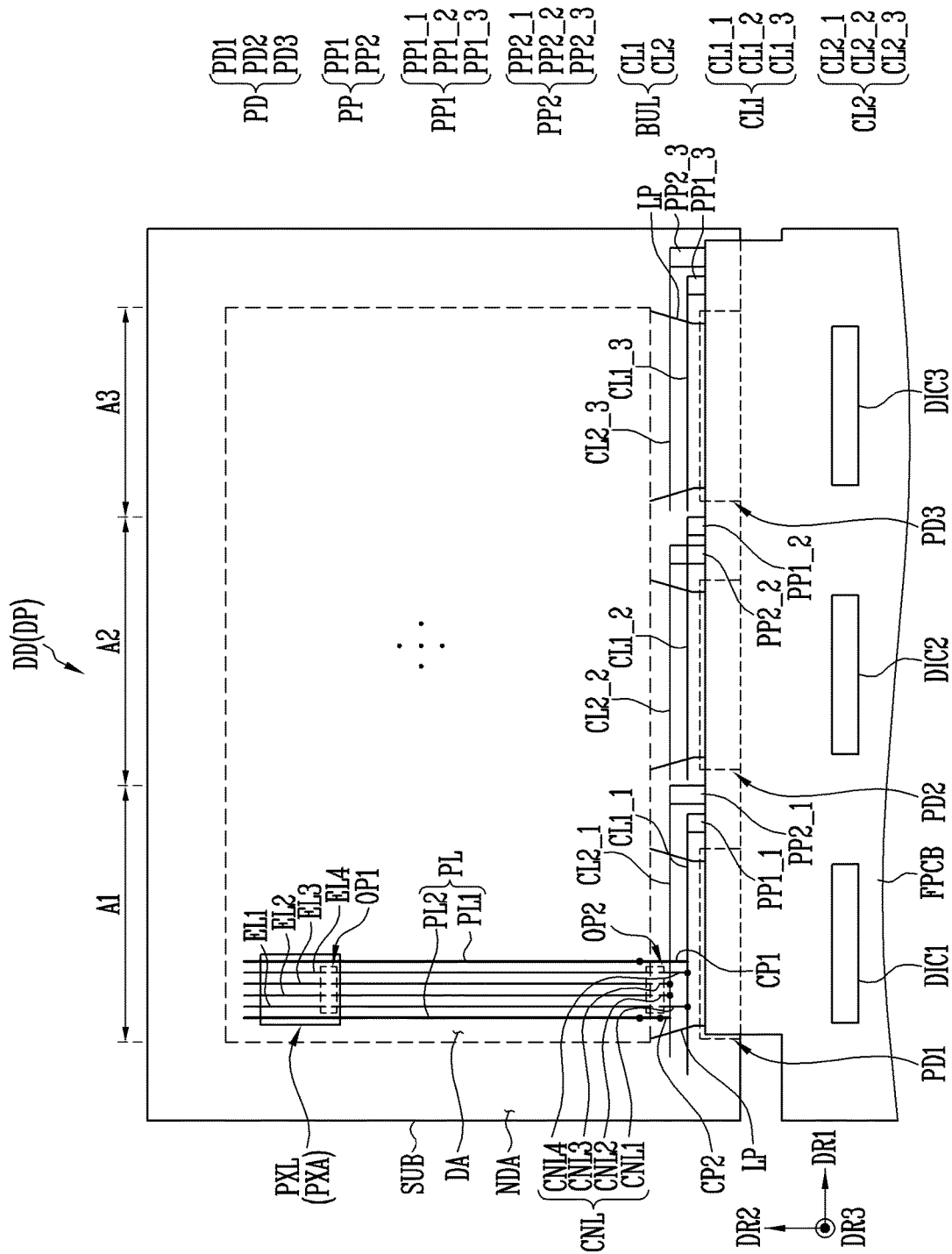
Figure 17:
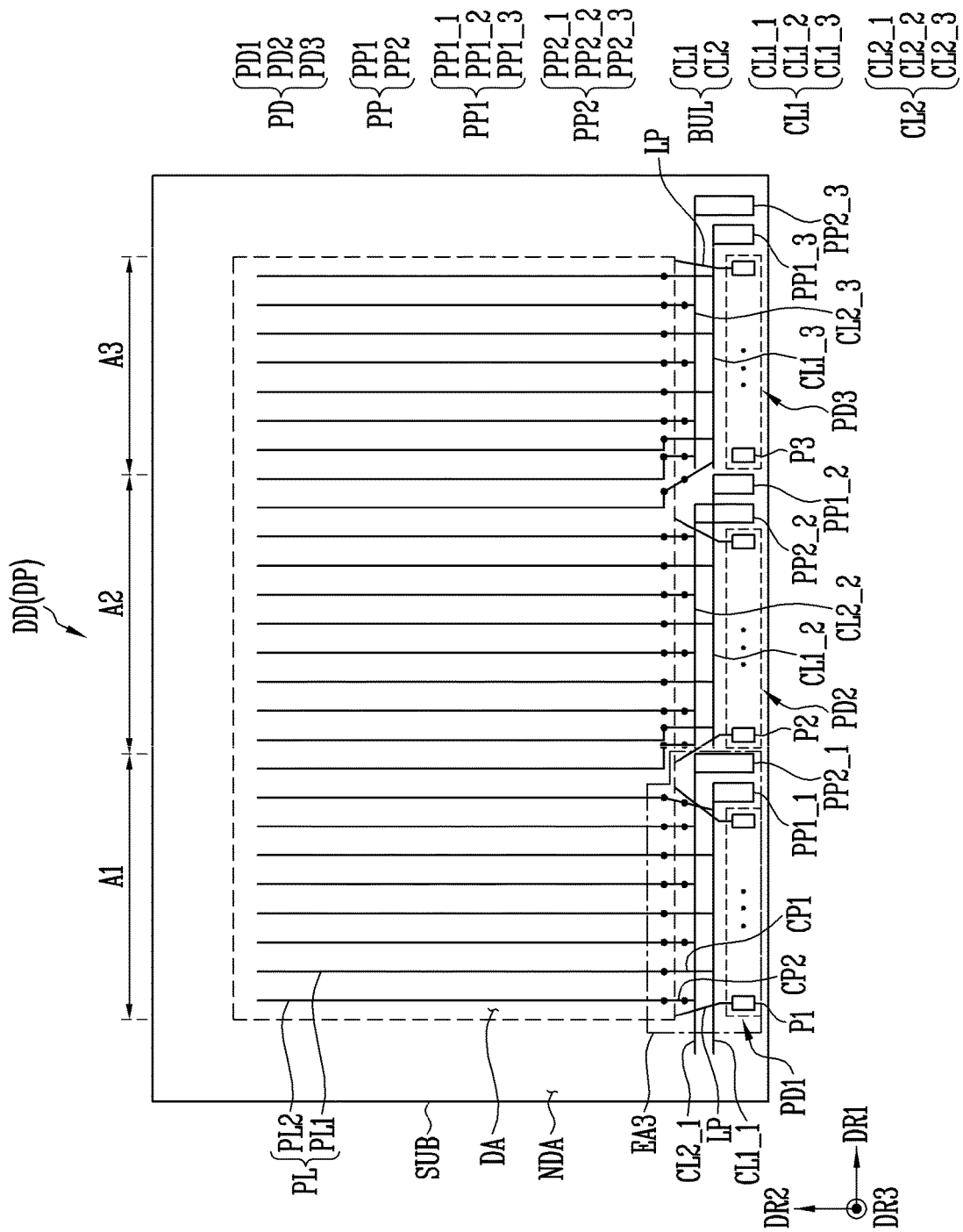
FIG. 17 is a plan view schematically illustrating a partial configuration of a display device before light emitting elements are aligned in the display device of FIG. 15.

FIGS. 15 and 16 are plan views schematically illustrating a display device DD according to one embodiment of the present disclosure, and FIG. 17 is a plan view schematically illustrating only a partial configuration of a display device DD before light emitting elements LD are aligned in the display device DD of FIG. 15. For example, FIG. 17 illustrates only the first power line PL1 and the second power line PL2 in the display region DA.

With respect to the display device DD of FIGS. 15-17, different points from the above-described embodiments will be mainly described to avoid redundant description.

Referring to FIGS. 15-17, the display device DD includes a substrate SUB, pixels PXL, a line portion LP, a pad portion PD, a circuit board FPCB, a bus line BUL, and a power pad portion PP.

The substrate SUB may include a display region DA and a non-display region NDA. In one embodiment, the display region DA may include a first region A1, a second region A2, and a third region A3 that are sequentially partitioned in the first direction DR1. That is, the display region DA may be partitioned into the first region A1, the second region A2, and the third region A3.

The first region A1 is one region of the display region DA provided with the pixels PXL electrically connected to first pads P1 provided in a first pad portion PD1 of the pad portion PD, the second region A2 is another region of the display region DA provided with the pixels PXL electrically connected to second pads P2 provided in a second pad portion PD2 of the pad portion PD, and the third region A3 is the other region of the display region provided with the pixels PXL electrically connected to third pads P3 provided in the a third pad portion PD3 of the pad portion PD.

The pixels PXL may be provided in a pixel region PXA in the display region DA of the substrate SUB. Each of the pixels PXL may include at least one light source, for example, at least the light emitting element LD illustrated in FIG. 1. In one embodiment, each of the pixels PXL may be the pixel PXL described with reference to FIG. 13.

A first electrode EL1, a second electrode EL2, a third electrode EL3, and a fourth electrode EL4 spaced from each other may be arranged in the pixel region PXA. At least one of the first electrode EL1, the second electrode EL2, the third electrode EL3, and the fourth electrode EL4 may be partially removed in a first open region OP1 located in the pixel region PXA.

A power line PL may be provided in the display region DA. The power line PL may include a first power line PL1 and a second power line PL2.

A plurality of first and second power lines PL1 and PL2 may be arranged in the display region DA at intervals of at least one pixel PXL (or pixel region PXA). For example, a plurality of first power lines PL1 may be provided to each of the first region A1, the second region A2, and the third region A3 and may each be spaced from the second power line PL2 by an interval of one pixel. A plurality of second power lines PL2 may be provided to each of the first region A1, the second region A2, and the third region A3 and may each be spaced from the first power line PL1 by an interval of one pixel.

The first power line PL1 may receive a first drive power supply voltage (refer to "VDD" of FIG. 4) from the first power pad PP1 through the first bus line CL1 during a period in which the display device DD is driven. For example, the first power line PL1 in the first region A1 may receive the first drive power supply voltage VDD from a $1\text{-}1^{th}$ power pad PP1_1 of the first power pad PP1 through a $1\text{-}1^{th}$ bus line CL1_1 during the period in which the display device DD is driven, the first power line PL1 in the second region A2 may receive the first drive power supply voltage VDD from a $1\text{-}2^{th}$ power pad PP1_2 of the first power pad PP1 through a $1\text{-}2^{th}$ bus line CL1_2 during the period in which the display device DD is driven, and the first power line PL1 in the third region A3 may receive the first drive power supply voltage VDD from a $1\text{-}3^{th}$ power pad PP1_3 of the first power pad PP1 through a $1\text{-}3^{th}$ bus line CL1_3 during the period in which the display device DD is driven.

The second power line PL2 may receive a second drive power supply voltage (refer to "VSS" of FIG. 4) from the second power pad PP2 through the second bus line CL2 during the period in which the display device DD is driven. For example, the second power line PL2 in the first region A1 may receive the second drive power supply voltage VSS from a $2\text{-}1^{th}$ power pad PP2_1 of the second power pad PP2 through a $2\text{-}1^{th}$ bus line CL2_1 during the period in which the display device DD is driven, the second power line PL2 in the second region A2 may receive the second drive power supply voltage VSS from a $2\text{-}2^{th}$ power pad PP2_2 of the second power pad PP2 through a $2\text{-}2^{th}$ bus line CL2_2 during the period in which the display device DD is driven, and the second power line PL2 in the third region A3 may receive the second drive power supply voltage VSS from a $2\text{-}3^{th}$ power pad PP2_3 of the second power pad PP2 through a $2\text{-}3^{th}$ bus line CL2_3 during the period in which the display device DD is driven.

The line portion LP may be provided (or located) in one region of the non-display region NDA of the substrate SUB, for example, in the fan-out region FTA.

The pad portion PD may be provided (or located) in another region of the non-display region NDA of the substrate SUB, for example, in the pad region PDA. The pad portion PD may include the first pad portion PD1, the second pad portion PD2, and the third pad portion PD3 spaced from each other. The first pad portion PD1 may include a plurality of first pads P1 electrically connected to the pixels PXL in the first region A1. The second pad portion PD2 may include a plurality of second pads P2 electrically connected to the pixels PXL in the second region A2. The third pad portion PD3 may include a plurality of third pads P3 electrically connected to the pixels PXL in the third region A3.

The circuit board FPCB may process various signals inputted from a printed circuit board and output the signals to the display panel DP. First to third drive circuits DIC1 to DIC3 may be mounted on the circuit board FPCB. The first drive circuit DIC1 may supply suitable signals (e.g., set or predetermined signals) to the pixels PXL1 in the first region A1 through the first pads P1 of the first pad portion PD1, the second drive circuit DIC2 may supply suitable signals (e.g., set or predetermined signals) to the pixels PXL2 in the second region A2 through the second pads P2 of the second pad portion PD2, and the third drive circuit DIC3 may supply suitable signals (e.g., set or predetermined signals) to the pixels PXL3 in the third region A3 through the third pads P3 of the third pad portion PD3. In one embodiment, the display region DA of the substrate SUB (or the display device DD) may be partitioned into the first to third regions A1 to A3 according to the first to third drive circuits DIC1, DIC2, and DIC3. The first region A1 may correspond to the first drive circuit DIC1, the second region A2 may correspond to the second drive circuit DIC2, and the third region A3 may correspond to the third drive circuit DIC3. When the number of drive circuits mounted on the circuit board FPCB is 4 or 5, the display region DA may be partitioned into four regions or five regions. Accordingly, the display region DA may be partitioned into a plurality of regions according to the number of drive circuits mounted on the circuit board FPCB.

The bus line BUL may surround (or be around) at least one side of the display region DA and may include the first bus line CL1 and the second bus line CL2. The first bus line CL1 may be connected to the first power line PL1 and the first power pad PP1. In one embodiment, the first bus line CL1 may be connected to the first power line PL1 through a first conductive pattern CP1. The second bus line CL2 may be connected to the second power line PL2 and the second power pad PP2. In one embodiment, the second bus line CL2 may be connected to the second power line PL2 through the second conductive pattern CP2.

The first conductive pattern CP1 is an intermediate medium that connects the first bus line CL1 to the first power line PL1 and may have one end connected to the first power line PL1 and the other end connected to the first bus line CL1. In one embodiment, the first conductive pattern CP1 may be provided integrally with the first bus line CL1.

The second conductive pattern CP2 is an intermediate medium that connects the second bus line CL2 to the second power line PL2 and may have one end connected to the second power line PL2 and the other end connected to the second bus line CL2. The second bus line CL2 may include an extension portion extending toward the second power line PL2. Here, the other end of the second conductive pattern CP2 may be connected to the extension portion.

The first bus line CL1 may include a 1-1$^{th}$ bus line CL1_1, a 1-2$^{th}$ bus line CL1_2, and a 1-3$^{th}$ bus line CL1_3 spaced from each other in the non-display region NDA. The second bus line CL2 may include a 2-1$^{th}$ bus line CL2_1, a 2-2$^{th}$ bus line CL2_2, and a 2-3$^{th}$ bus line CL2_3 spaced from each other in the non-display region NDA.

The 1-1$^{th}$ bus line CL1_1 and the 2-1$^{th}$ bus line CL2_1 may extend in the first direction DR1 in the non-display region NDA so as to correspond to the first region A1 of the display region DA. The 1-1$^{th}$ bus line CL1_1 may be electrically connected to the first power line PL1 in the first region A1 through the first conductive pattern CP1, and the 2-1$^{th}$ bus line CL2_1 may be electrically connected to the second power line PL2 in the first region A1 through the second conductive pattern CP2. In addition, the 1-1$^{th}$ bus line CL1_1 may be electrically connected to the 1-1$^{th}$ power pad PP1_1, and the 2-1$^{th}$ bus line CL2_1 may be electrically connected to the 2-1$^{th}$ power pad PP2_1.

The 1-2$^{th}$ bus line CL1_2 and the 2-2$^{th}$ bus line CL2_2 may extend in the first direction DR1 in the non-display region NDA so as to correspond to the second region A2 of the display region DA. The 1-2$^{th}$ bus line CL1_2 may be electrically connected to the first power line PL1 in the second region A2 through the first conductive pattern CP1, and the 2-2$^{th}$ bus line CL2_2 may be electrically connected to the second power line PL2 in the second region A2 through the second conductive pattern CP2. In addition, the 1-2$^{th}$ bus line CL1_2 may be electrically connected to the 1-2$^{th}$ power pad PP1_2, and the 2-2$^{th}$ bus line CL2_2 may be electrically connected to the 2-2$^{th}$ power pad PP2_2.

The 1-3$^{th}$ bus line CL1_3 and the 2-3$^{th}$ bus line CL2_3 may extend in the first direction DR1 in the non-display region NDA so as to correspond to the third region A3 of the display region DA. The 1-3$^{th}$ bus line CL1_3 may be electrically connected to the first power line PL1 in the third region A3 through the first conductive pattern CP1, and the 2-3$^{th}$ bus line CL2_3 may be electrically connected to the second power line PL2 in the third region A3 through the second conductive pattern CP2. In addition, the 1-3$^{th}$ bus line CL1_3 may be electrically connected to the 1-3$^{th}$ power pad PP1_3, and the 2-3$^{th}$ bus line CL2_3 may be electrically connected to the 2-3$^{th}$ power pad PP2_3.

Connection lines CNL may be located between each of the first to fourth electrodes EL1 to EL4 and the bus line BUL. The connection lines CNL may include first to fourth connection lines CNL1 to CNL4. The first connection line CNL1 may be located between the first electrode EL1 of each of the pixels PXL and the first bus line CL1, the second connection line CNL2 may be located between the second electrode EL2 of the corresponding pixel PXL and the second bus line CL2, the third connection line CNL3 may be located between the third electrode EL3 of the corresponding pixel PXL and the second bus line CL2, and the fourth connection line CNL4 may be located between the fourth electrode EL4 of the corresponding pixel PXL and the first bus line CL1.

One end of the first connection line CNL1 may be connected to the first bus line CL1 and may extend toward the first electrode EL1 between the first electrode EL1 and the first bus line CL1. The other end of the first connection line CNL1 may be disconnected and floated in a second open region OP2. The first connection line CNL1 may be connected to the first electrode EL1 in a step of aligning the light emitting elements LD during a process of manufacturing the display device DD to transmit a first alignment signal applied from the first power pad PP1 through the first bus line CL1 to the first electrode EL1.

One end of the second connection line CNL2 may be connected to the second bus line CL2 and may extend toward the second electrode EL2 between the second electrode EL2 and the second bus line CL2. The other end of the second connection line CNL2 may be disconnected and floated in the second open region OP2. The second connection line CNL2 may be connected to the second electrode EL2 in the step of aligning the light emitting elements LD described above to transmit a second alignment signal applied from the second power pad PP2 through the second bus line CL2 to the second electrode EL2.

One end of the third connection line CNL3 may be connected to the second bus line CL2 and extend toward the third electrode EL3 between the third electrode EL3 and the second bus line CL2. The other end of the third connection line CNL3 may be disconnected and floated in the second open region OP2. The third connection line CNL3 may be connected to the third electrode EL3 in the step of aligning the light emitting elements LD described above to transmit the second alignment signal applied from the second power pad PP2 through the second bus line CL2 to the third electrode EL3.

One end of the fourth connection line CNL4 may be connected to the first bus line CL1 and extend toward the fourth electrode EL4 between the fourth electrode EL4 and the first bus line CL1. The fourth connection line CNL4 may be connected to the fourth electrode EL4 in the step of aligning the light emitting elements LD described above to transmit the first alignment signal applied from the first power pad PP1 through the first bus line CL1 to the fourth electrode EL4.

In the step of aligning the light emitting elements LD described above, the same alignment signal, for example, the first alignment signal may be supplied to the first electrode EL1 and the fourth electrode EL4 of each of the pixels PXL, and the same alignment signal, for example, the second alignment signal may be supplied to the second electrode EL2 and the third electrode EL3 of the corresponding pixel PXL. In one embodiment, the first alignment signal may be a DC signal, and the second alignment signal may be an AC signal.

The power pad portion PP may include the first power pad PP1 and the second power pad PP2. The power pad portion PP may be located in one region between adjacent pad portions PD in the non-display region NDA.

The first power pad PP1 may be connected to the first bus line CL1. For example, the first power pad PP1 may be provided integrally with the first bus line CL1 to be connected to the first bus line CL1. When the display device DD is driven, the first power pad PP1 may receive the first drive power supply voltage VDD and transmit the first drive power supply voltage VDD to the first power line PL1 through the first bus line CL1. The first power pad PP1 may receive the first alignment signal in the step of aligning the light emitting elements LD and transmit the first alignment signal to each of the first and fourth electrodes EL1 and EL4 of each of the pixels PXL through the first bus line CL1.

In one embodiment, the first power pad PP1 may include a $1\text{-}1^{th}$ power pad PP1_1, a $1\text{-}2^{th}$ power pad PP1_2, and a $1\text{-}3^{th}$ power pad PP1_3 spaced from each other. The $1\text{-}1^{th}$ power pad PP1_1 may be located in one region between the first pad portion PD1 and the second pad portion PD2 in the non-display region NDA. The $1\text{-}2^{th}$ power pad PP1_2 may be located in one region between the second pad portion PD2 and the third pad portion PD3 in the non-display region NDA. The $1\text{-}3^{th}$ power pad PP1_3 may be located in one region of the outside of (outside) the third pad portion PD3 in the non-display region NDA.

The $1\text{-}1^{th}$ power pad PP1_1 may be provided integrally with the $1\text{-}1^{th}$ bus line CL1_1 to be connected to the $1\text{-}1^{th}$ bus line CL1_1. The $1\text{-}2^{th}$ power pad PP1_2 may be provided integrally with the $1\text{-}2^{th}$ bus line CL1_2 to be connected to the $1\text{-}2^{th}$ bus line CL1_2. The $1\text{-}3^{th}$ power pad PP1_3 may be provided integrally with the $1\text{-}3^{th}$ bus line CL1_3 to be connected to the $1\text{-}3^{th}$ bus line CL1_3.

The second power pad PP2 may be connected to the second bus line CL2. For example, the second power pad PP2 may be provided integrally with the second bus line CL2 to be connected to the second bus line CL2. When the display device DD is driven, the second power pad PP2 may receive the second drive power supply voltage VSS and transmit the second drive power supply voltage VSS to the second power line PL2 through the second bus line CL2. The second power pad PP2 may receive the second alignment signal in the step of aligning the light emitting elements LD and transmit the second alignment signal to each of the second and third electrodes EL2 and EL3 of each of the pixels PXL through the second bus line CL2.

In one embodiment, the second power pad PP2 may include a $2\text{-}1^{th}$ power pad PP2_1, a $2\text{-}2^{th}$ power pad PP2_2, and a $2\text{-}3^{th}$ power pad PP2_3 spaced from each other. The $2\text{-}1^{th}$ power pad PP2_1 may be located in one region between the first pad portion PD1 and the second pad portion PD2 in the non-display region NDA. The $2\text{-}2^{th}$ power pad PP2_2 may be located in one region between the second pad portion PD2 and the third pad portion PD3 in the non-display region NDA. The $2\text{-}3^{th}$ power pad PP2_3 may be located in one region of the outside of (or outside) the third pad portion PD3 in the non-display region NDA.

The $2\text{-}1^{th}$ power pad PP2_1 may be provided integrally with the $2\text{-}1^{th}$ bus line CL2_1 to be connected to the $2\text{-}1^{th}$ bus line CL2_1. The $2\text{-}2^{th}$ power pad PP2_2 may be provided integrally with the $2\text{-}2^{th}$ bus line CL2_2 to be connected to the $2\text{-}2^{th}$ bus line CL2_2. The $2\text{-}3^{th}$ power pad PP2_3 may be provided integrally with the $2\text{-}3^{th}$ bus line CL2_3 to be connected to the $2\text{-}3^{th}$ bus line CL2_3.

The power pad portion PP described above may be located in one region of the non-display region NDA so as not to overlap the line portion LP in the fan-out region FTA. Because the power pad portion PP does not overlap the line portion LP, components arranged under the power pad portion PP may be reduced or minimized, thereby reducing or minimizing occurrence of a step difference due to the components.

In one embodiment of the present disclosure, the $1\text{-}1^{th}$ power pad PP1_1 and the $2\text{-}1^{th}$ power pad PP2_1 may be provided on different layers to be electrically disconnected from each other. In addition, the $1\text{-}1^{th}$ bus line CL1_1 and the $2\text{-}1^{th}$ bus line CL2_1 may be provided on different layers to be electrically disconnected from each other. The first conductive pattern CP1 and the second conductive pattern CP2 may be provided at the same layer. For example, the first and second conductive patterns CP1 and CP2 may be provided at the same layer as the first bus line CL1.

As described above, while the power pad portion PP is designed so as not to overlap the line portion LP, the first and second bus lines CL1 and CL2 and the first and second power pads PP1 and PP2 may be separated to correspond to the first to third regions A1 to A3, the first bus line CL1 and the first power pad PP1 may be formed on a layer different from the second bus line CL2 and the second power pad PP2, and thereby, an overlapping area of three components (for example, the power pad portion PP, the bus line BUL, and the line portion LP) is reduced or minimized in the non-display region NDA to improve step coverage of the above-described configurations. By improving the step coverage, burnt failure that may occur in a portion where the line portion LP, the power pad portion PP, and the bus line BUL overlap each other may be reduced or minimized.

The power pad portion PP, the line portion LP, and the bus line BUL respectively corresponding to the first to third regions A1 to A3 may have substantially the same structure as or similar structures to each other. Hereinafter, only an arrangement relationship and a stacked structure of the line portion LP, the bus line BUL, and the power pad portion PP corresponding to the first region A1 will be described with reference to FIGS. 18A-18C.

Figure 18A:
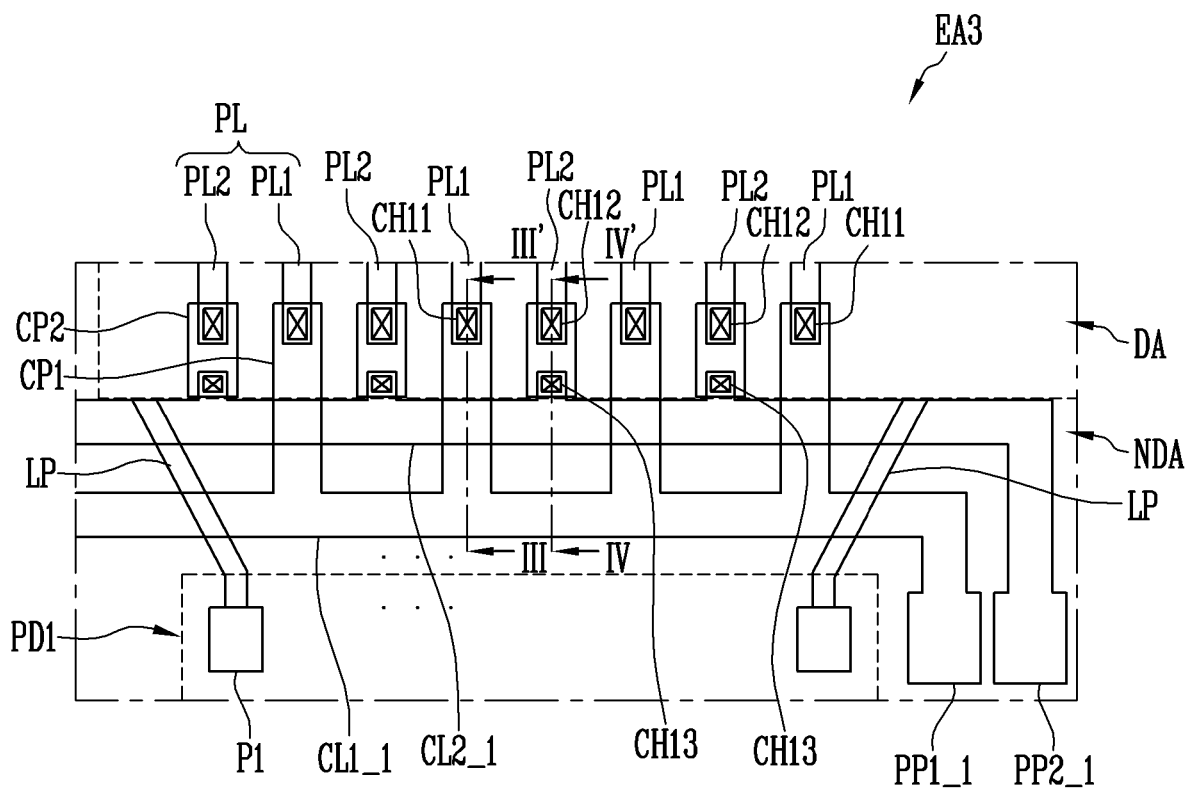
FIG. 18A is a schematic enlarged view of EA3 of FIG. 17.
Figure 18B:
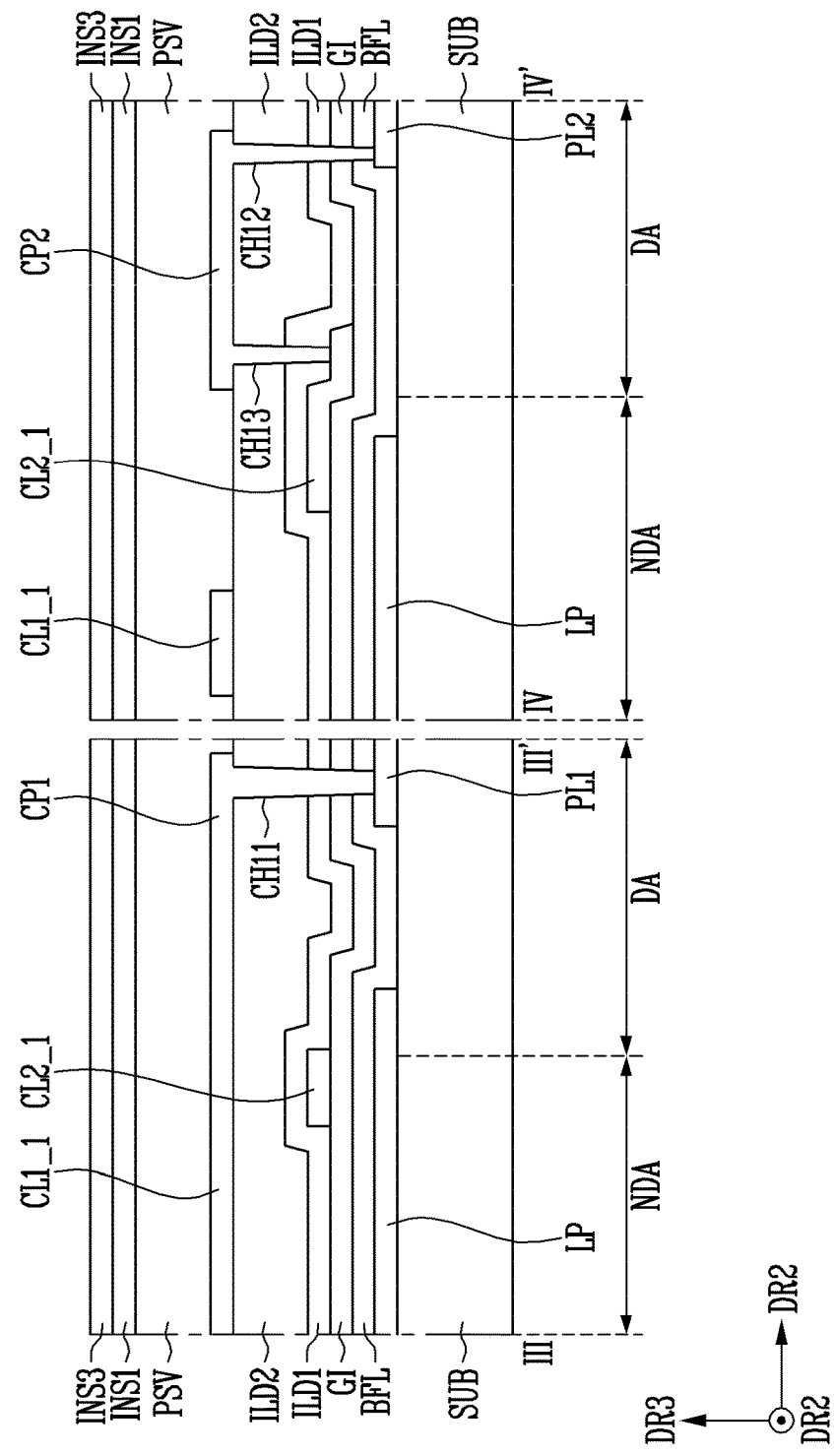
FIGS. 18B and 18C are schematic cross-sectional views taken along the line III-III' and the line IV-IV' of FIG. 18A respectively.
Figure 18C:
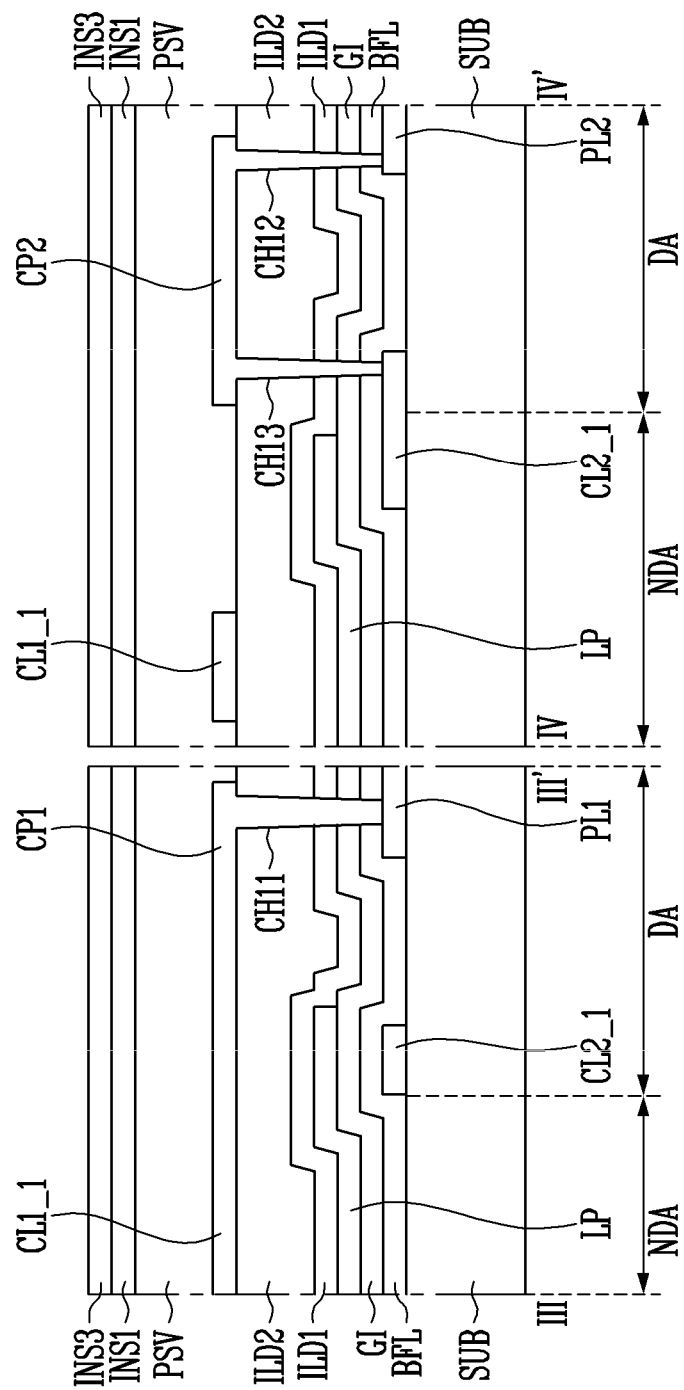
Figure 18D:
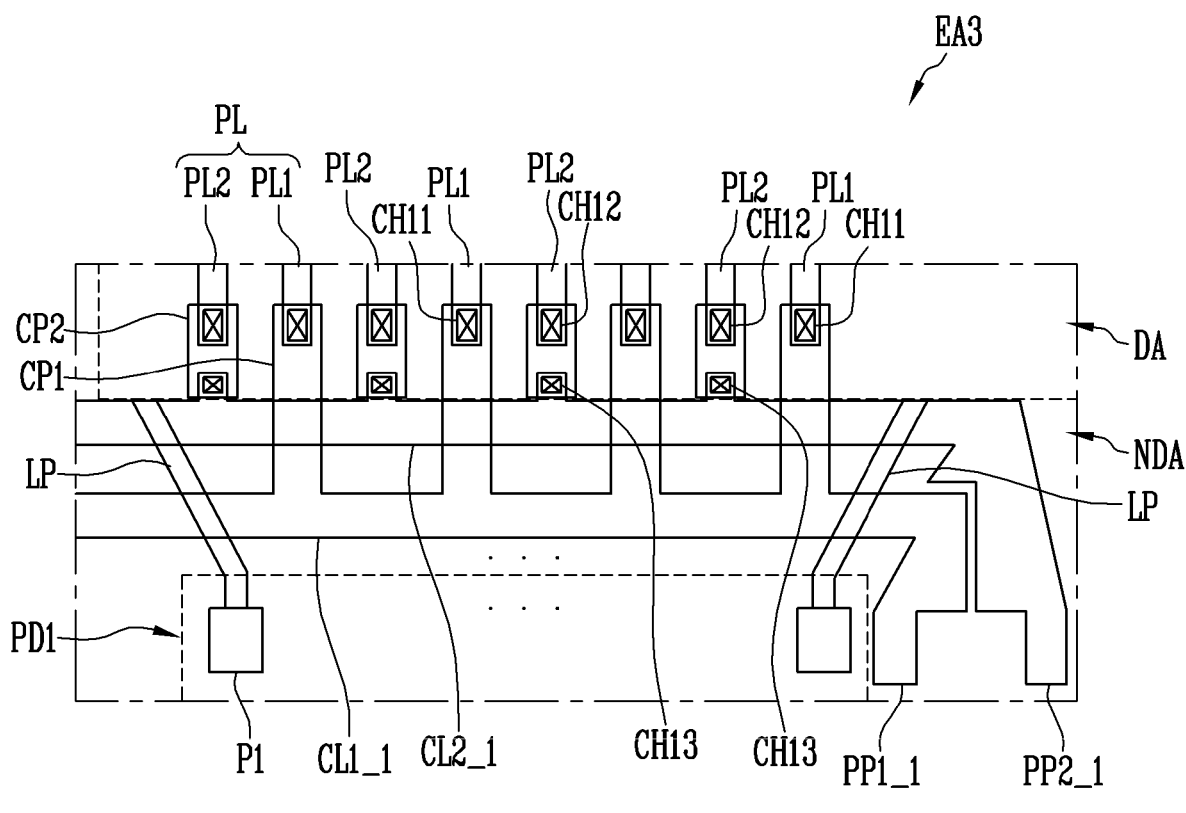
FIGS. 18D and 18E are schematic plan views in which a $1\text{-}1^{th}$ power pad and a $2\text{-}1^{th}$ power pad of FIG. 18A are formed according to another embodiment.
Figure 18E:
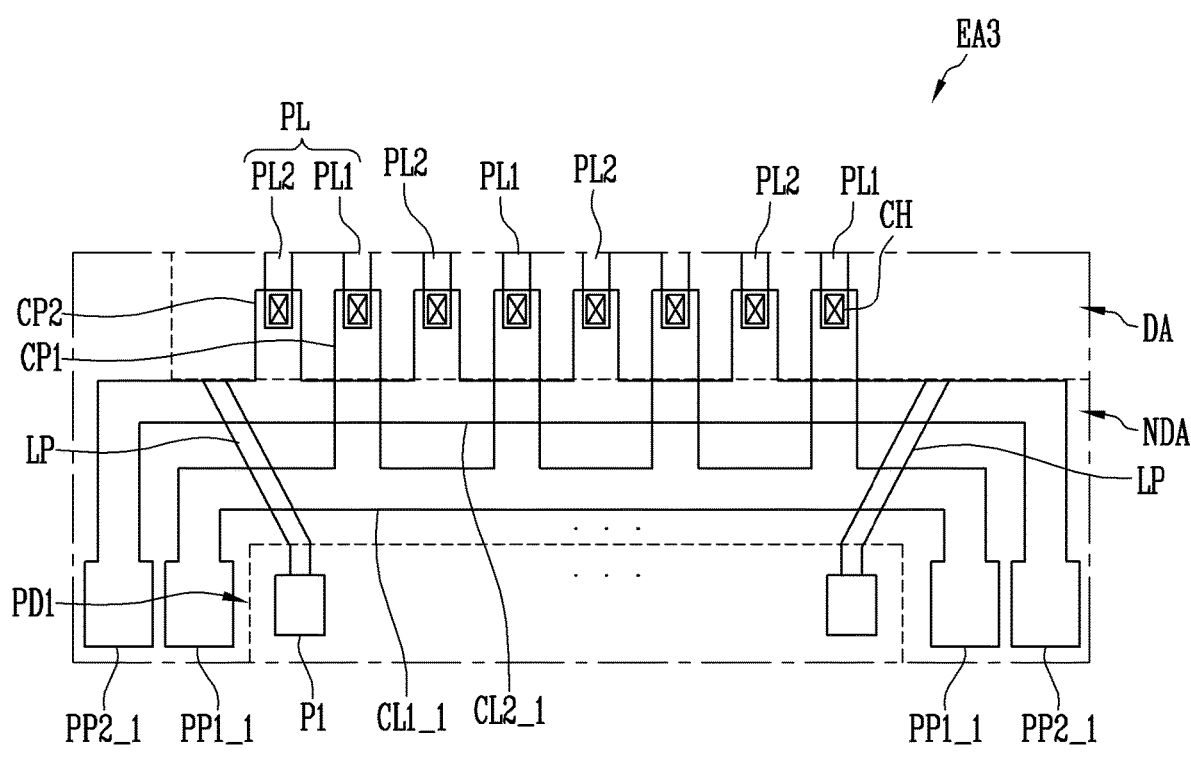

FIG. 18A is a schematic enlarged view of EA3 of FIG. 17, and FIGS. 18B and 18C are schematic cross-sectional views taken along the line III-III' and the line IV-IV' of FIG. 18A, and FIGS. 18D and 18E are schematic plan views in which the $1\text{-}1^{th}$ power pad PP1_1 and the $2\text{-}1^{th}$ power pad PP2_1 of FIG. 18A are formed according to another embodiment.

Referring to FIGS. 15-18E, a plurality of first power lines PL1 and a plurality of second power lines PL2 may be located in a first region A1 in a display region DA of a substrate SUB.

A first pad portion PD1, a $1\text{-}1^{th}$ power pad PP1_1, a $2\text{-}1^{th}$ power pad PP2_1, a line portion LP, a $1\text{-}1^{th}$ bus line CL1_1, a $2\text{-}1^{th}$ bus line CL2_1, and first and second conductive patterns CP1 and CP2 may be located in a non-display region NDA on at least one side of the first region A1.

In one embodiment, the $1\text{-}1^{th}$ bus line CL1_1, the first conductive pattern CP1, and the $1\text{-}1^{th}$ power pad PP1_1 may be provided integrally with each other and may be located at the same layer.

The $2\text{-}1^{th}$ bus line CL2_1 and the $2\text{-}1^{th}$ power pad PP2_1 may be provided integrally and may be located at the same layer. The second conductive pattern CP2 may be located at the same layer as the first conductive pattern CP1 and may have an independent configuration separate from the 2-1$^{th}$ bus line CL2_1 and the 2-1$^{th}$ power pad PP2_1. For example, one end of the second conductive pattern CP2 may be connected to an extension portion of the 2-1$^{th}$ bus line CL2_1 through a 13th contact hole CH13.

The first and second conductive patterns CP1 and CP2 may extend in a direction toward each first power line PL1 and each second power line PL2, respectively, for example, in a second direction DR2. The 1-1$^{th}$ and 2-1$^{th}$ bus lines CL1_1 and CL2_1 may extend in a first direction DR1 crossing the second direction DR2. In one embodiment, the first conductive pattern CP1 may overlap the 2-1$^{th}$ bus line CL2_1 when viewed in a plane.

A plurality of insulating layers and a plurality of conductive layers may be arranged on the substrate SUB. The insulating layers may include a buffer layer BFL, a gate insulating layer GI, first and second interlayer insulating layers ILD1 and ILD2, a passivation layer PSV, and first and third insulating layers INS1 and INS3. The conductive layers may include a first conductive layer between the substrate SUB and the buffer layer BFL, a second conductive layer between the gate insulating layer GI and the first interlayer insulating layer ILD1, and a third conductive layer between the second interlayer insulating layer ILD2 and the passivation layer PSV. However, the insulating layers and the conductive layers on the substrate SUB are not limited to the above-described embodiments, and in some embodiments, another insulating layer and another conductive layer in addition to the insulating layers and the conductive layers described above may also be provided on the substrate SUB. The buffer layer BFL, the gate insulating layer GI, the first and second interlayer insulating layers ILD1 and ILD2, the passivation layer PSV, and the first and third insulating layers INS1 and INS3 described above may be the buffer layer BFL, the gate insulating layer GI, the first and second interlayer insulating layers ILD1 and ILD2, the passivation layer PSV, and the first and third insulating layers INS1 and INS3 described with reference to FIG. 6, respectively.

The 1-1$^{th}$ power pad PP1_1 and the 2-1$^{th}$ power pad PP2_1 may be designed to have the same size (or area). However, the present disclosure is not limited thereto, and in some embodiments, the 1-1$^{th}$ power pad PP1_1 and the 2-1$^{th}$ power pad PP2_1 may also be designed to have sizes (or areas) different from each other. The sizes of the 1-1$^{th}$ and 2-1$^{th}$ power pads PP1_1 and PP2_1 may be variously changed to meet the requirements (or design conditions) of the display device DD to be applied.

The 1-1$^{th}$ power pad PP1_1 and the 2-1$^{th}$ power pad PP2_1 may have a bar shape or a rectangular shape extending in the second direction DR2, as illustrated in FIG. 18A, but the present disclosure is not limited thereto. In some embodiments, the 1-1$^{th}$ power pad PP1_1 and the 2-1$^{th}$ power pad PP2_1 may also have a polygonal shape as illustrated in FIG. 18D. The shapes of the 1-1$^{th}$ power pad PP1_1 and the 2-1$^{th}$ power pad PP2_1 may be variously changed within a range in which the 1-1$^{th}$ power pad PP1_1 and the 2-1$^{th}$ power pad PP2_1 are electrically and stably connected to the corresponding bus lines and electrically disconnected from the adjacent power pads.

In some embodiments, the 1-1$^{th}$ power pad PP1_1 may also be located on one side of the first pad portion PD1 and the other side of the first pad portion PD1 with the first pad portion PD1 interposed therebetween. For example, as illustrated in FIG. 18E, the 1-1$^{th}$ power pad PP1_1 may be located on one side (for example, left) of the first pad portion PD1 and the other side (for example, right) of the first pad portion PD1. In this case, one of both ends of the 1-1$^{th}$ bus line CL1_1 may be provided integrally with the 1-1$^{th}$ power pad PP1_1 on one side of the first pad portion PD1 to be connected to the 1-1$^{th}$ power pad PP1_1. In addition, the other ones of both ends of the 1-1$^{th}$ bus line CL1_1 may be provided integrally with the 1-1$^{th}$ power pad PP1_1 on the other side of the first pad portion PD1 to be connected to the 1-1$^{th}$ power pad PP1_1. In this case, the 1-1$^{th}$ bus line CL1_1 may be provided integrally with the first conductive pattern CP1 to be connected to each first power line PL1 in the display region DA through one contact hole CH.

Likewise, the 2-1$^{th}$ power pad PP2_1 may also be located on one side of the first pad portion PD1 and the other side of the first pad portion PD1 with the first pad portion PD1 interposed therebetween. For example, as illustrated in FIG. 18E, the 2-1$^{th}$ power pad PP2_1 may be located on one side of the first pad portion PD1 and the other side of the first pad portion PD1. In this case, one of both ends of the 2-1$^{th}$ bus line CL2_1 may be provided integrally with the 2-1$^{th}$ power pad PP2_1 on one side of the first pad portion PD1 to be connected to the 2-1$^{th}$ power pad PP2_1. In addition, the other ones of both ends of the 2-1$^{th}$ bus line CL2_1 may be provided integrally with the 2-1$^{th}$ power pad PP2_1 on the other side of the first pad portion PD1 to be connected to the 2-1$^{th}$ power pad PP2_1. In this case, the 2-1$^{th}$ bus line CL2_1 may be provided integrally with the second conductive pattern CP2, and may be connected to each second power line PL2 in the display region DA through one contact hole CH.

In one embodiment, the 1-1$^{th}$ power pad PP1_1, the 1-1$^{th}$ bus line CL1_1, and the first conductive pattern CP1 provided integrally with each other may be provided on a layer different from the 2-1$^{th}$ power pad PP2_1, the 2-1$^{th}$ bus line CL2_1, and the second conductive pattern CP2. For example, the 1-1$^{th}$ power pad PP1_1, the 1-1$^{th}$ bus line CL1_1, and the first conductive pattern CP1 provided integrally with each other may also be located over or under the 2-1$^{th}$ power pad PP2_1, the 2-1$^{th}$ bus line CL2_1, and the second conductive pattern CP2 provided integrally with at least one insulating layer interposed therebetween.

Hereinafter, a stacked structure of the components illustrated in FIG. 18A will be described with reference to FIGS. 18B and 18C.

First, referring to FIG. 18B, a line portion LP, respective first power lines PL1, and respective second power lines PL2 may be arranged (or disposed) on the substrate SUB. The line portion LP, the respective first power lines PL1, and the respective second power lines PL2 may be a first conductive layer. In one embodiment, the first power lines PL1, the second power lines PL2, and the line portion LP may be formed through the same process and may be located at the same layer.

The buffer layer BFL may be arranged on the first conductive layer. The gate insulating layer GI may be arranged on the buffer layer BFL.

The 2-1$^{th}$ bus line CL2_1 may be arranged on the gate insulating layer GI. As described above, the 2-1$^{th}$ bus line CL2_1 is provided integrally with the 2-1$^{th}$ power pad PP2_1, and thus, the 2-1$^{th}$ power pad PP2_1 may also be arranged on the gate insulating layer GI. In one embodiment, the 2-1$^{th}$ bus line CL2_1 and the 2-1$^{th}$ power pad PP2_1 may be a second conductive layer.

The first and second interlayer insulating layers ILD1 and ILD2 may be arranged on the second conductive layer.

The 1-1$^{th}$ bus line CL1_1, the first conductive pattern CP1, and the second conductive pattern CP2 may be arranged on the second interlayer insulating layer ILD2. As described above, because the 1-1$^{th}$ bus line CL1_1 is provided integrally with the 1-1$^{th}$ power pad PP1_1, the 1-1$^{th}$ power pad PP1_1 may also be arranged on the second interlayer insulating layer ILD2. In one embodiment, the 1-1$^{th}$ bus line CL1_1, the 1-1$^{th}$ power pad PP1_1, and the first and second conductive patterns CP1 and CP2 may be a third conductive layer.

Here, the first conductive pattern CP1 may be provided integrally with the 1-1$^{th}$ bus line CL1_1. The first conductive pattern CP1 may be connected to the first power line PL1 through an eleventh contact hole CH11 sequentially penetrating the buffer layer BFL, the gate insulating layer GI, and the first and second interlayer insulating layers ILD1 and ILD2. As a result, when the display device DD is driven, the 1-1$^{th}$ power pad PP1_1 receiving the first drive power supply voltage VDD may transmit the first drive power supply voltage VDD to each of the first power lines PL1 through the 1-1$^{th}$ bus line CL1_1, the first conductive pattern CP1, and the eleventh contact hole CH11.

One end of the second conductive pattern CP2 may be connected to each of the second power lines PL2 through a twelfth contact hole CH12 sequentially penetrating the buffer layer BFL, the gate insulating layer GI, and the first and second interlayer insulating layers ILD1 and ILD2. In addition, the other end of the second conductive pattern CP2 may be connected to the 2-1$^{th}$ bus line CL2_1 through the thirteenth contact hole CH13 sequentially penetrating the first and second interlayer insulating layers ILD1 and ILD2. As a result, when the display device DD is driven, the 2-1$^{th}$ power pad PP2_1 receiving the second drive power supply voltage VSS may transmit the second drive power supply voltage VSS to each of the second power lines PL2 through the 2-1$^{th}$ bus line CL2_1, the thirteenth contact hole CH13, the second conductive pattern CP2, and a twelfth contact hole CH12.

The passivation layer PSV, the first insulating layer INS1, and the third insulating layer INS3 may be sequentially arranged on the above-described third conductive layer.

Each of the first power lines PL1 and the 1-1$^{th}$ bus line CL1_1 may be electrically connected to each other through one eleventh contact hole CH11. In this case, one eleventh contact hole CH11 may be located in one region of the display region DA without being located in the fan-out region FTA in which the line portion LP is arranged. However, the present disclosure is not limited thereto, and in some embodiments, a position of one eleventh contact hole CH11 may be variously changed within a range in which one eleventh contact hole CH11 is not located in the fan-out region FTA.

Each of the second power lines PL2 and the 2-1$^{th}$ bus line CL2_1 may be electrically connected to each other through two contact holes, for example, the twelfth contact hole CH12 and the thirteenth contact hole CH13. In this case, the twelfth contact hole CH12 and the thirteenth contact hole CH13 may be located in one region of the display region DA without being located in the fan-out region FTA. However, the present disclosure is not limited thereto, and in some embodiments, positions of the twelfth and thirteenth contact holes CH12 and CH13 may be variously changed within a range in which the twelfth and thirteenth contact holes CH12 and CH13 are located in the fan-out region FTA and do not overlap the line portion LP.

As described above, while designing the power pad portion PP so as not to overlap the line portion LP, by reducing or minimizing an area of a stacked structure in which each of the first power line PL1, each of the second power line PL2, the 1-1$^{th}$ bus line CL1_1, the 2-1$^{th}$ bus line CL2_1, the first conductive pattern CP1, the second conductive pattern CP2, the line portion LP, the 1-1$^{th}$ power pad PP1_1, and the 2-1$^{th}$ power pad PP2_1 are formed to overlap each other, a step difference of the insulating layers located between the above-described components may be reduced, thereby improving a step coverage.

In addition, as described above, while the 1-1$^{th}$ bus line CL1_1 and the 1-1$^{th}$ power pad PP1_1 are integrally formed and the 2-1$^{th}$ bus line CL2_1 and the 2-1$^{th}$ power pad PP2_1 are integrally formed, the number of connection members for finally connecting the power line PL to the power pad portion PP, for example, the number of contact holes are reduced and the contact holes are located so as not to overlap the line portion LP, and thereby, contact failure between the power line PL and the power pad portion PP may reduce or may be minimized.

In the above-described embodiment, it is described that the line portion LP is constituted by a first conductive layer on the substrate SUB and the 2-1$^{th}$ bus line CL2_1 and the 2-1$^{th}$ power pad PP2_1 are constituted on the gate insulating layer GI, but the present disclosure is not limited thereto. In some embodiments, as illustrated in FIG. 18C, the line portion LP may be constituted by a second conductive layer on the gate insulating layer GI, and the 2-1$^{th}$ bus line CL2_1 and the 2-1$^{th}$ power pad PP2_1 may be constituted by a first conductive layer on the substrate SUB. In this case, the 2-1$^{th}$ bus line CL2_1 and the 2-1$^{th}$ power pad PP2_1 may be formed by the same process as each of the first power lines PL1 and each of the second power lines PL2 to be provided at the same layer. In addition, in this case, one end of the second conductive pattern CP2 may be connected to each the second power lines PL2 through the twelfth contact hole CH12 sequentially penetrating the buffer layer BFL, the gate insulating layer GI, and the first and second interlayer insulating layers ILD1 and ILD2, and the other end of the second conductive pattern CP2 may be connected to the 2-1$^{th}$ bus line CL2_1 through the thirteenth contact hole CH13 sequentially penetrating the buffer layer BFL, the gate insulating layer GI, and the first and second interlayer insulating layers ILD1 and ILD2.

A stacked structure of each of the first and second bus lines CL1 and CL2 (for example, a first configuration), the first and second conductive patterns CP1 and CP2 (for example, a second configuration), and the line portion LP (for example, a third configuration) is not limited to the above-described embodiments. The 1-1$^{th}$ and 2-1$^{th}$ bus lines CL1_1 and CL2_1, the first and second conductive patterns CP1 and CP2, and the line portion LP may be constituted by an appropriate conductive layer selected from conductive layers arranged on the substrate SUB within a range in which a stacked structure formed by overlapping all of the first configuration, the second configuration, and the third configuration is reduced or minimized.

Figure 19:
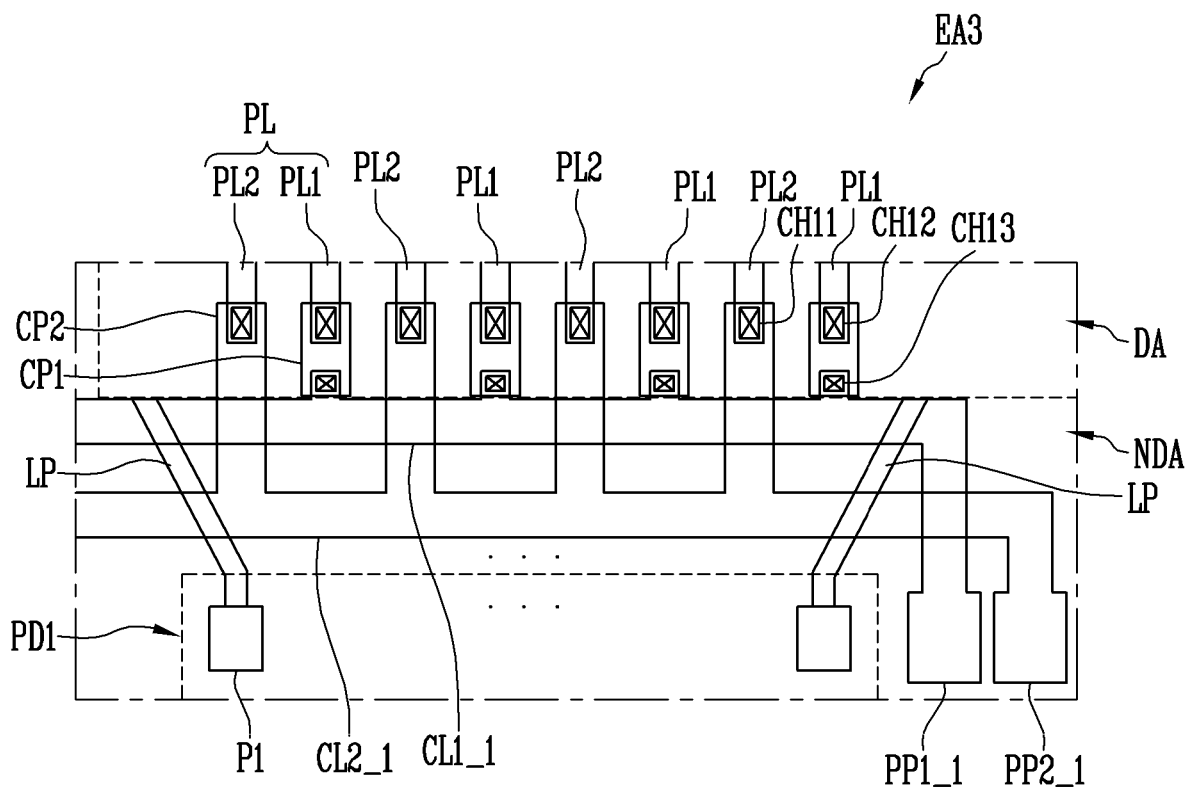
FIG. 19 is a schematic plan view of a connection line, a bus line, and a power pad of FIG. 18A according to another embodiment.

FIG. 19 is a schematic plan view illustrating the connection line, the bus line, and the power pad of FIG. 18A, according to another embodiment.

Different points from the above-described embodiments will be mainly described with reference to FIG. 19 to avoid redundant description.

First, referring to FIGS. 15-17 and FIG. 19, one end of the first conductive pattern CP1 may be connected to each of the first power lines PL1 through the twelfth contact hole CH12, and the other end of the first conductive pattern CP1 may be connected to the 1-1$^{th}$ bus line CL1_1 through the thirteenth contact hole CH13. For example, the other end of the first conductive pattern CP1 may be connected to an extension portion of the 1-1$^{th}$ bus line CL1_1 extending in a direction of each of the first power lines PL1 through the thirteenth contact hole CH13. The first conductive pattern CP1 described above may have an independent configuration different from the 1-1$^{th}$ bus line CL1_1 and the 1-1$^{th}$ power pad PP1_1 without being formed integrally with the 1-1$^{th}$ bus line CL1_1.

One end of the second conductive pattern CP2 may be connected to each of the second power lines PL2 through the eleventh contact hole CH11, and the other end thereof may be provided integrally with the 2-1$^{th}$ bus line CL2_1 to be connected to the 2-1$^{th}$ bus line CL2_1. The second conductive pattern CP2 may overlap the 1-1$^{th}$ bus line CL1_1 when viewed in a plane. In addition, the second conductive pattern CP2 may extend toward each of the second power lines PL2 in the extension direction DR2 crossing an extension direction of the 1-1$^{th}$ bus line CL1_1, for example, the first direction DR1.

Figure 20:
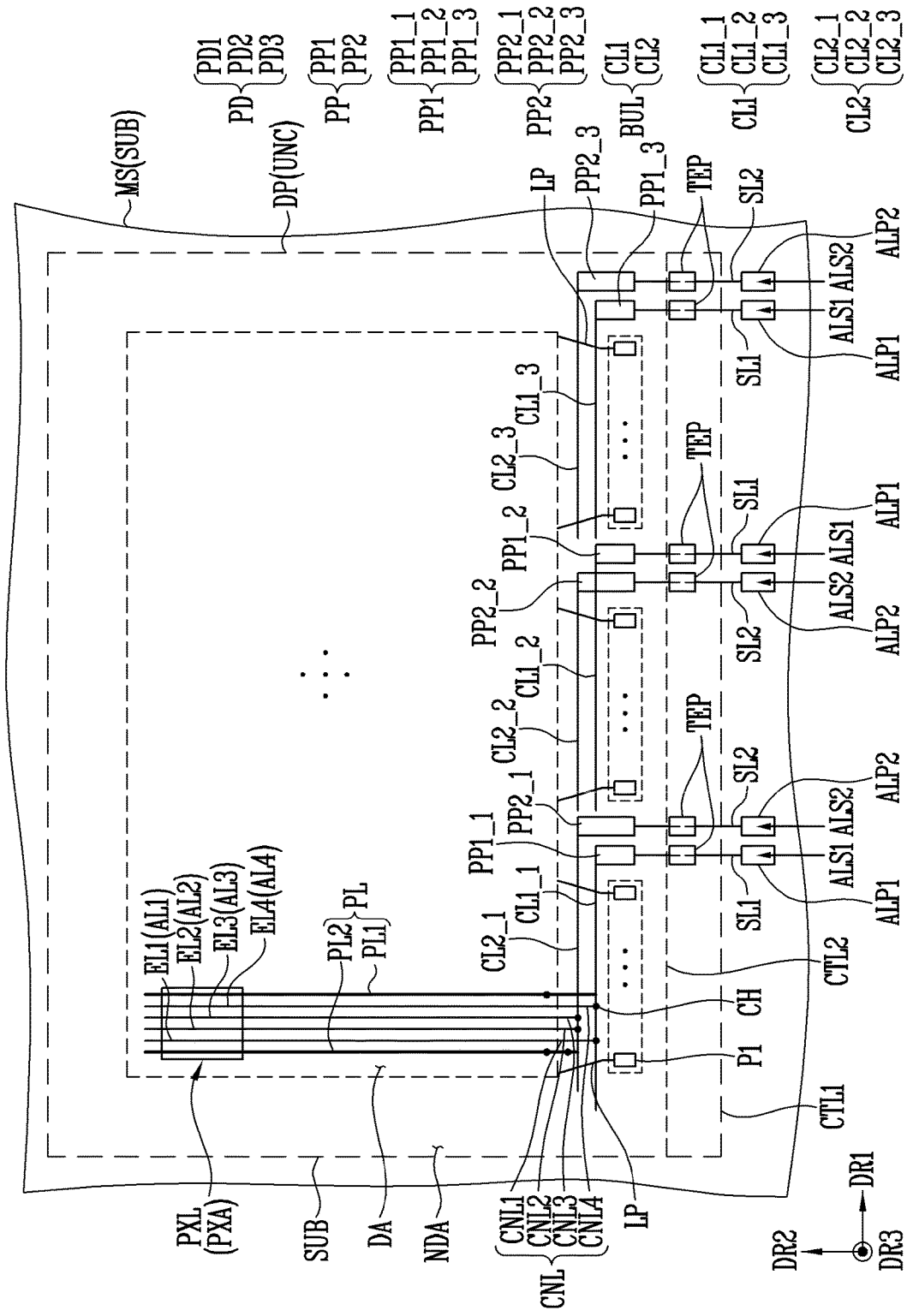
FIG. 20 is a schematic plan view illustrating a mother substrate used for manufacturing a display device according to an embodiment of the present disclosure.

FIG. 20 is a schematic plan view illustrating a mother substrate MS for manufacturing a display device DD according to an embodiment of the present disclosure.

In FIG. 15, one unit cell UNC may be manufactured on a mother substrate MS and then may be separated into a display panel DP. Because the display panel DP has the same configuration as the display panel DP described with reference to FIGS. 15-18E, detailed description thereof will not be repeated.

Referring to FIGS. 15-18E and FIG. 20, when at least one display panel DP is formed on the mother substrate MS (or the substrate SUB of the display panel DP), each of the first to fourth electrodes EL1 to EL4 may not be partitioned into at least one unit of pixel PXL (or pixel region PXA) and may extend in the second direction DR2 in the display region DA to be first formed as an alignment line. For example, the first electrode EL1 may be formed as the first alignment line AL1, the second electrode EL2 may be formed as the second alignment line AL2, the third electrode EL3 may be formed as the third alignment line AL3, and the fourth electrode EL4 may be formed as the fourth alignment line AL4.

In this case, a plurality of alignment pads and a plurality of test pads TEP may be located on the mother substrate MS in addition to the components described with reference to FIGS. 15-18E.

The alignment pads may include a plurality of first alignment pads ALP1 and a plurality of second alignment pads ALP2. For example, the alignment pads may include three first alignment pads ALP1 and three second alignment pads ALP2 corresponding to the first to third regions A1 to A3.

The first alignment pad ALP1 corresponding to the first region A1 may be connected to the 1-1$^{th}$ power pad PP1_1 through a first signal line SL1 to be connected to the first and fourth alignment lines AL1 and AL4 in the first region A1 through the 1-1$^{th}$ bus line CL1_1. The first alignment pad ALP1 corresponding to the second region A2 may be connected to the 1-2$^{th}$ power pad PP1_2 through the first signal line SL1 to be connected to the first and fourth alignment lines AL1 and AL4 in the second region A2 through the 1-2$^{th}$ bus line CL1_2. The first alignment pad ALP1 corresponding to the third region A3 may be connected to the 1-3$^{th}$ power pad PP1_3 through the first signal line SL1 to be connected to the first and fourth alignment lines AL1 and AL4 in the third region A3 through the 1-3$^{th}$ bus line CL1_3.

The second alignment pad ALP2 corresponding to the first region A1 may be connected to the 2-1$^{th}$ power pad PP2_1 through a second signal line SL2 to be connected to the second and third alignment lines AL2 and AL3 in the first region A1 through the 2-1$^{th}$ bus line CL2_1. The second alignment pad ALP2 corresponding to the second region A2 may be connected to the 2-2$^{th}$ power pad PP2_2 through the second signal line SL2 to be connected to the second and third alignment lines AL2 and AL3 in the second region A2 through the 2-2$^{th}$ bus line CL2_2. The second alignment pad ALP2 corresponding to the third region A3 may be connected to the 2-3$^{th}$ power pad PP2_3 through the second signal line SL2 to be connected to the second and third alignment lines AL2 and AL3 in the third region A3 through the 2-3$^{th}$ bus line CL2_3.

In a step of aligning the light emitting elements (refer to "LD" of FIG. 1), the first and fourth alignment lines AL1 and AL4 of each of the first to third regions A1 to A3 may receive a first alignment signal ALS1 through the first alignment pad ALP1, the first signal line SL1, the first power pad PP1, and the first bus line CL1. In addition, in the step of aligning the light emitting elements LD, the second and third alignment lines AL2 and AL3 of each of the first to third regions A1 to A3 may receive a second alignment signal ALS2 through the second alignment pad ALP2, the second signal line SL2, the second power pad PP2, and the second bus line CL2. In one embodiment, the first alignment signal ALS1 may be a DC signal, and the second alignment signal ALS2 may be an AC signal, but the present disclosure is not limited thereto.

Accordingly, an electric field may be formed between two adjacent alignment lines, and thereby, the light emitting elements LD may be aligned between the first alignment line AL1 and the second alignment line AL2 and between the third alignment line AL3 and the fourth alignment line AL4.

After the alignment of the light emitting elements LD is completed, the mother substrate MS may be cut along a first cutting line CTL1 in a scribing process to be divided into the display panels DP, and at this time, the first and second alignment pads ALP1 and ALP2 may not be included in the display panel DP.

The test pads TEP may apply lighting test signals to the pixels PXL, and thereby, whether or not the pixels PXL fail may be determined. When the mother substrate MS is cut along a second cutting line CTL2 in a scribing process to be divided into the display panels DP, the test pads TEP may not be included in the display panel DP.

Although the above description is made with reference to the embodiments of the present disclosure, those skilled in the art or those of ordinary skill in the relevant technical field will understand that various modifications and changes may be made to the present disclosure without departing from the idea and scope of the present disclosure to be described in the following claims.

Therefore, the technical scope of the present disclosure should not be limited to the content described in the detailed description of the specification and should be determined by the claims and their equivalents.

What is claimed is:

1. A display device comprising:
    a substrate including a display region and a non-display region, the non-display region including a fan-out region and a pad region that are sequentially arranged;
    a plurality of pixels in the display region;
    a pad portion located in the pad region;
    a line portion located in the fan-out region and electrically connecting the pad portion to the plurality of pixels;
    a power pad portion located in one region of the non-display region;
    a first power line located in the display region and connected to the plurality of pixels;

a second power line located in the display region, spaced from the first power line, and connected to the plurality of pixels;
a first bus line located in the non-display region and connected to the first power line; and
a second bus line located in the non-display region and connected to the second power line,
wherein the power pad portion comprises a first power pad electrically connected to the first bus line and a second power pad electrically connected to the second bus line, and
wherein the first power pad receives a first power supply voltage and the second power pad receives a second power supply voltage.

2. The display device of claim 1, wherein the power pad portion does not overlap the line portion.

3. The display device of claim 2, wherein the pad portion comprises:
a first pad portion located in the pad region and comprising a plurality of first pads; and
a second pad portion located in the pad region and comprising a plurality of second pads, and
the power pad portion is located between the first pad portion and the second pad portion in the non-display region.

4. The display device of claim 3, wherein:
the first power supply voltage is a drive power supply voltage of a high potential; and
the second power supply voltage is a drive power supply voltage of a low potential.

5. The display device of claim 4, wherein each of the plurality of pixels comprises:
a first electrode, a second electrode, a third electrode, and a fourth electrode that are spaced from each other; and
a plurality of light emitting elements arranged between two adjacent electrodes from among the first to fourth electrodes.

6. The display device of claim 5, wherein:
the first and fourth electrodes comprise protrusion patterns, each of the protrusion patterns protruding in a direction different from an extension direction of a corresponding one of the first and fourth electrodes;
the protrusion pattern of the first electrode is spaced from the protrusion pattern of the fourth electrode of a pixel from among the plurality of pixels adjacent to the first electrode; and
the protrusion pattern of the fourth electrode is spaced from the protrusion pattern of the first electrode of a pixel from among the plurality of pixels adjacent to the fourth electrode.

7. The display device of claim 5, further comprising:
a third bus line in the non-display region and separated from the plurality of pixels, the first bus line, and the second bus line,
wherein the power pad portion further comprises a third power pad electrically connected to the third bus line.

8. The display device of claim 7, wherein at least one of the first power pad, the second power pad, and the third power pad has a different size from other ones of the power pads.

9. The display device of claim 8, wherein:
the second power pad comprises a 2-1$^{th}$ power pad and a 2-2$^{th}$ power pad, the first power pad being interposed therebetween; and the third power pad comprises a 3-1$^{th}$ power pad between the 2-1$^{th}$ power pad and the first pad portion, and a 3-2$^{th}$ power pad between the 2-2$^{th}$ power pad and the second pad portion.

10. The display device of claim 9, wherein the third power pad is to receive the second power supply voltage or is floated.

11. The display device of claim 8, further comprising:
a first connection line having one end connected to the first bus line, extending toward the first electrode, and electrically disconnected from the first electrode;
a second connection line having one end connected to the second bus line, extending toward the second electrode, and electrically disconnected from the second electrode;
a third connection line having one end connected to the second bus line, extending toward the third electrode, and electrically disconnected from the third electrode; and
a fourth connection line having one end connected to the third bus line, extending toward the fourth electrode, and electrically disconnected from the fourth electrode,
wherein the first to fourth connection lines are provided in the non-display region.

12. A display device comprising:
a substrate including a display region and a non-display region;
a plurality of pixels in the display region;
a first pad portion located in the non-display region and comprising a plurality of first pads;
a second pad portion located in the non-display region and comprising a plurality of second pads;
a third pad portion located in the non-display region and comprising a plurality of third pads;
power pad portions located respectively between the first pad portion and the second pad portion and between the second pad portion and the third pad portion;
a plurality of first power lines located in the display region and connected to the plurality of pixels;
a plurality of second power lines located in the display region, spaced from the plurality of first power lines, and connected to the plurality of pixels;
a first bus line located in the non-display region and connected to the plurality of first power lines; and
a second bus line located in the non-display region and connected to the plurality of second power lines,
wherein the power pad portions comprise a first power pad connected to the first bus line to receive a first power supply voltage, and a second power pad connected to the second bus line to receive a second power supply voltage, and
wherein the first bus line and the first power pad are integrally provided, and the second bus line and the second power pad are integrally provided.

13. The display device of claim 12, wherein:
the first bus line and the first power pad are provided on a layer different from the second bus line and the second power pad; and
one of the first power supply voltage and the second power supply voltage is a drive power supply voltage of a high potential and an other one of the first power supply voltage and the second power supply voltage is a drive power supply voltage of a low potential.

14. The display device of claim 13, wherein:
the display region is partitioned into a first region, a second region, and a third region in one direction;

the first pad portion is electrically connected to pixels in the first region from among the plurality of pixels;

the second pad portion is electrically connected to pixels in the second region from among the plurality of pixels; and the third pad portion is electrically connected to pixels in the third region from among the plurality of pixels.

15. The display device of claim 14, wherein the first bus line comprises:
a $1\text{-}1^{th}$ bus line electrically connected to first power lines in the first region from among the plurality of first power lines;
a $1\text{-}2^{th}$ bus line electrically connected to first power lines in the second region from among the plurality of first power lines; and
a $1\text{-}3^{th}$ bus line electrically connected to first power lines in the third region from among the plurality of first power lines, and
the $1\text{-}1^{th}$ bus line, the $1\text{-}2^{th}$ bus line, and the $1\text{-}3^{th}$ bus line are electrically disconnected from each other.

16. The display device of claim 15, wherein the second bus line comprises:
a $2\text{-}1^{th}$ bus line electrically connected to second power lines in the first region from among the plurality of second power lines;
a $2\text{-}2^{th}$ bus line electrically connected to second power lines in the second region from among the plurality of second power lines; and
a $2\text{-}3^{th}$ bus line electrically connected to second power lines in the third region from among the plurality of second power lines, and
the $2\text{-}1^{th}$ bus line, the $2\text{-}2^{th}$ bus line, and the $2\text{-}3^{th}$ bus line are electrically disconnected from each other.

17. The display device of claim 16, wherein:
the first power pad comprises a $1\text{-}1^{th}$ power pad provided integrally with the $1\text{-}1^{th}$ bus line, a $1\text{-}2^{th}$ power pad provided integrally with the $1\text{-}2^{th}$ bus line, and a $1\text{-}3^{th}$ power pad provided integrally with the $1\text{-}3^{th}$ bus line; and
the second power pad comprises a $2\text{-}1^{th}$ power pad provided integrally with the $2\text{-}1^{th}$ bus line, a $2\text{-}2^{th}$ power pad provided integrally with the $2\text{-}2^{th}$ bus line, and a $2\text{-}3^{th}$ power pad provided integrally with the $2\text{-}3^{th}$ bus line.

18. The display device of claim 17, wherein:
the $1\text{-}1^{th}$ power pad, the $1\text{-}2^{th}$ power pad, and the $1\text{-}3^{th}$ power pad are electrically disconnected from each other, and
the $2\text{-}1^{th}$ power pad, the $2\text{-}2^{th}$ power pad, and the $2\text{-}3^{th}$ power pad are electrically disconnected from each other.

19. The display device of claim 18, further comprising:
a first conductive pattern located between the display region and the non-display region to connect the first power lines to the first bus line; and
a second conductive pattern located between the display region and the non-display region to connect the second power lines to the second bus line,
wherein one of the first conductive pattern and the second conductive pattern is provided integrally with a corresponding bus line.

20. The display device of claim 12, further comprising:
a line portion in the non-display region to electrically connect the plurality of first pads, the plurality of second pads, and the plurality of third pads to the plurality of pixels, and
the first power pad and the second power pad do not overlap the line portion.

* * * * *